US012648159B2

(12) United States Patent
Kwon et al.

(10) Patent No.: US 12,648,159 B2
(45) Date of Patent: Jun. 2, 2026

(54) CAPACITOR STRUCTURE AND SEMICONDUCTOR DEVICE INCLUDING THE CAPACITOR STRUCTURE

(71) Applicant: SAMSUNG ELECTRONICS CO., LTD., Suwon-si (KR)

(72) Inventors: Hyukwoo Kwon, Suwon-si (KR); Munjun Kim, Suwon-si (KR); Junwon Lee, Suwon-si (KR); Younseok Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 349 days.

(21) Appl. No.: 18/367,090

(22) Filed: Sep. 12, 2023

(65) Prior Publication Data

US 2024/0136393 A1 Apr. 25, 2024
US 2024/0234488 A9 Jul. 11, 2024

(30) Foreign Application Priority Data

Oct. 20, 2022 (KR) ........................ 10-2022-0135714

(51) Int. Cl.
*H10D 1/00* (2025.01)
*H10B 12/00* (2023.01)
*H10D 1/68* (2025.01)

(52) U.S. Cl.
CPC ......... *H10D 1/042* (2025.01); *H10B 12/0335* (2023.02); *H10B 12/315* (2023.02); *H10D 1/714* (2025.01); *H10D 1/716* (2025.01)

(58) Field of Classification Search
CPC ....... H10D 1/042; H10D 1/696; H10B 12/315
See application file for complete search history.

(56) References Cited

U.S. PATENT DOCUMENTS

| | | | |
|---|---|---|---|
| 8,134,195 B2 | 3/2012 | Lee et al. | |
| 9,252,205 B2 | 2/2016 | Rhie | |
| 10,672,772 B2 | 6/2020 | Kim et al. | |
| 10,910,383 B2 | 2/2021 | Kim et al. | |
| 11,411,005 B2* | 8/2022 | Lee ........................ | H10D 1/716 |
| 2010/0187584 A1* | 7/2010 | Matsuda ................ | H10D 1/682 |
| | | | 257/295 |
| 2020/0027947 A1* | 1/2020 | Kwon ................ | H01L 21/31144 |
| 2020/0395438 A1 | 12/2020 | Kang et al. | |
| 2021/0384194 A1* | 12/2021 | Woo ....................... | H10D 1/714 |
| 2023/0397404 A1* | 12/2023 | Kang ..................... | H10D 1/696 |

FOREIGN PATENT DOCUMENTS

| | | |
|---|---|---|
| KR | 10-2001-0036806 A | 5/2001 |
| KR | 10-2006-0007231 A | 1/2006 |
| KR | 10-1022670 B1 | 3/2011 |
| KR | 10-2020-0141809 A | 12/2020 |
| KR | 10-2021-0117794 A | 9/2021 |
| KR | 10-2372096 B1 | 3/2022 |

OTHER PUBLICATIONS

European Search report dated Feb. 19, 2024 for corresponding application No. EP 23194801.9.

* cited by examiner

*Primary Examiner* — Steven M Page
(74) *Attorney, Agent, or Firm* — Muir Patent Law, PLLC

(57) ABSTRACT

A capacitor structure includes a lower electrode structure having a lower electrode on a substrate and an electrode structure including electrode patterns stacked on the lower electrode in a vertical direction substantially perpendicular to an upper surface of the substrate, a dielectric pattern contacting the lower electrode structure, and an upper electrode contacting the dielectric pattern.

20 Claims, 44 Drawing Sheets

FIG. 21

CAPACITOR STRUCTURE AND SEMICONDUCTOR DEVICE INCLUDING THE CAPACITOR STRUCTURE

CROSS-REFERENCE TO RELATED APPLICATION

This application claims priority under 35 U.S.C. § 119 to Korean Patent Application No. 10-2022-0135714, filed on Oct. 20, 2022, in the Korean Intellectual Property Office, the disclosure of which is hereby incorporated by reference in its entirety.

BACKGROUND

1. Field

Example embodiments of the present disclosure relate to a capacitor structure and a semiconductor device including the capacitor structure.

2. Description of the Related Art

A capacitor included in a dynamic random access memory (DRAM) device may include a lower electrode, an upper electrode, and a dielectric layer between the lower electrode and the upper electrode. A contact area between the lower electrode and the dielectric layer may be increased in order to increase a capacitance of the capacitor. A mold layer may be etched by an etching process to form an opening for the lower electrode. In order to increase the contact area between the lower electrode and the dielectric layer, the lower electrode may have a high upper surface, which may increase an aspect ratio of the opening and difficulty of the etching process.

SUMMARY

According to example embodiments, there is provided a capacitor structure including a lower electrode structure having a lower electrode on a substrate and an electrode structure including electrode patterns stacked on the lower electrode in a vertical direction substantially perpendicular to an upper surface of the substrate, a dielectric pattern contacting the lower electrode structure, and an upper electrode contacting the dielectric pattern.

According to example embodiments, there is provided a capacitor structure including a lower electrode structure having a lower electrode on a substrate and an electrode structure on and contacting the lower electrode, a first support layer contacting a sidewall of a first portion of the lower electrode, a second support layer contacting a sidewall of a first portion of the electrode structure, a dielectric pattern contacting a sidewall of a second portion of the lower electrode and a sidewall of a second portion of the electrode structure, and an upper electrode contacting the dielectric pattern.

According to example embodiments, there is provided a semiconductor device including a gate structure in an upper portion of the active pattern and extending in a first direction substantially parallel to an upper surface of the substrate, a bit line structure extending in a second direction substantially parallel to the upper surface of the substrate and substantially perpendicular to the upper surface of the substrate on a central portion of the active pattern, a contact plug structure on each of opposite edge portions of the active pattern, and a capacitor structure on the contact plug structure. The capacitor structure may include a lower electrode structure having a lower electrode and an electrode structure including electrode patterns stacked on the lower electrode in a vertical direction substantially perpendicular to the upper surface of the substrate, a dielectric pattern contacting the lower electrode structure, and an upper electrode contacting the dielectric pattern.

BRIEF DESCRIPTION OF THE DRAWINGS

Features will become apparent to those of skill in the art by describing in detail exemplary embodiments with reference to the attached drawings, in which:

FIGS. 19 to 34 are plan views and cross-sectional views illustrating stages in a method of manufacturing a semiconductor device in accordance with example embodiments.

DETAILED DESCRIPTION

It will be understood that, although the terms "first," "second," and/or "third" may be used herein to describe various materials, layers (films), regions, electrodes, pads, patterns, structures and processes, these materials, layers (films), regions, electrodes, pads, patterns, structures and processes should not be limited by these terms. These terms are only used to distinguish one material, layer (film), region, electrode, pad, pattern, structure and process from another material, layer (film), region, electrode, pad, pattern, structure and process. Thus, a first material, layer (film), region, electrode, pad, pattern, structure and process discussed below could be termed a second or third material, layer (film), region, electrode, pad, pattern, structure and process.

Figure 1:
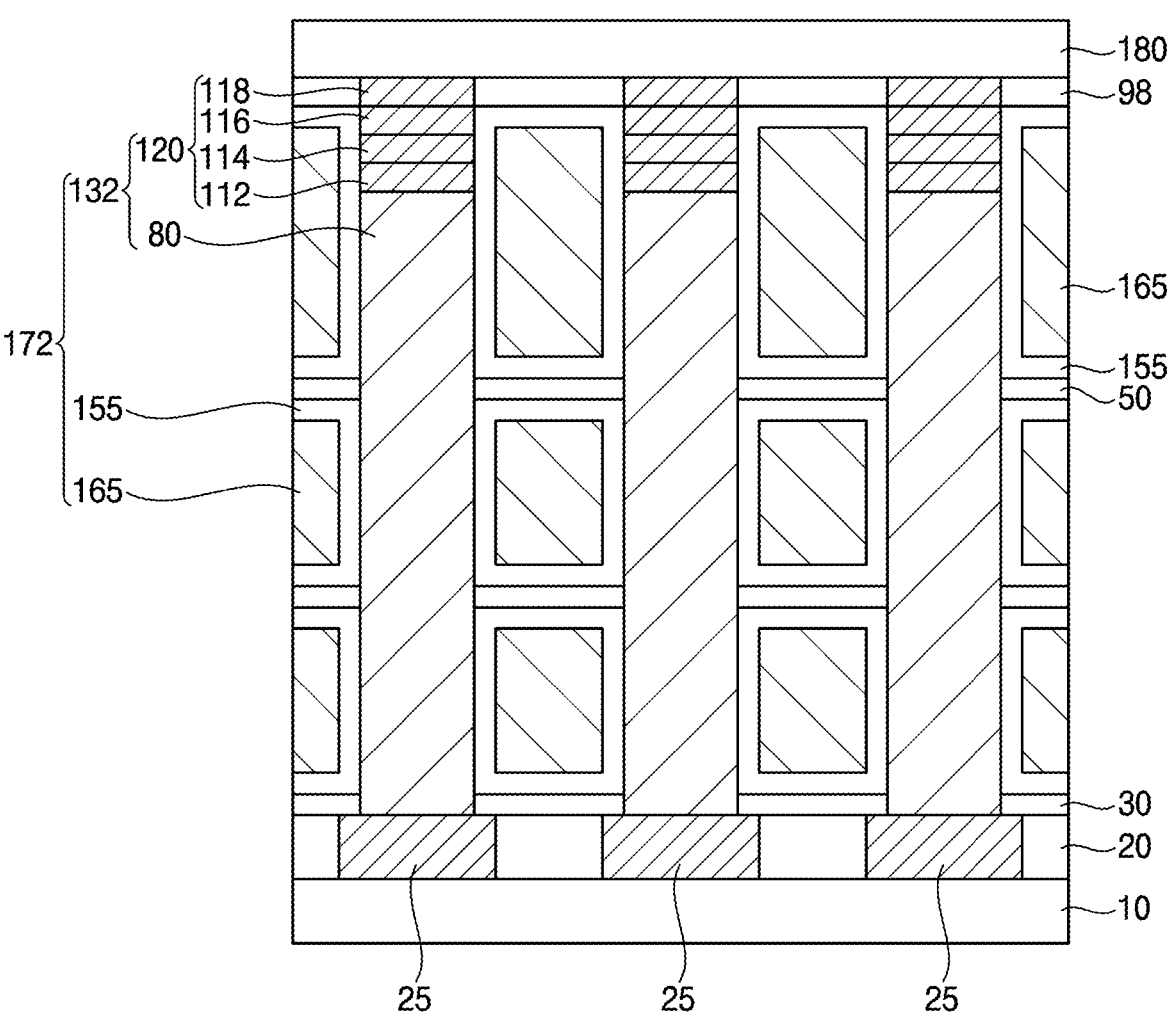
FIG. 1 is a cross-sectional view illustrating a first capacitor structure in accordance with example embodiments.

FIG. 1 is a cross-sectional view illustrating a first capacitor structure in accordance with example embodiments.

Referring to FIG. 1, the first capacitor structure may include a first capacitor 172, a first support layer 50, a second support layer 98, and an upper electrode plate 180 on a substrate 10. The first capacitor 172 may include a first lower electrode structure 132, a first dielectric pattern 155, and a first upper electrode 165. Additionally, the first capacitor structure may further include a first insulating interlayer 20 containing a first conductive pattern 25 and a first etch stop layer 30 on the substrate 10.

For example, the substrate 10 may include silicon, germanium, silicon-germanium, or a III-V group compound semiconductor, e.g., GaP, GaAs, or GaSb. In example embodiments, the substrate 10 may be a silicon-on-insulator (SOI) substrate or a germanium-on-insulator (GOI) substrate.

The first conductive pattern 25 may include, e.g., a contact plug, a landing pad, etc. A plurality of first conductive patterns 25 may be formed in a horizontal direction substantially parallel to an upper surface of the substrate 10. The first conductive pattern 25 may include, e.g., a metal, a metal nitride, a metal silicide, doped polysilicon, etc.

The first insulating interlayer 20 may include an oxide, e.g., silicon oxide or a low-k dielectric material. The first etch stop layer 30 may be formed on the first insulating interlayer 20. The first etch stop layer 30 may include an insulating nitride, e.g., silicon nitride, silicon carbonitride, silicon boronitride, etc., or silicon oxycarbide.

The first lower electrode structure 132 may extend through the first etch stop layer 30 to contact an upper surface of a corresponding first conductive pattern 25, and may have a pillar shape extending in a vertical direction substantially perpendicular to the upper surface of the substrate 10. In example embodiments, the first lower electrode structure 132 may include a lower electrode 80 and a first electrode structure 120 stacked in the vertical direction.

The lower electrode 80 may include a metal nitride, e.g., titanium nitride, niobium nitride, etc., or a metal silicon nitride, e.g., titanium silicon nitride. The lower electrode 80 may be, e.g., directly, between the first electrode structure 120 and the first conductive pattern 25.

The first electrode structure 120 may include a plurality of electrode patterns sequentially stacked in the vertical direction. For example, as illustrated in FIG. 1, the first electrode structure 120 may include first, second, third and fourth electrode patterns 112, 114, 116 and 118 sequentially stacked in the vertical direction on the lower electrode 80.

Each of the first to fourth electrode patterns 112, 114, 116 and 118 may include a metal nitride, e.g., titanium nitride, niobium nitride, etc., or a metal silicon nitride, e.g., titanium silicon nitride. For example, each of the first to fourth electrode patterns 112, 114, 116 and 118 may include a substantially same material as a material of the lower electrode 80. In another example, at least one of the first to fourth electrode patterns 112, 114, 116 and 118 may include a material different from a material of the lower electrode 80.

The first support layer 50 may be formed on a sidewall of the lower electrode 80, and may have a shape of a plate including lower and upper surfaces opposite to each other in the vertical direction. In example embodiments, a plurality of first support layers 50 may be spaced apart from each other in the vertical direction. The first support layer 50 may include an insulating nitride, e.g., silicon nitride, silicon carbonitride, silicon boronitride, etc., or silicon oxycarbide.

The second support layer 98 may be formed on a sidewall of an uppermost one of the electrode patterns of the first electrode structure 120, i.e., on the fourth electrode pattern 118 in FIG. 1, and may have a shape of a plate including lower and upper surfaces opposite to each other in the vertical direction. The second support layer 98 may include an insulating nitride, e.g., silicon nitride, silicon carbonitride, silicon boronitride, etc., or silicon oxycarbide. For example, the second support layer 98 may include a substantially same material as a material of the first support layer 50. In another example, the second support layer 98 may include a material different from a material of the first support layer 50.

The first dielectric pattern 155 may be formed on a sidewall of the lower electrode 80 and sidewalls of other electrode patterns of the first electrode structure 120, except for the uppermost one of the electrode patterns, i.e., on sidewalls of the first to third electrode patterns 112, 114 and 116, which may be formed between the first etch stop layer 30 and the first support layer 50, between the first support layers 50, and between an uppermost one of the first support layers 50 and the second support layer 98. The first dielectric pattern 155 may include a metal oxide having a high dielectric constant, e.g., hafnium oxide, zirconium oxide, etc.

A surface of the first upper electrode 165 may be covered by the first dielectric pattern 155, and the first upper electrode 165 may be formed between the first etch stop layer 30 and the first support layer 50, between the first support layers 50, and between the uppermost one of the first support layers 50 and the second support layer 98. The first upper electrode 165 may include a metal nitride, e.g., titanium nitride, niobium nitride, etc., or a metal silicon nitride, e.g., titanium silicon nitride. The first upper electrode 165 may include a substantially same material as or different from a material of the lower electrode 80.

As described above, the first capacitor 172 may include the first lower electrode structure 132 having the lower electrode 80 and the first electrode structure 120 stacked in the vertical direction. Thus, a height of an upper surface of the first capacitor 172 from an upper surface of the first conductive pattern 25 may increase by a vertical thickness of the first electrode structure 120.

Accordingly, the first dielectric pattern 155 may contact the sidewalls of the first to third electrode patterns 112, 114 and 116 of the first electrode structure 120 as well as the sidewall of the lower electrode 80, so that the first capacitor 172 including the first lower electrode structure 132, the first dielectric pattern 155, and the first upper electrode 165 may have an increased capacitance.

As illustrated below with reference to FIGS. 2 to 9, the first lower electrode structure 132 may not be formed by a single process in an entire portion of a first opening 70 (refer to FIG. 3) that may be formed by an etching process, but may be formed by forming the lower electrode 80 in the first opening 70 and performing a selective deposition process to form the first electrode structure 120 on the lower electrode 80, which may decrease the difficulty of the etching process for forming the first opening 70. Additionally, a width difference between an upper portion of the lower electrode 80 and a lower portion of the lower electrode 80 may decrease, so that a reduction of a contact area between the lower electrode 80 and the first dielectric pattern 155 may be decreased. Thus, an electric capacitance of the first capacitor 172 including the lower electrode 80 may increase.

FIGS. 2 to 9 are cross-sectional views illustrating stages in a method of forming a first capacitor structure in accordance with example embodiments.

Figure 2:
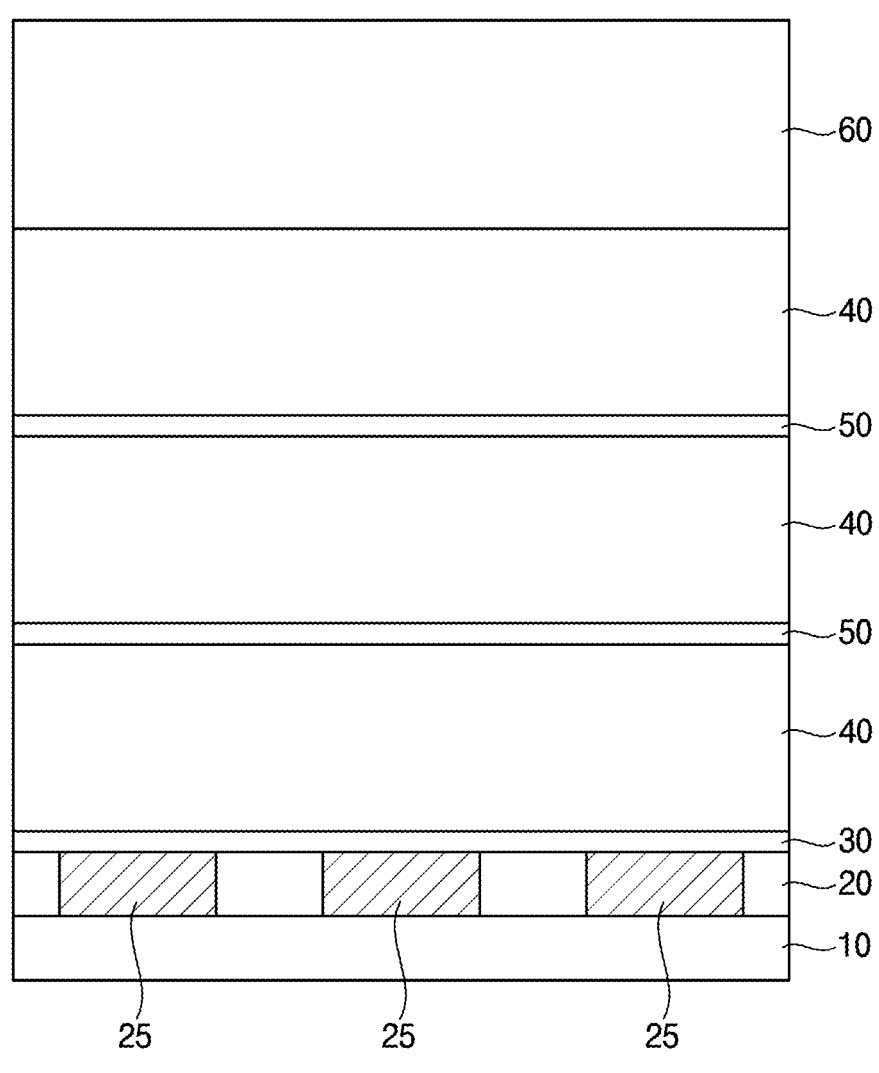
FIGS. 2 to 9 are cross-sectional views illustrating stages in a method of forming a first capacitor structure in accordance with example embodiments.

Referring to FIG. 2, the first insulating interlayer 20 containing the first conductive pattern 25 may be formed on the substrate 10, and the first etch stop layer 30 may be formed on the first conductive pattern 25 and the first insulating interlayer 20. A mold layer 40 and the first support layer 50 may be alternately and repeatedly stacked on the first etch stop layer 30 along the vertical direction, and a first mask layer 60 may be formed on an uppermost one of the mold layers 40.

In example embodiments, a plurality of the first conductive patterns 25 may be spaced apart from each other in a horizontal direction substantially parallel to an upper surface of the substrate 10. For example, as illustrated in FIG. 2, the plurality of first conductive patterns 25 and portions of the first insulating interlayer 20 may be arranged alternately in the horizontal direction on the substrate 10.

Each of the first etch stop layer 30 and the first support layer 50 may include an insulating nitride, e.g., silicon nitride, silicon carbonitride, silicon boronitride, etc., or silicon oxycarbide. The mold layer 40 may include an oxide, e.g., silicon oxide.

Figure 3:
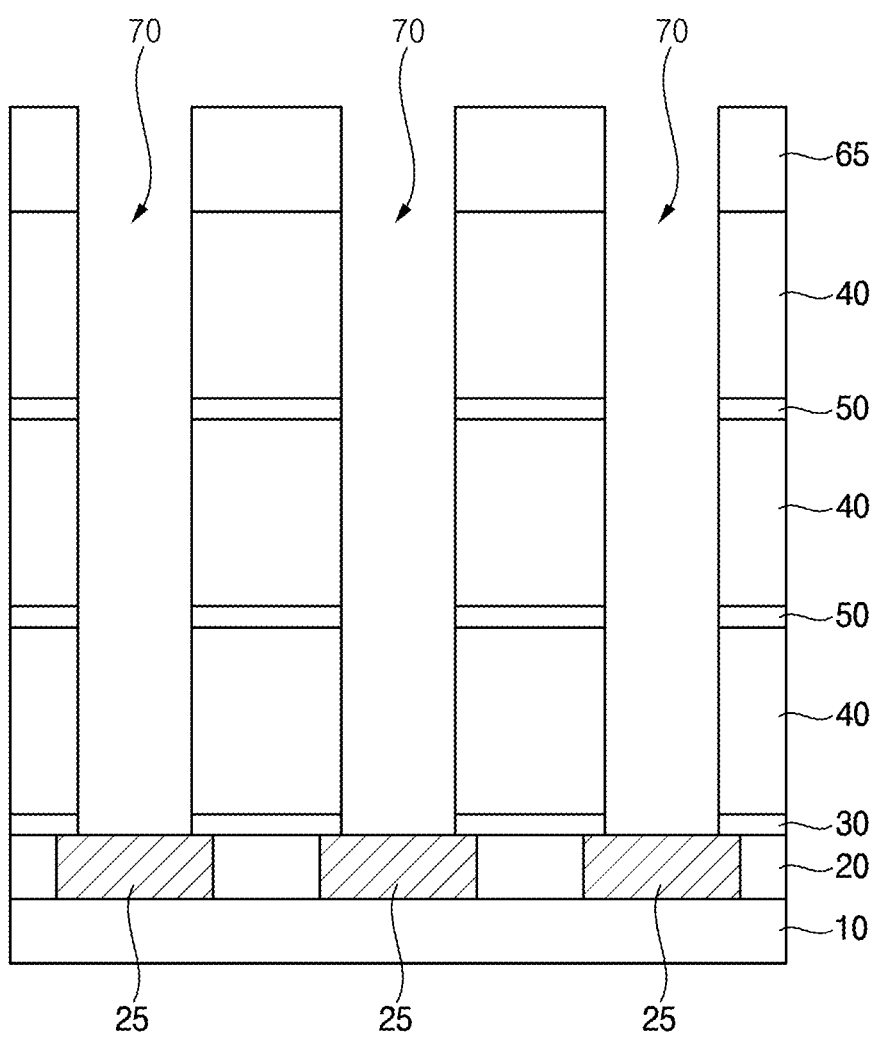

Referring to FIG. 3, the first mask layer 60 may be patterned to form a first mask 65, and an etching process may be performed using the first mask 65 as an etching mask to form a first opening 70 extending through the mold layers 40, the first support layers 50, and the first etch stop layer 30 to expose upper surfaces of the first conductive patterns 25. For example, as illustrated in FIG. 3, the first etch stop layer 30 may completely cover portions of the first insulating interlayer 20 and may expose upper surfaces of the first conductive patterns 25.

The first opening 70 may have a shape of, e.g., a circle, an ellipse, a polygon, a polygon with rounded corners. A plurality of first openings 70 may be spaced apart from each other in the horizontal direction.

As the etching process is performed, a thickness of the first mask 65 may decrease.

Figure 4:
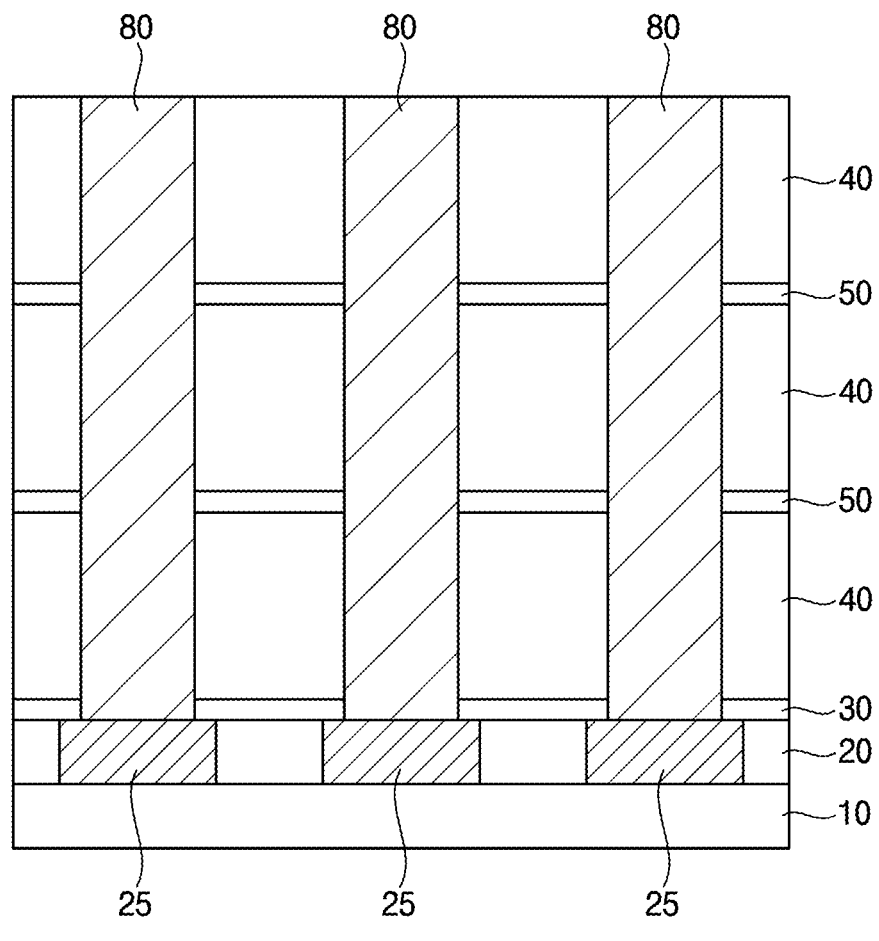

Referring to FIG. 4, the first mask 65 may be removed to expose an upper surface of the uppermost one of the mold layers 40, and a lower electrode 80 may be formed in the first opening 70.

The lower electrode 80 may be formed by forming a lower electrode layer on the upper surfaces of the first conductive patterns 25 (i.e., inside the first openings 70) and on the upper surface of the uppermost one of the mold layers 40, and performing a planarization process on the lower electrode layer until the upper surface of the uppermost one of the mold layers 40 is exposed. The planarization process may include, e.g., a chemical mechanical polishing process and/or an etch back process. The lower electrode 80 may include a metal nitride, e.g., titanium nitride, niobium nitride, etc., or a metal silicon nitride, e.g., titanium silicon nitride.

Figure 5:
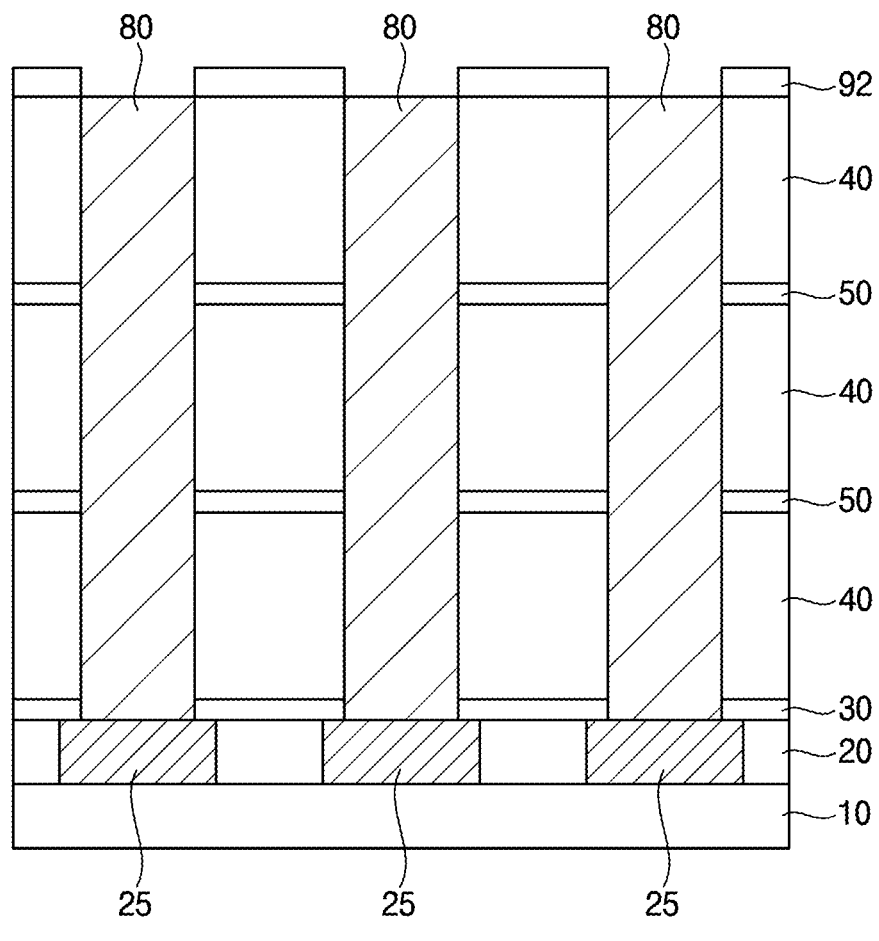

Referring to FIG. 5, a first selective deposition process may be performed to form a first insulation layer 92 on the uppermost one of the mold layers 40. The first insulation layer 92 may be formed of an insulating material.

The first insulation layer 92 may be formed by coating an inhibitor on the lower electrode 80 (which includes a conductive material), e.g., coating an inhibitor only on an upper surface of the lower electrode 80. Then, performing a deposition process, e.g., a chemical vapor deposition (CVD) process or an atomic layer deposition (ALD) process, on the uppermost one of the mold layers 40 (e.g., while the upper surface of the lower electrode 80 remains exposed due to the coated inhibitor).

For example, the first insulation layer 92 may include a substantially same material as a material of the mold layer 40, e.g., silicon oxide. In another example, the first insulation layer 92 may include a material different from the material of the mold layer 40, e.g., an insulating nitride (e.g., silicon nitride, silicon carbonitride, silicon boronitride, etc.), a metal oxide (e.g., aluminum oxide), or silicon oxycarbide.

Figure 6:
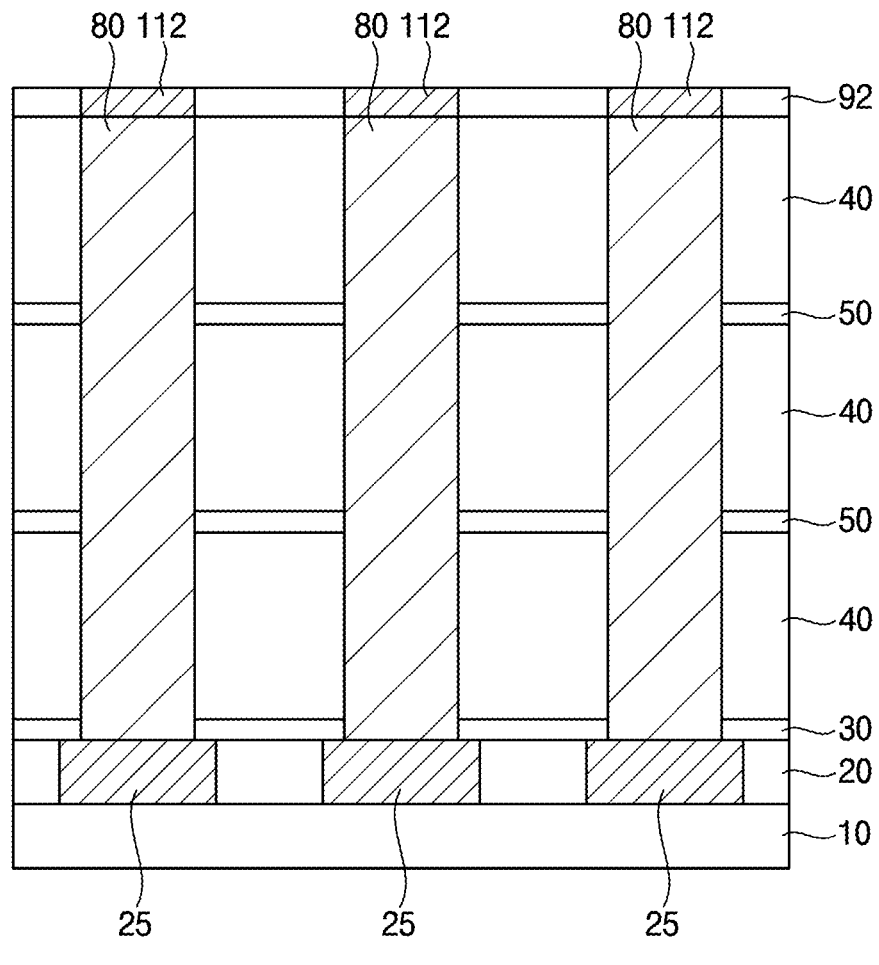

Referring to FIG. 6, a second selective deposition process may be performed to form a first electrode pattern 112 on the lower electrode 80. The first electrode pattern 112 may be formed by coating an inhibitor on the first insulation layer 92, and performing a deposition process, e.g., a chemical vapor deposition (CVD) process or an atomic layer deposition (ALD) process, on the lower electrode 80, and e.g., upper surfaces of the first electrode pattern 112 and the first insulation layer 92 may be coplanar.

The first electrode pattern 112 may include, e.g., a metal nitride or a metal silicon nitride. For example, the first electrode pattern 112 may include a substantially same material as a material of the lower electrode 80. In another example, the first electrode pattern 112 may include a material different from the material of the lower electrode 80.

Figure 7:
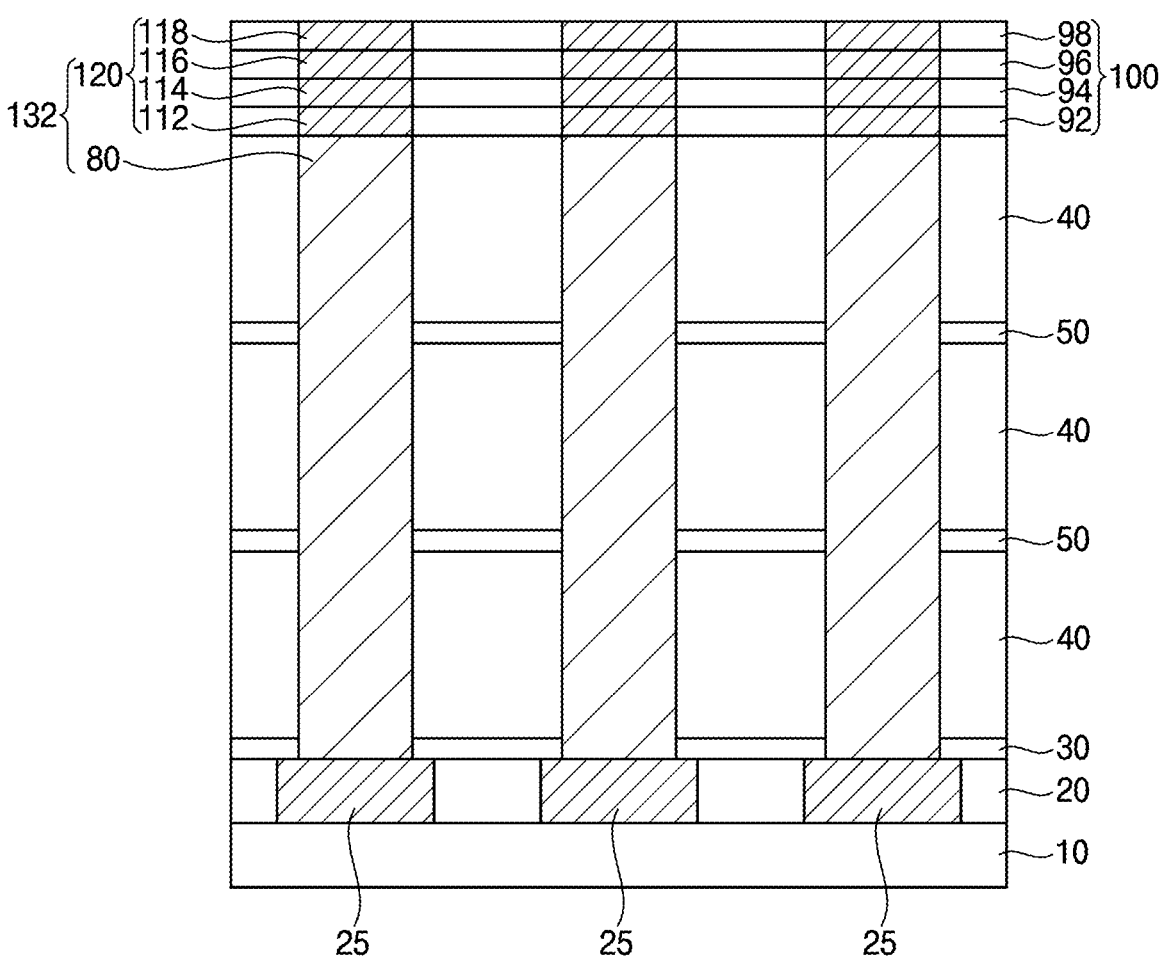

Referring to FIG. 7, the first selective deposition process and the second selective deposition process may be alternately and repeatedly performed. Thus, second, third and fourth insulation layers 94, 96 and 98 may be sequentially stacked on the first insulation layer 92 in the vertical direction substantially perpendicular to the upper surface of the substrate 10, and the second, third and fourth electrode patterns 114, 116 and 118 may be sequentially stacked on the first electrode pattern 112 in the vertical direction.

The second to fourth insulation layers 94, 96 and 98 may include a substantially same material as or a different material from a material of the first insulation layer 92. Additionally, the second to fourth electrode patterns 114, 116 and 118 may include a material substantially the same as or different from a material of the first electrode pattern 112.

The first to fourth insulation layers 92, 94, 96 and 98 sequentially stacked in the vertical direction may collectively form a first insulation layer structure 100, and the first to fourth electrode patterns 112, 114, 116 and 118 sequentially stacked in the vertical direction may collectively form the first electrode structure 120. The first insulation layer structure 100 may include a plurality of insulation layers sequentially stacked in the vertical direction, and the first electrode structure 120 may include a plurality of electrode patterns sequentially stacked in the vertical direction.

In example embodiments, an uppermost one of the plurality of insulation layers included in the first insulation layer structure 100, i.e., the fourth insulation layer 98 in FIG. 7, may include a material different from a material of the mold layer 40, and other ones of the plurality of insulation layers included in the first insulation layer structure 100, i.e., the first to third insulation layer 92, 94 and 96 in FIG. 7, may include a material substantially the same as a material of the mold layer 40.

For example, the electrode patterns included in the first electrode structure 120, i.e., the first to fourth electrode patterns 112, 114, 116 and 118 may include a material substantially the same as a material of the lower electrode 80. In another example, some of the electrode patterns included in the first electrode structure 120, i.e., some of the first to fourth electrode patterns 112, 114, 116 and 118 may include a material different from the material of the lower electrode 80.

The lower electrode 80 and the first electrode structure 120 may form a first lower electrode structure 132.

Figure 8:
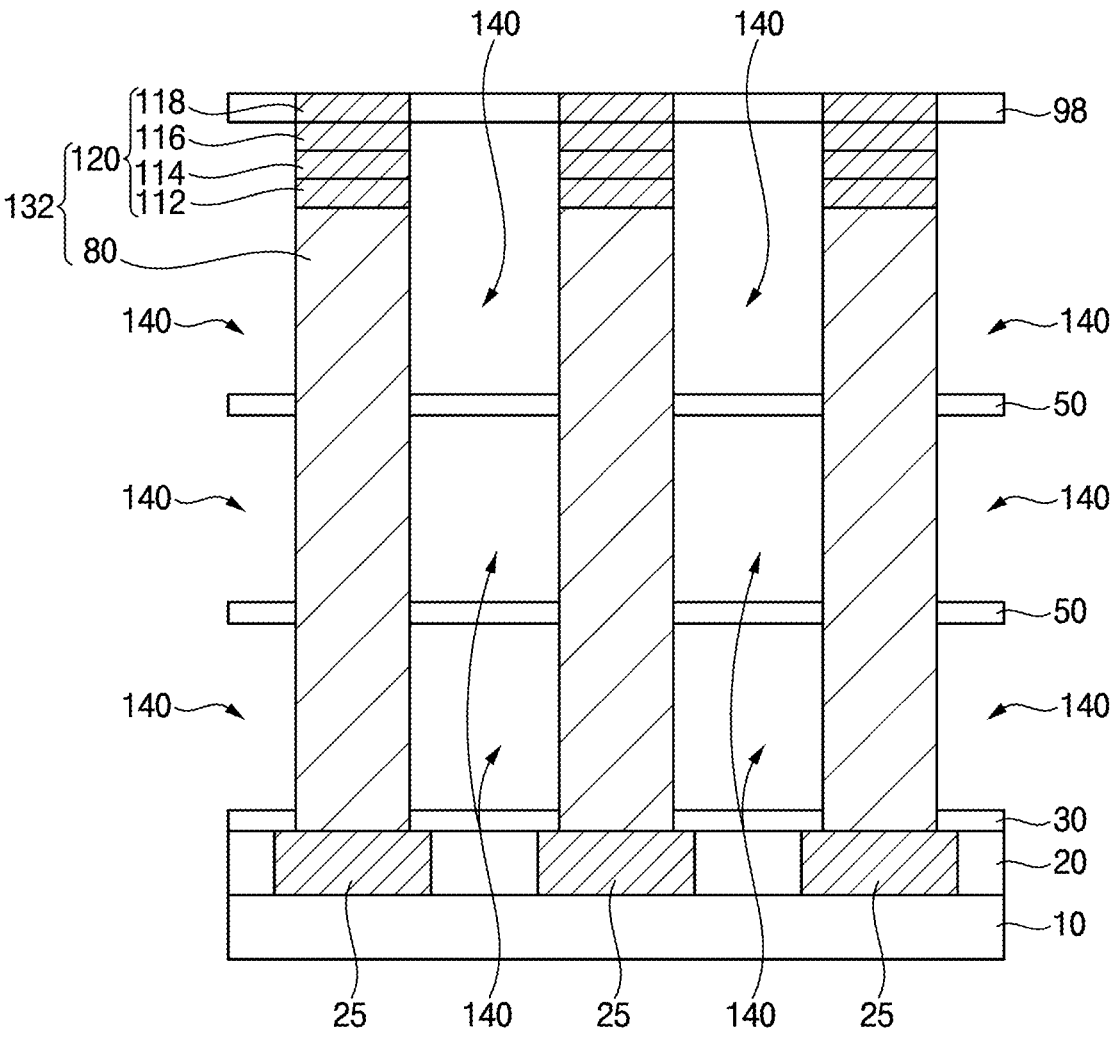

Referring to FIG. 8, the first insulation layer structure 100, the mold layers 40, and the first support layers 50 may be partially etched, e.g., by a dry etching process, to form a second opening exposing an upper surface of the first etch stop layer 30, and the mold layers 40 may be removed through the second opening.

In example embodiments, the mold layers 40 may be removed by, e.g., a wet etching process, and a third opening 140 may be formed to expose a sidewall of the lower electrode 80. The first support layers 50 may remain on the sidewall of the lower electrode 80, and the third opening 140 may also expose an upper surface of the first etch stop layer 30 and a surface of each of the first support layers 50. In example embodiments, during the wet etching process, some of the insulation layers of the first insulation layer structure 100 may also be removed together with the mold layers 40.

If the first to third insulation layers 92, 94 and 96 include a material substantially the same as the material of the mold layers 40, e.g., silicon oxide, and the fourth insulation layer 98 includes a material different from the material of the mold layers 40, the first to third insulation layers 92, 94 and 96 may also be removed together with the mold layers 40 during the wet etching process. The third opening 140 may also expose sidewalls of the first to third electrode patterns 112, 114 and 116 and a lower surface of the fourth insulation layer 98.

A remaining insulation layer of the first insulation layer structure 100 that is not removed by the wet etching process, i.e., the fourth insulation layer 98 in FIG. 7, may be formed on the sidewall of the first lower electrode structure 132 as the first support layer 50, and may support the first lower electrode structure 132. Thus, the fourth insulation layer 98 may also be referred to as the second support layer 98.

Figure 9:
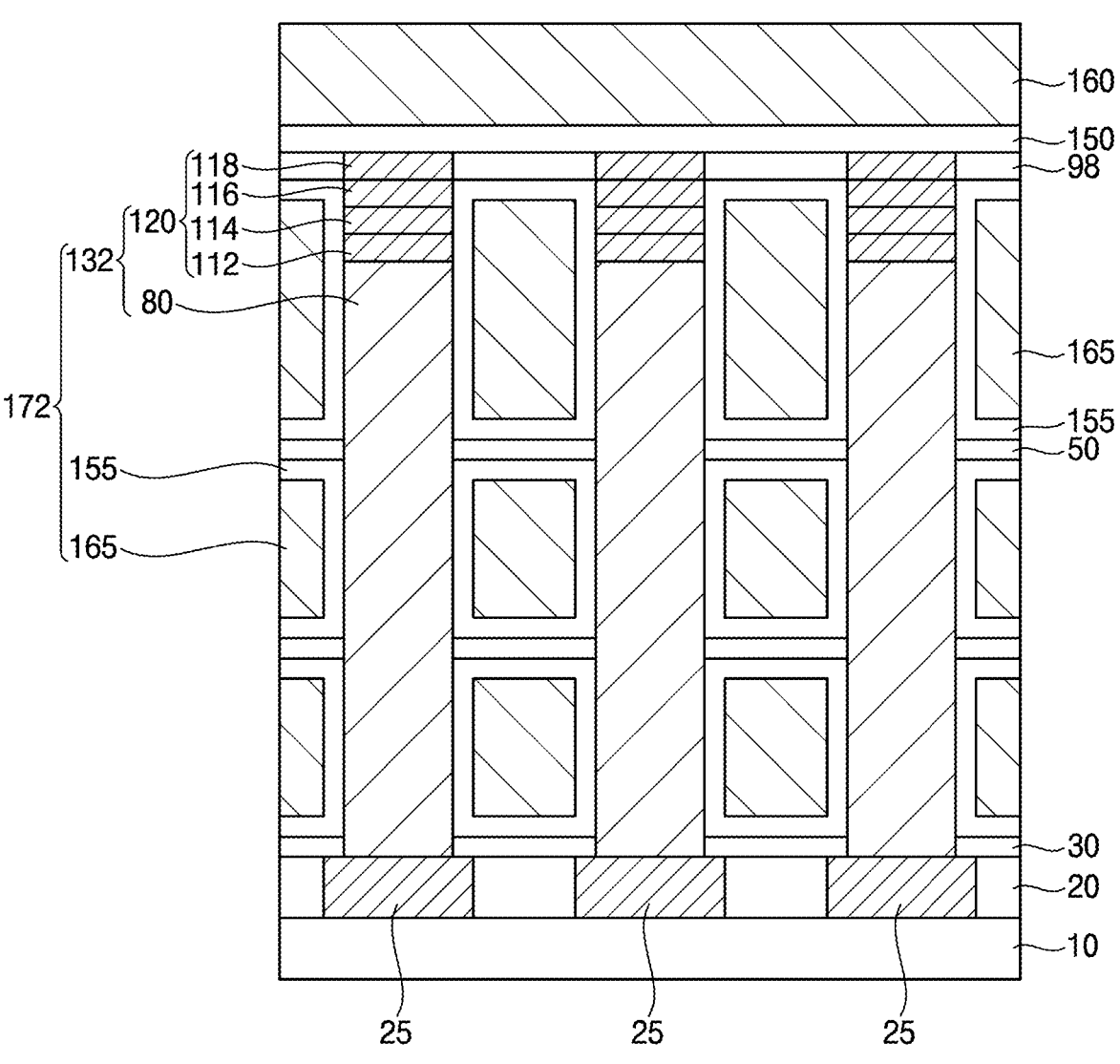

Referring to FIG. 9, a first dielectric layer 150 may be formed on the sidewalls of the lower electrode 80 and the first to third electrode patterns 112, 114 and 116, the upper surface of the first etch stop layer 30, the surface of the first support layer 50, and the lower surface of the fourth insulation layer 98 exposed by the third opening 140. A first upper electrode layer 160 may be formed on the first dielectric layer 150 to fill a remaining portion of the third opening 140. The first dielectric layer 150 and the first upper electrode layer 160 may also be stacked on the fourth electrode pattern 118 and the fourth insulation layer 98 in the vertical direction.

Referring to FIG. 1 again, portions of the first dielectric layer 150 and the first upper electrode layer 160 stacked on the fourth electrode pattern 118 and the fourth insulation layer 98 may be removed. Hereinafter, portions of the first dielectric layer 150 and the first upper electrode layer 160 remaining in the third opening 140 may be referred to as the first dielectric pattern 155 and the first upper electrode 165, respectively.

The first lower electrode structure 132 including the lower electrode 80 and the first electrode structure 120, the first dielectric pattern 155, and the first upper electrode 165 may collectively form the first capacitor 172. In some embodiments, the upper electrode plate 180 may be further formed on the first capacitor 172. The upper electrode plate 180 may include, e.g., doped silicon-germanium.

As described above, after forming the lower electrode 80, the second selective deposition process may be repeatedly performed on the lower electrode 80 to form the first electrode structure 120, and the lower electrode 80 and the first electrode structure 120 may form the first lower electrode structure 132.

If a lower electrode having an upper surface substantially coplanar with an upper surface of a first lower electrode structure were to be formed (i.e., if a first lower electrode structure were to include only a lower electrode with an increased height without the separate first electrode structure 120), a structure including the mold layers 40 and the first support layers 50 with an increased thickness would have required the first opening extending through the structure to have an increased depth (for the lower electrode with the increased height), thereby having a high aspect ratio. As such, the difficulty of the etching process for forming the first opening with the high aspect ratio would have increased, and a width of the first opening would have gradually decreased from a top toward a bottom thereof (due to the characteristics of the etching process), thereby causing the lower electrode in the first opening to have a width gradually decreasing from a top toward a bottom thereof, and accordingly, a decreased contact area with the first dielectric pattern. As a result, the electric capacitance of a capacitor including a lower electrode with an increased height (and without the first electrode structure 120) would have decreased.

In contrast, according to example embodiments, the first lower electrode structure 132 includes both the lower electrode 80 and a separately formed first electrode structure 120, so a single deep opening with an increased depth is not required. That is, after forming the first opening 70 through an etching process, the lower electrode 80 may be formed in the first opening 70, and the second selective deposition process may be repeatedly performed to form the first electrode structure 120 on the lower electrode 80. Thus, the first opening 70 need not have a high aspect ratio in order that an upper surface of the first lower electrode structure 132 including the lower electrode 80 and the first electrode structure 120 may have a desired height (i.e., since the first opening 70 accommodates only the lower electrode 80 without the first electrode structure 120). Accordingly, the difficulty of the etching process for forming the first opening 70 may decrease, and a width difference between a width of an upper portion of the lower electrode 80 and a width of a lower portion of the lower electrode 80 may decrease.

Figure 10:
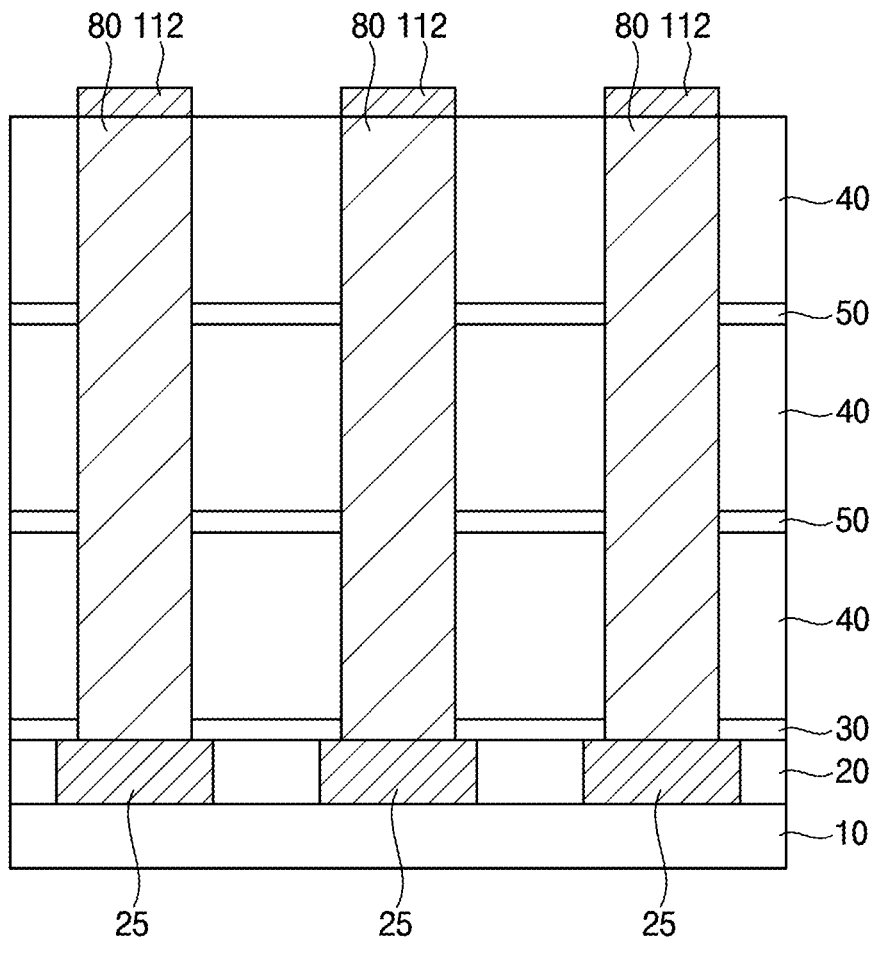
FIGS. 10 and 11 are cross-sectional views illustrating stages in a method of forming the first capacitor structure in accordance with example embodiments.
Figure 11:
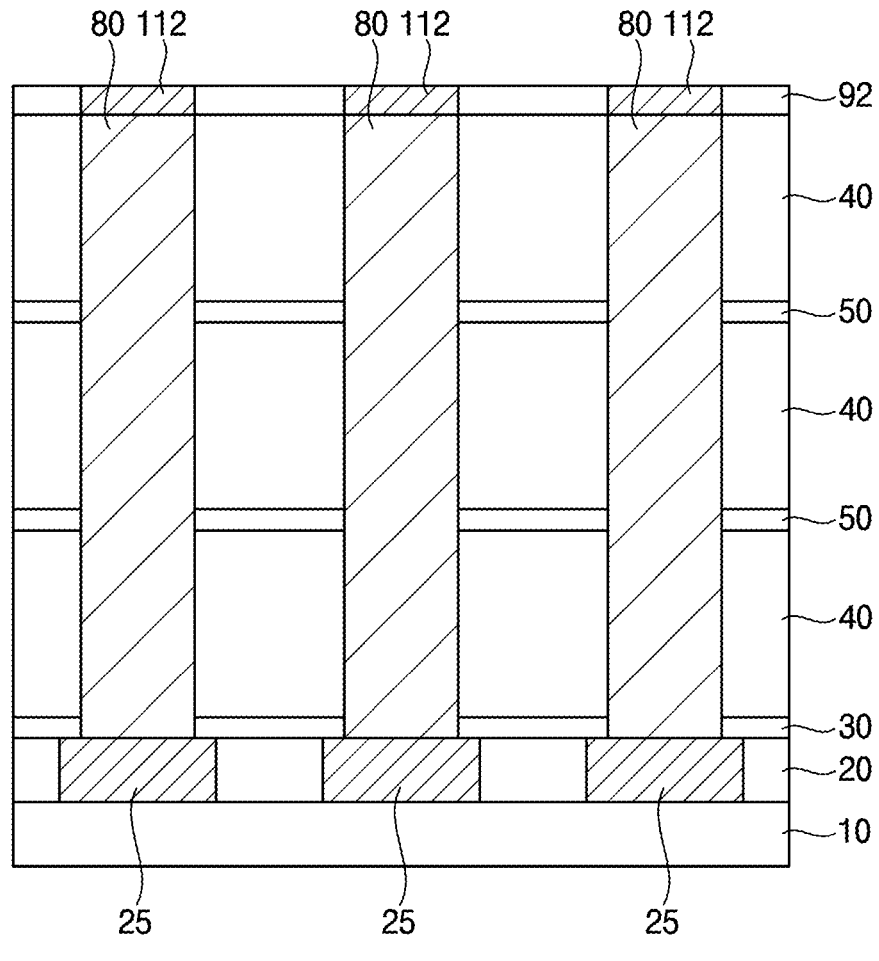

FIGS. 10 and 11 are cross-sectional views illustrating stages in a method of forming the first capacitor structure in accordance with example embodiments. This method may include processes substantially the same as or similar to those illustrated with reference to FIGS. 1 to 9, and thus, repeated explanations are omitted herein.

Referring to FIG. 10, processes substantially the same as or similar to those illustrated with reference to FIGS. 2 to 4 may be performed, and the second selective deposition process illustrated with reference to FIG. 6 may be performed to form the first electrode pattern 112 on the lower electrode 80. In other words, the first electrode pattern 112 may be formed on the lower electrode 80 before forming the first insulation layer 92.

Referring to FIG. 11, the first selective deposition process illustrated with reference to FIG. 5 may be performed to form the first insulation layer 92 on the uppermost one of the mold layer 40. That is, in this method, instead of performing the second selective deposition process after performing the first selective deposition process, the first selective deposition process is performed after performing the second selective deposition process.

Processes substantially the same as or similar to those illustrated with reference to FIG. 7 may be performed to form the first electrode structure 120 and the first insulation layer structure 100. That is, the second selective deposition process and the first selective deposition process may be alternately and repeatedly performed to form the first electrode structure 120 and the first insulation layer structure 100.

Processes substantially the same as or similar to those illustrated with reference to FIGS. 8 to 9 and FIG. 1 may be performed to form the first capacitor structure.

Figure 12:
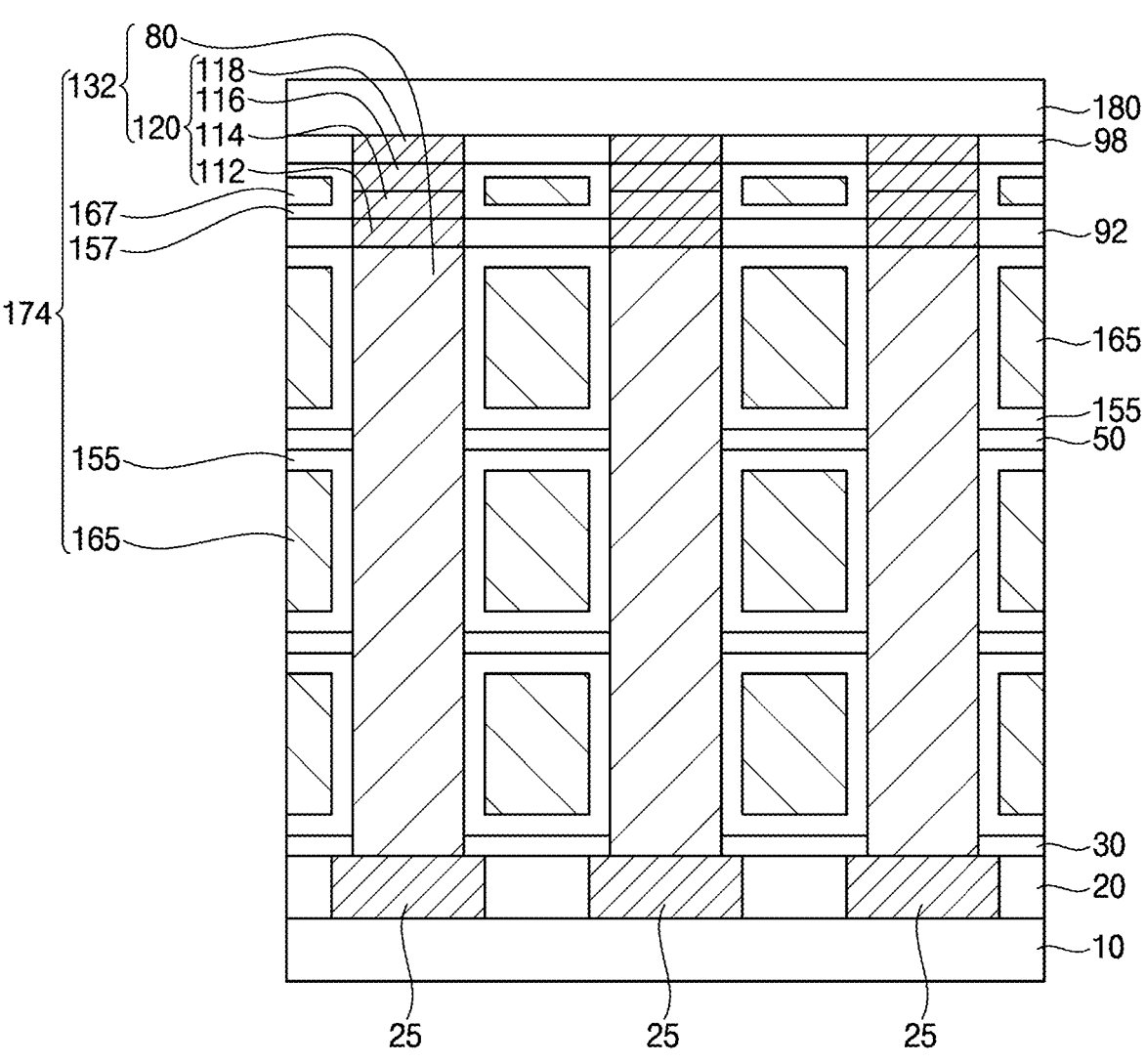
FIG. 12 is a cross-sectional view illustrating a second capacitor structure in accordance with example embodiments.

FIG. 12 is a cross-sectional view illustrating a second capacitor structure in accordance with example embodiments. The second capacitor structure may be substantially the same as or similar to the first capacitor structure of FIG. 1, except for further including a third support layer, a second dielectric pattern, and a second upper electrode, and thus repeated explanations are omitted herein.

Referring to FIG. 12, the second capacitor structure may further include a third support layer 92 on a sidewall of some of the electrode patterns included in the first electrode structure 120, i.e., on a sidewall of the first electrode pattern 112 in FIG. 12.

Additionally, the second capacitor structure may include a second capacitor 174, which may include a second dielectric pattern 157 contacting sidewalls of other electrode patterns included in the first electrode structure 120 except for electrode patterns of which sidewalls are covered by the second and third support layers 98 and 92, a lower surface of the second support layer 98 and an upper surface of the third support layer 92, and a second upper electrode 167 of which a surface is covered by the second dielectric pattern 157. However, the first dielectric pattern 155 may contact a lower surface of the third support layer 92 instead of the lower surface of the second support layer 98, and may not contact the sidewalls of the first to fourth electrode patterns 112, 114, 116 and 118.

The second capacitor 174 may be formed when the mold layers 40 are removed to form the third opening 140 through the process illustrated with reference to FIG. 8, by removing only the second and third insulation layers 94 and 96 and not removing the first insulation layer 92. Thus, the first dielectric layer 150 and the first upper electrode layer 160 may also be formed between the first and fourth insulation layers 92 and 98, when the process illustrated with reference to FIG. 9 is performed. The first insulation layer 92 may be formed on the sidewall of the first electrode structure 120 as the fourth insulation layer 98, and may support the first electrode structure 120. Thus, the first insulation layer 92 may also be referred to as the third support layer 92.

Figure 13:
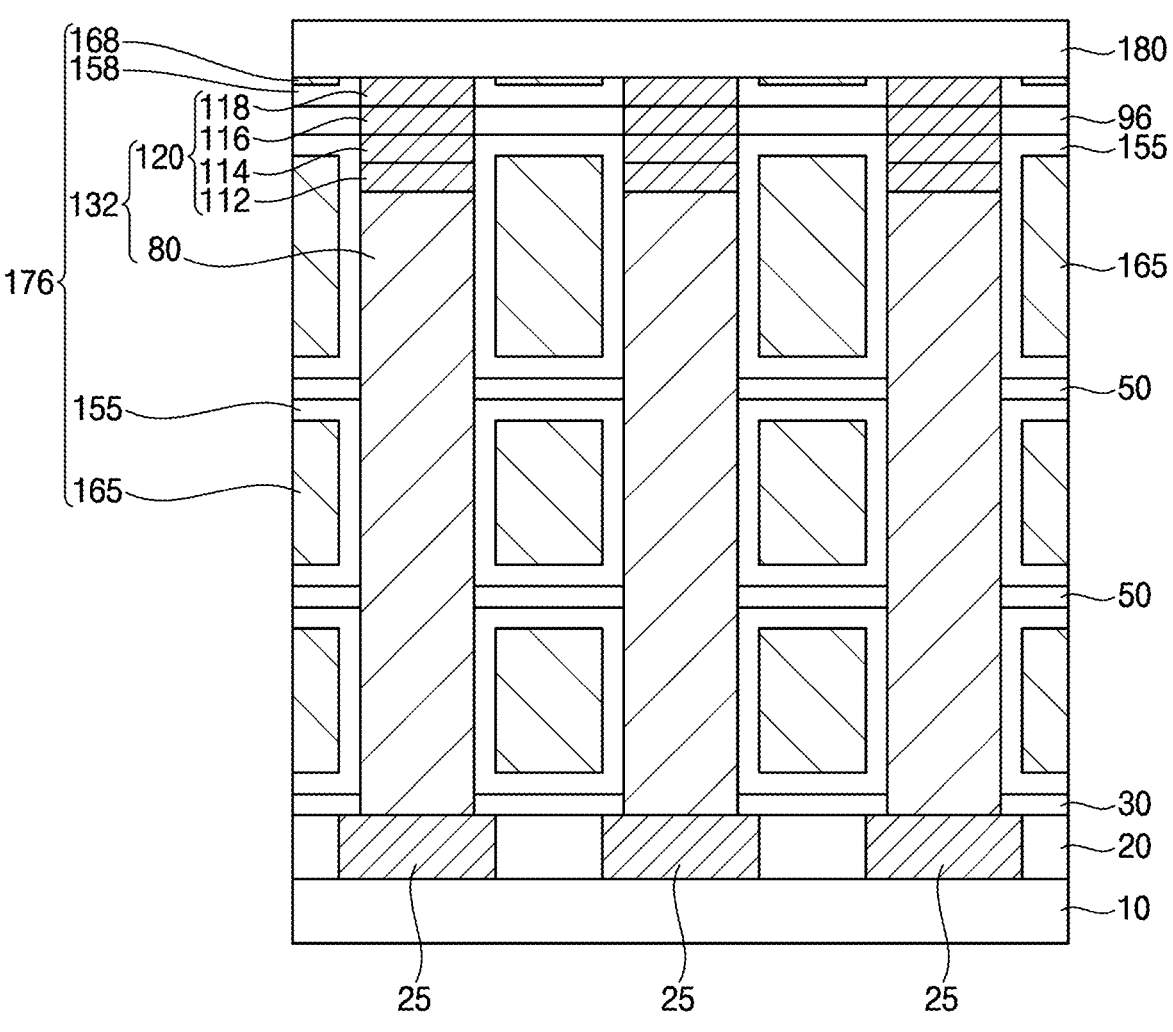
FIG. 13 is a cross-sectional view illustrating a third capacitor structure in accordance with example embodiments.

FIG. 13 is a cross-sectional view illustrating a third capacitor structure in accordance with example embodiments. The third capacitor structure may be substantially the same as or similar to the first capacitor structure of FIG. 1, except for including a fourth support layer instead of the second support layer, and further including a third dielectric pattern and a third upper electrode, and thus repeated explanations are omitted herein.

Referring to FIG. 13, the third capacitor structure may not include the second support layer 98 on the sidewall of the uppermost one of the electrode patterns included in the first electrode structure 120, i.e., on the fourth electrode pattern 118 in FIG. 13, but may include a fourth support layer 96 on a sidewall of another one of the electrode patterns included in the first electrode structure 120, e.g., on the third electrode pattern 116 in FIG. 13.

Additionally, the third capacitor structure may include a third capacitor 176, which may include a third dielectric pattern 158 contacting a sidewall of the uppermost one of the electrode patterns included in the first electrode structure 120, i.e., the fourth electrode pattern 118 in FIG. 13 and an upper surface of the fourth support layer 96, and a third upper electrode 168 of which a lower surface and a sidewall are covered by the third dielectric pattern 158. However, the first dielectric pattern 155 may contact a lower surface of the fourth support layer 96 instead of the lower surface of the second support layer 98, and may not contact the sidewalls of the third and fourth electrode patterns 116 and 118.

Figure 14:
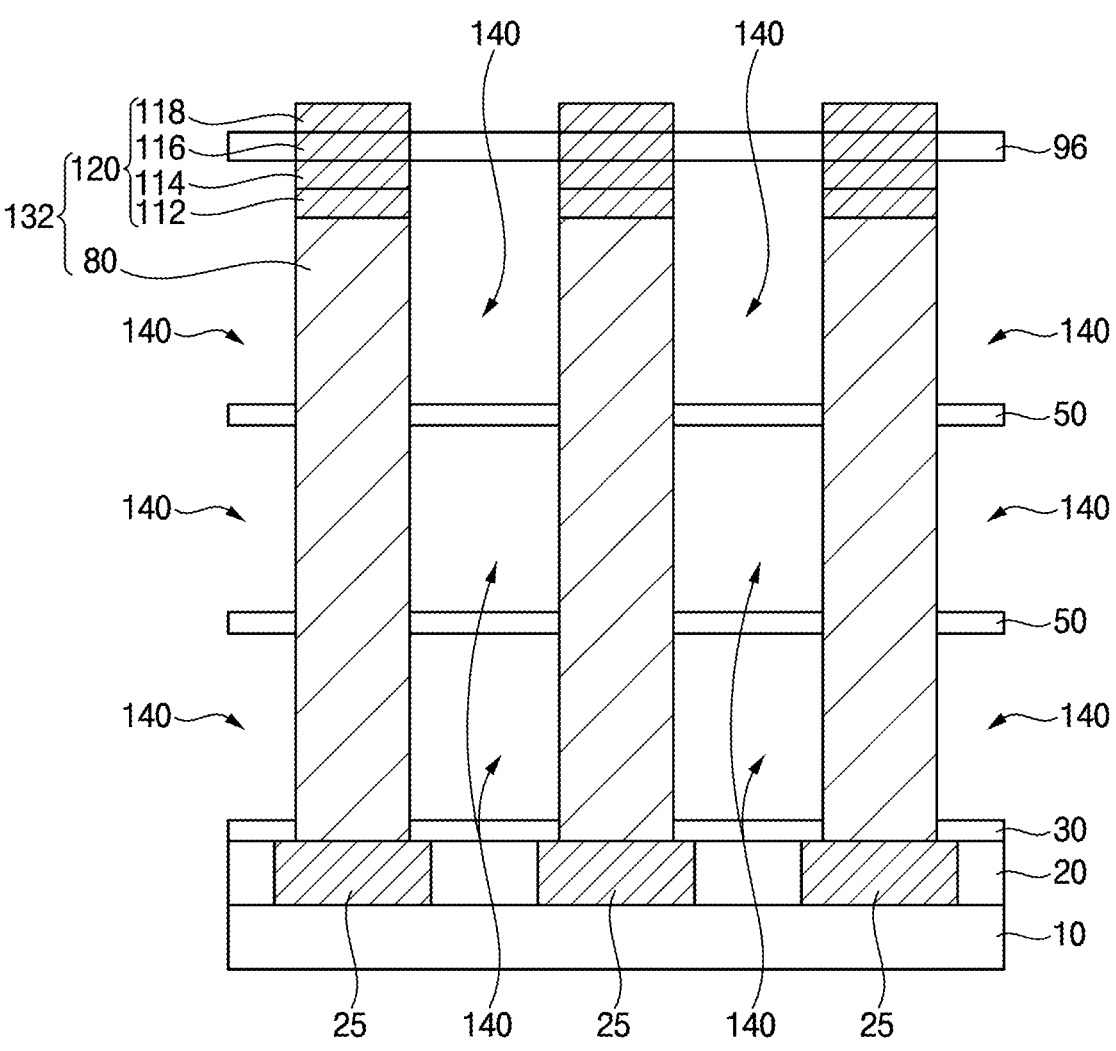
FIGS. 14 and 15 are cross-sectional views illustrating stages in a method of forming a third capacitor structure in accordance with example embodiments.
Figure 15:
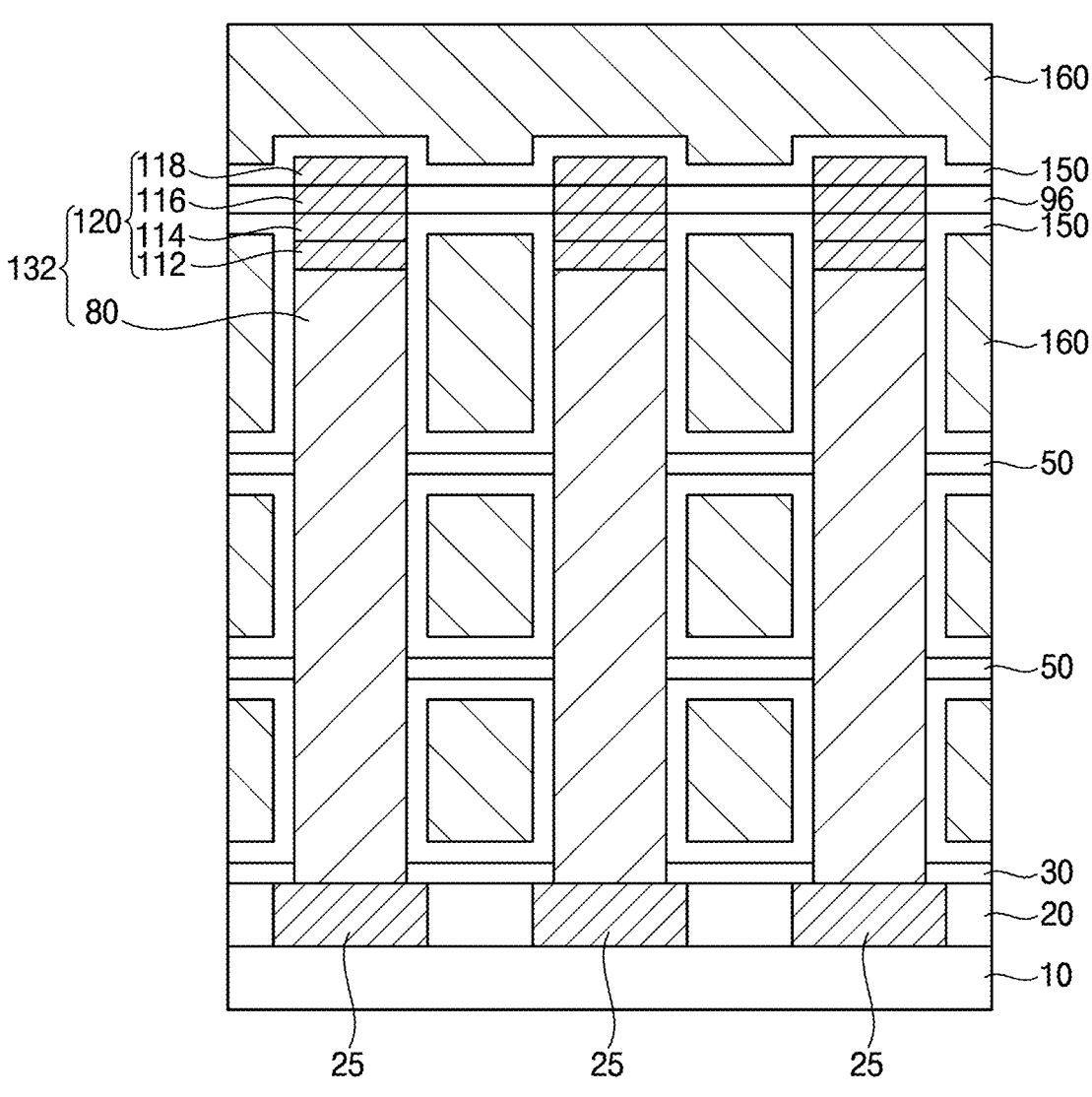

FIGS. 14 and 15 are cross-sectional views illustrating stages in a method of forming a third capacitor structure in accordance with example embodiments. This method may include processes substantially the same as or similar to those illustrated with reference to FIGS. 2 to 9 and FIG. 1, and thus repeated explanations are omitted herein.

Referring to FIG. 14, processes substantially the same as or similar to those illustrated with reference to FIGS. 2 to 7 may be performed, and processes substantially the same as or similar to those illustrated with reference to FIG. 8 may be performed to form the third opening 140. However, when the third opening 140 is formed, the first, second and fourth insulation layers 92, 94 and 96 included in the first insulation layer structure 100 may be removed, while the third insulation layer 96 may not be removed.

Referring to FIG. 15, processes substantially the same as or similar to those illustrated with reference to FIG. 9 may be performed to form the first dielectric layer 150 and the first upper electrode layer 160, and the first dielectric layer 150 and the first upper electrode layer 160 may also be formed on the third insulation layer 96 and the fourth electrode pattern 118. The third insulation layer 96 may support the first electrode structure 120 as the fourth insulation layer 98, and thus may also be referred to as a fourth support layer 96.

Referring to FIG. 13 again, the first upper electrode layer 160 and the first dielectric layer 150 may be planarized until an upper surface of the fourth electrode pattern 118 is exposed, and thus a third dielectric pattern 158 contacting an upper surface of the fourth support layer 96 and a sidewall of the fourth electrode pattern 118, and a third upper electrode 168 of which a lower surface and a sidewall are covered by the third dielectric pattern 158.

Figure 16:
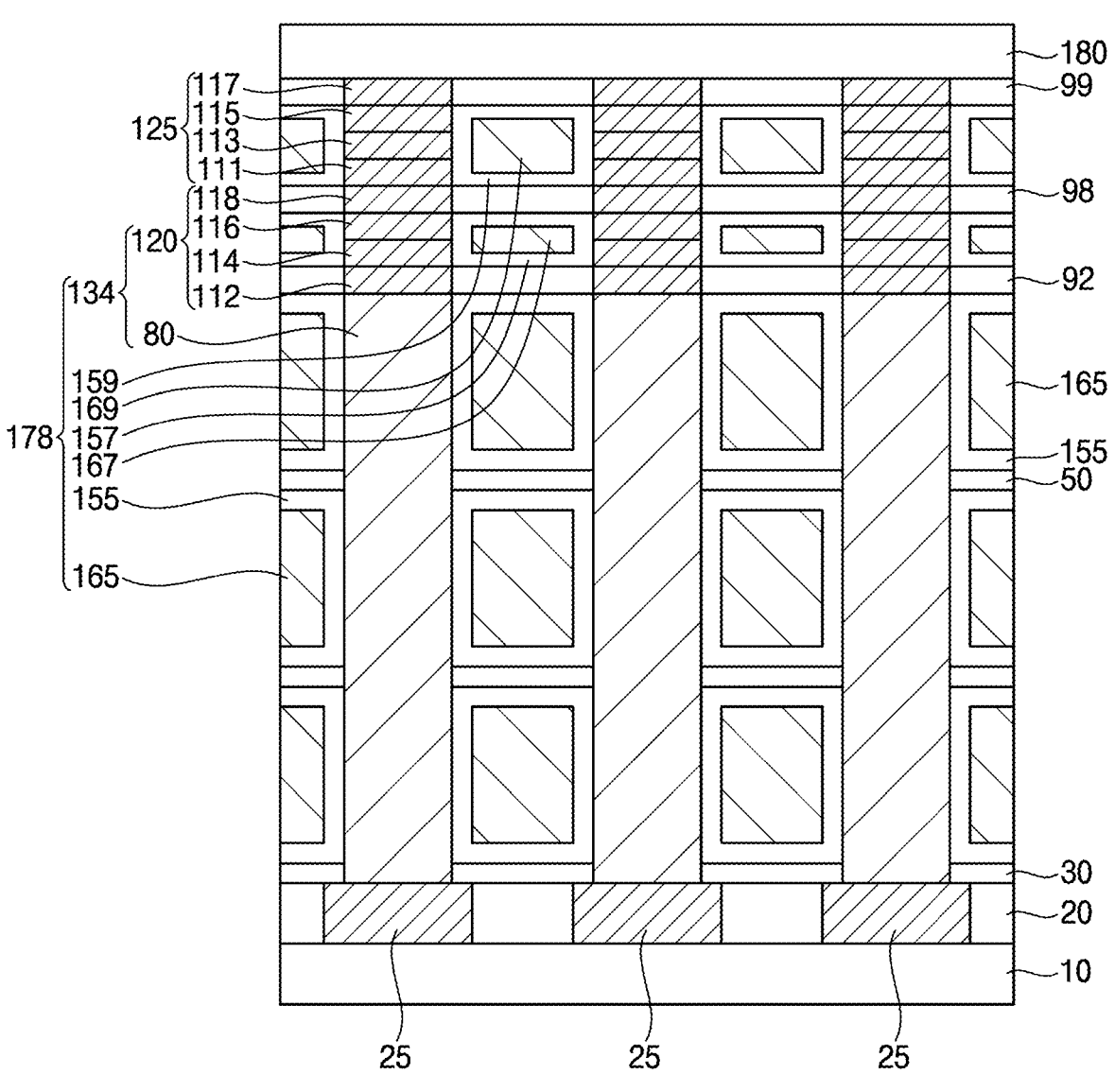
FIG. 16 is a cross-sectional view illustrating a fourth capacitor structure in accordance with example embodiments.

FIG. 16 is a cross-sectional view illustrating a fourth capacitor structure in accordance with example embodiments. The fourth capacitor structure may be substantially the same as or similar to the first capacitor structure of FIG. 1, except for further including a second electrode structure, a fifth support layer, a fourth dielectric pattern and a fourth upper electrode, and thus repeated explanations are omitted herein.

Referring to FIG. 16, the fourth capacitor structure may include a fourth capacitor 178, which may include a second lower electrode structure 134 instead of the first lower electrode structure 132.

The second lower electrode structure 134 may include a second electrode structure 125 on the first electrode structure 120, in addition to the lower electrode 80 and the first electrode structure 120, and the second electrode structure 125 may include a plurality of electrode patterns sequentially stacked in the vertical direction. For example, as illustrated in FIG. 16, the second electrode structure 125 may include fifth, sixth, seventh and eighth electrode patterns 111, 113, 115 and 117.

The fifth to eighth electrode patterns 111, 113, 115 and 117 may correspond to the first to fourth electrodes 112, 114, 116 and 118. Thus, each of the fifth to eighth electrode patterns 111, 113, 115 and 117 may include a metal nitride, e.g., titanium nitride, niobium nitride, etc., or a metal silicon nitride, e.g., titanium silicon nitride. In an example embodiment, each of the fifth to eighth electrode patterns 111, 113, 115 and 117 may include a material substantially the same as the material of the lower electrode 80. Alternatively, at least one of the fifth to eighth electrode patterns 111, 113, 115 and 117 may include a material different from the material of the lower electrode 80.

In some embodiments, the second lower electrode structure 134 may further include an electrode structure corresponding to the second electrode structure 125, in addition to the second electrode structure 125.

The fourth capacitor structure may further include a fifth support layer 99 on a sidewall of an uppermost one of the electrode patterns included in the second electrode structure 125, i.e., the eighth electrode pattern 117, and the fifth support layer 99 may include a material substantially the same as or different from a material of the first and third support layers 50 and 92. The fourth capacitor 178 may further include a fourth dielectric pattern 159 contacting sidewalls of the fifth to seventh electrode patterns 111, 113 and 115, an upper surface of the third support layer 92 and a lower surface of the fifth support layer 99 between the third and fifth support layers 92 and 99, and a fourth upper electrode 169 surrounded by the fourth dielectric pattern 159.

Figure 17:
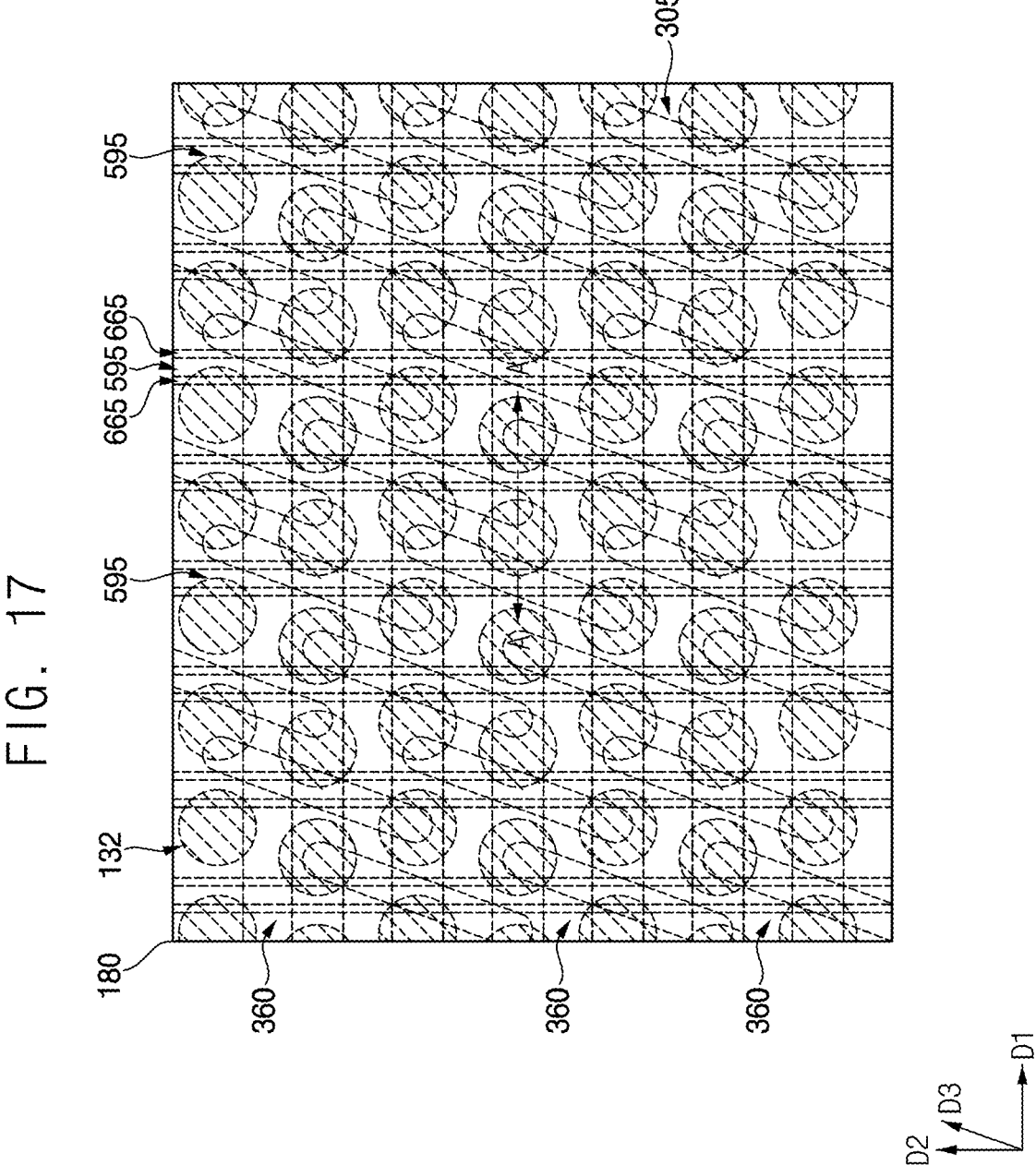
FIG. 17 is a plan view illustrating a semiconductor device in accordance with example embodiments.
Figure 18:
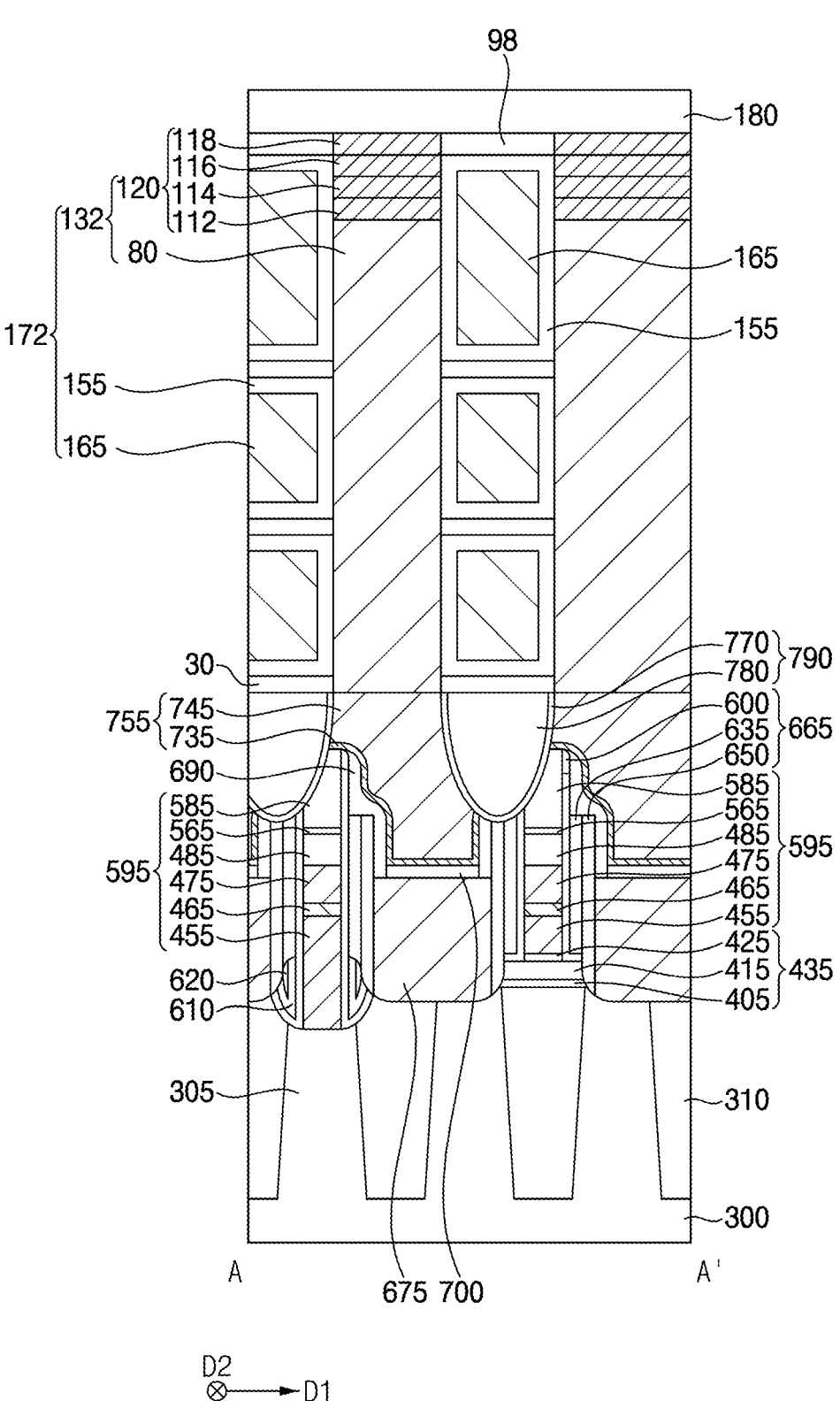
FIG. 18 is a cross-sectional view taken along line A-A' of FIG. 17.

FIG. 17 is a plan view illustrating a semiconductor device in accordance with example embodiments, and FIG. 18 is a cross-sectional view taken along line A-A' of FIG. 17.

This semiconductor device in FIG. 17n may be a DRAM device to which the first capacitor structure of FIG. 1 is applied, and thus repeated explanations of the first capacitor structure are omitted herein. However, this semiconductor device may include one of the second to fourth capacitor structures illustrated with reference to FIGS. 12, 13 and 16, respectively, instead of the first capacitor structure.

Hereinafter, two directions among horizontal directions that are substantially parallel to an upper surface of a substrate 300, which may be substantially perpendicular to each other, may be referred to as first and second directions D1 and D2, and a direction among the horizontal direction, which may have an acute angle with respect to the first and second directions D1 and D2, may be referred to as a third direction D3. A direction substantially perpendicular to the upper surface of the substrate 300 may be referred to as a vertical direction.

Referring to FIGS. 17 and 18, the semiconductor device may include an active pattern 305, a gate structure 360, a first bit line structure 595, a contact plug structure, and a first capacitor structure. Additionally, the semiconductor device may further include an isolation pattern 310, a spacer structure 665, a fourth spacer 690, a second capping pattern 685 (refer to FIG. 28), first and second insulation pattern structures 435 and 790, eighth and ninth insulation patterns 610 and 620, and a metal silicide pattern 700.

In detail, the active pattern 305 may be formed on a substrate 300, and the isolation pattern 310 may be formed to cover a sidewall of the active pattern 305. The active pattern 305 may extend in the third direction D3, and a plurality of active patterns 305 may be spaced apart from each other in the first and second directions D1 and D2. A sidewall of the active pattern 305 may be covered by the isolation pattern 310. The active pattern 305 may include a material substantially the same as a material of the substrate 300, and the isolation pattern 310 may include an oxide, e.g., silicon oxide.

Figure 20:
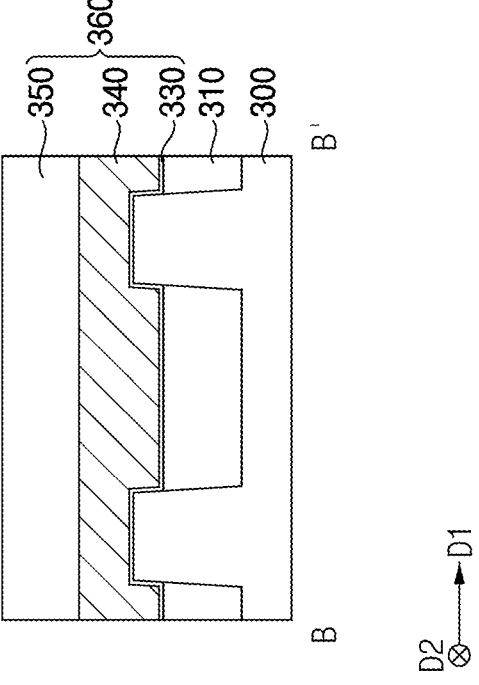
Figure 20:
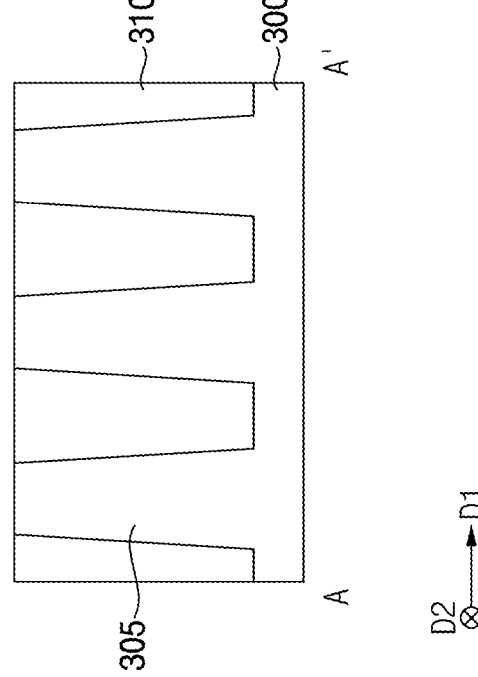

Referring to FIGS. 17 and 18 together with FIG. 20, the gate structure 360 may be formed in a second recess extending through upper portions of the active pattern 305 and the isolation pattern 310 in the first direction D1. The gate structure 360 may include a first gate insulation pattern 330 on a bottom and a sidewall of the second recess, a first gate electrode 340 on a portion of the first gate insulation pattern 330 on the bottom and a lower sidewall of the second recess, and a gate mask 350 on an upper surface of the first gate electrode 340 and filling an upper portion of the second recess.

The first gate insulation pattern 330 may include an oxide, e.g., silicon oxide, the first gate electrode 340 may include, e.g., a metal, a metal nitride, a metal silicide, etc., and the gate mask 350 may include an insulating nitride, e.g., silicon nitride. In example embodiments, the gate structure 360 may extend in the first direction D1, and a plurality of gate structures 360 may be spaced apart from each other in the second direction D2.

Figure 21:
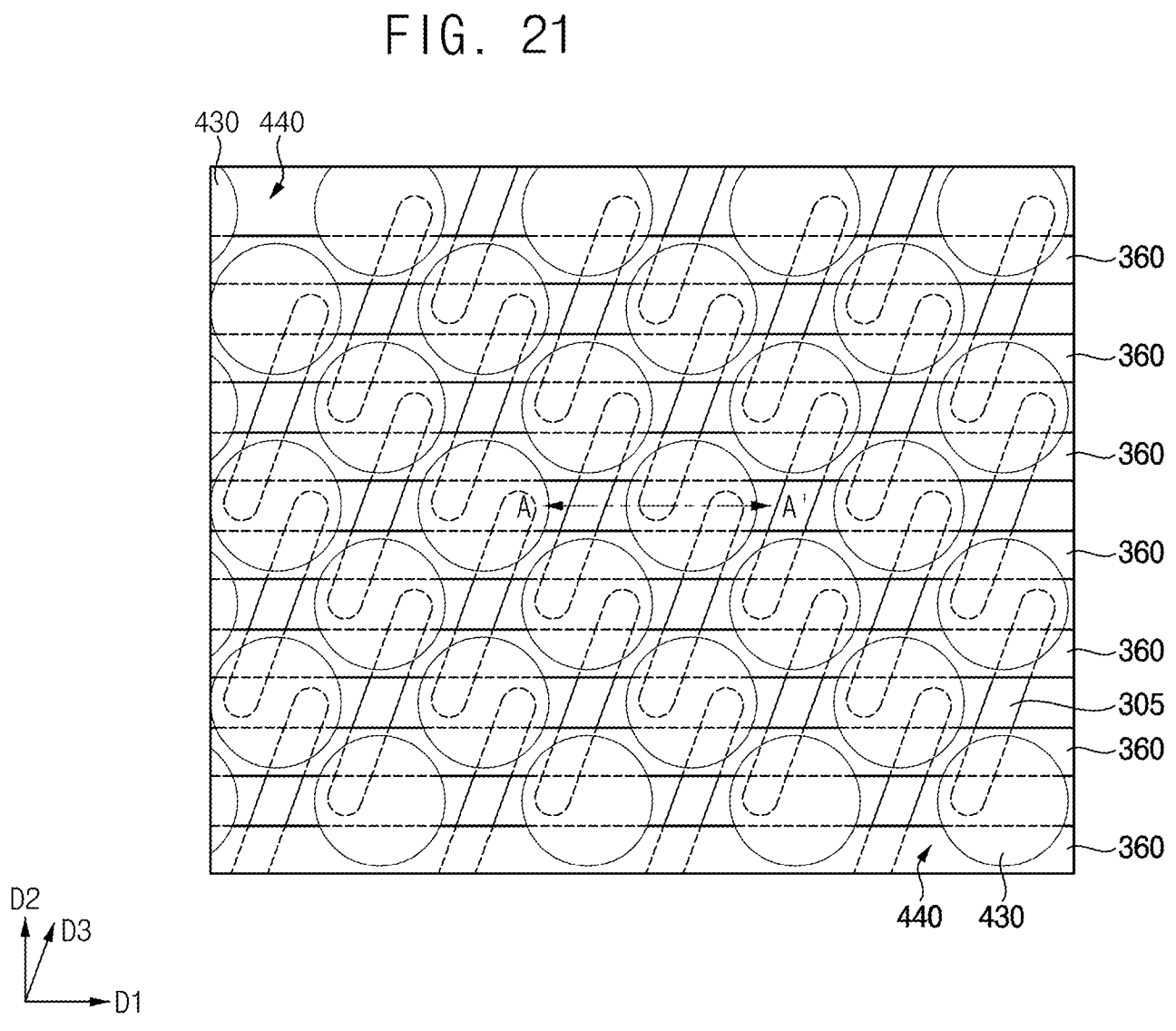
Figure 22:
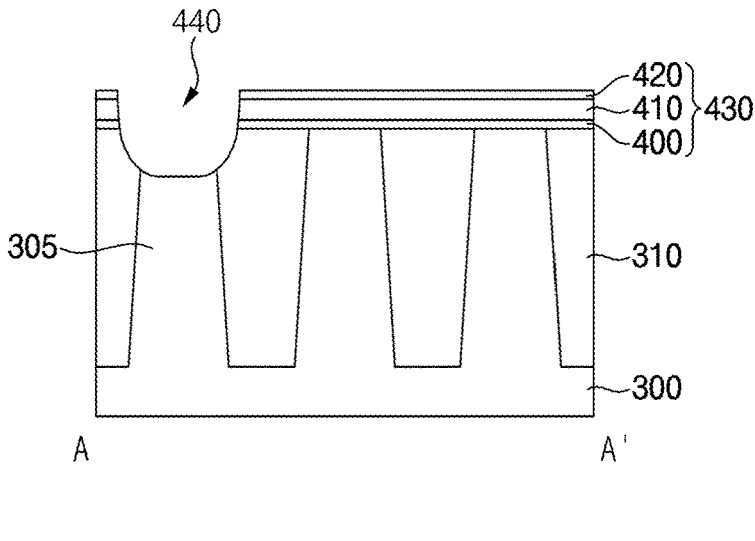

Referring to FIGS. 1 and 2 together with FIGS. 21 and 22, a fourth opening 440 may be formed to extend through the second insulation layer structure 430 to expose upper surfaces of the active pattern 305, the isolation pattern 310, and the gate mask 350 of the gate structure 360, and an upper surface of a central portion in the third direction D3 of the active pattern 305 may be exposed by the fourth opening 440.

In example embodiments, a bottom of the fourth opening 440 may be greater than the upper surface of the active pattern 305 exposed by the fourth opening 440. Thus, the fourth opening 440 may also expose an upper surface of a portion of the isolation pattern 310 adjacent to the active pattern 305. Additionally, the fourth opening 440 may extend through an upper portion of the active pattern 305 and an upper portion of the isolation pattern 310 adjacent thereto, and thus the bottom of the fourth opening 440 may be lower than an upper surface of a portion of the active pattern 305 where the fourth opening 440 is not formed, i.e., an upper surface of each of opposite edge portions in the third direction D3 of the active pattern 305.

As illustrated in FIG. 18, the first bit line structure 595 may include a second conductive pattern 455, a first barrier pattern 465, a third conductive pattern 475, a second mask 485, a second etch stop pattern 565, and a first capping pattern 585 sequentially stacked in the vertical direction on the fourth opening 440 or on the first insulation pattern structure 435. The second conductive pattern 455, the first barrier pattern 465, and the third conductive pattern 475 may collectively form a conductive structure, and the second mask 485, the second etch stop pattern 565, and the first capping pattern 585 may collectively form an insulation structure.

The second conductive pattern 455 may include, e.g., doped polysilicon, the first barrier pattern 465 may include a metal nitride, e.g., titanium nitride, or a metal silicon nitride, e.g., titanium silicon nitride, the third conductive pattern 475 may include a metal, e.g., tungsten, and each of the second mask 485, the second etch stop pattern 565, and the first capping pattern 585 may include an insulating nitride, e.g., silicon nitride.

In example embodiments, the first bit line structure 595 may extend in the second direction D2 on the substrate 300, and a plurality of first bit line structures 595 may be spaced apart from each other in the first direction D1.

The eighth and ninth insulation patterns 610 and 620 may be formed on the fourth opening 440, and may contact a lower sidewall of the first bit line structure 595. The eighth insulation pattern 610 may include an oxide, e.g., silicon oxide, and the ninth insulation pattern 620 may include an insulating nitride, e.g., silicon nitride.

The first insulation pattern structure 435 may be formed under the first bit line structure 595 on the active pattern 305 and the isolation pattern 310, and may include fifth, sixth and seventh insulation patterns 405, 415 and 425 sequentially stacked in the vertical direction. The fifth and seventh insulation patterns 405 and 425 may include an oxide, e.g., silicon oxide, and the sixth insulation pattern 415 may include an insulating nitride, e.g., silicon nitride.

The contact plug structure may include a lower contact plug 675, a metal silicide pattern 700 and an upper contact plug 755 sequentially stacked on the active pattern 305 and the isolation pattern 310 in the vertical direction.

The lower contact plug 675 may contact the upper surface of each of opposite edge portions in the third direction D3 of the active pattern 305. In example embodiments, a plurality of lower contact plugs 675 may be spaced apart from each other in the second direction D2 between neighboring ones of the bit line structures 595 in the first direction D1, and the second capping pattern 685 may be formed between neighboring ones of the lower contact plugs 675 in the second direction D2. The second capping pattern 685 may include an insulating nitride, e.g., silicon nitride.

The lower contact plug 675 may include, e.g., doped polysilicon, and the metal silicide pattern 700 may include, e.g., titanium silicide, cobalt silicide, nickel silicide, etc.

The upper contact plug 755 may include a second metal pattern 745 and a second barrier pattern 735 covering a lower surface of the second metal pattern 745. The second metal pattern 745 may include a metal, e.g., tungsten, and the second barrier pattern 735 may include a metal nitride, e.g., titanium nitride.

In example embodiments, a plurality of upper contact plugs 755 may be spaced apart from each other in the first and second directions D1 and D2, and may be arranged in a honeycomb pattern or a lattice pattern in a plan view. Each of the upper contact plugs 755 may have a shape of, e.g., a circle, an ellipse or a polygon in a plan view.

The spacer structure 665 may include a first spacer 600 covering a sidewall of the first bit line structure 595 and a sidewall of the seventh insulation pattern 425, an air spacer 635 on a lower outer sidewall of the first spacer 600, and a third spacer 650 covering an outer sidewall of the air spacer 635, a sidewall of the first insulation pattern structure 435 and upper surfaces of the eighth and ninth insulation patterns 610 and 620. Each of the first and third spacers 600 and 650 may include an insulating nitride, e.g., silicon nitride, and the air spacer 895 may include air.

The fourth spacer 690 may be formed on an outer sidewall of a portion of the first spacer 600 on an upper sidewall of the first bit line structure 595, and may cover a top of the air spacer 635 and an upper surface of the third spacer 650. The fourth spacer 690 may include an insulating nitride, e.g., silicon nitride.

Figure 32:
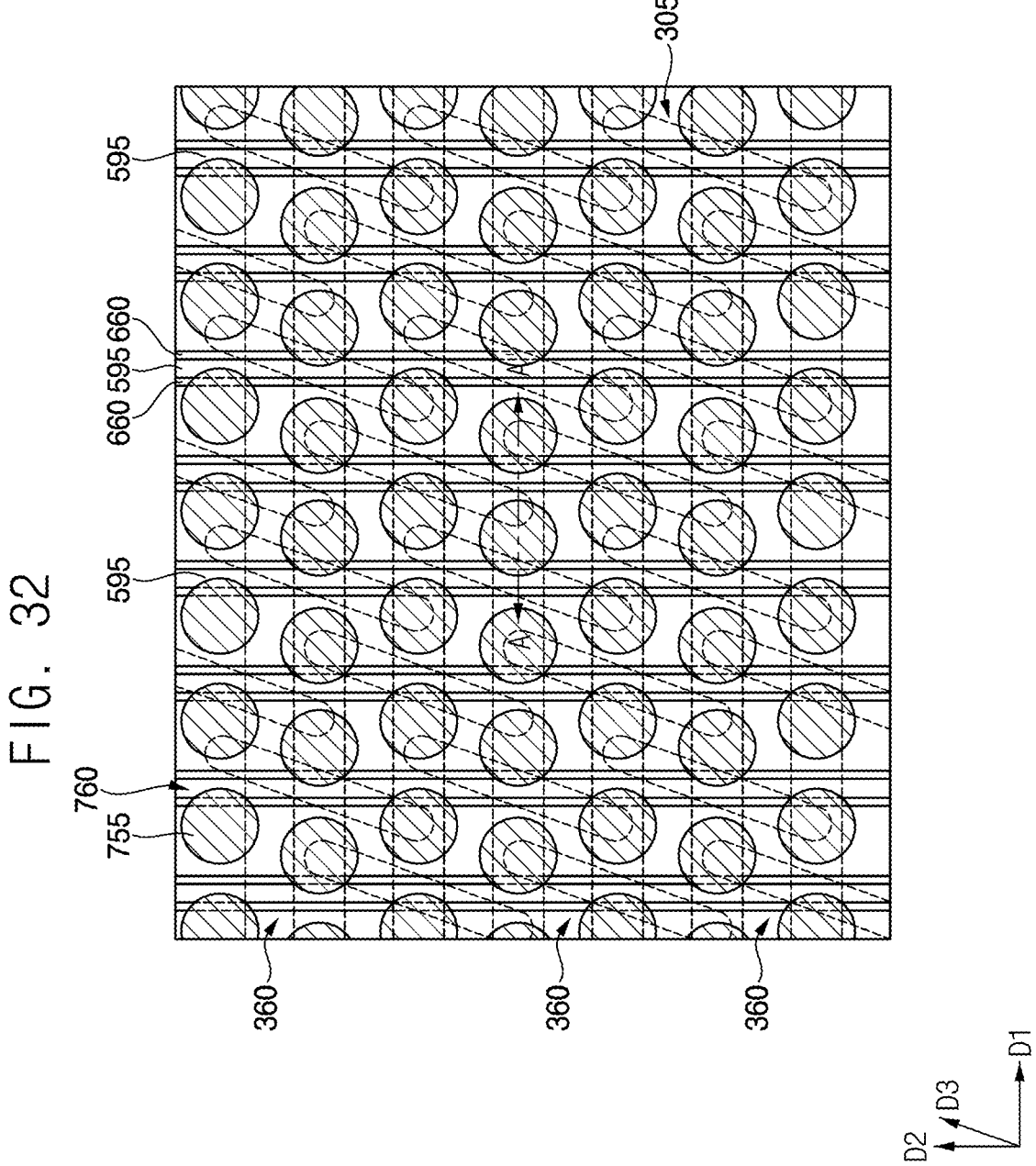
Figure 33:
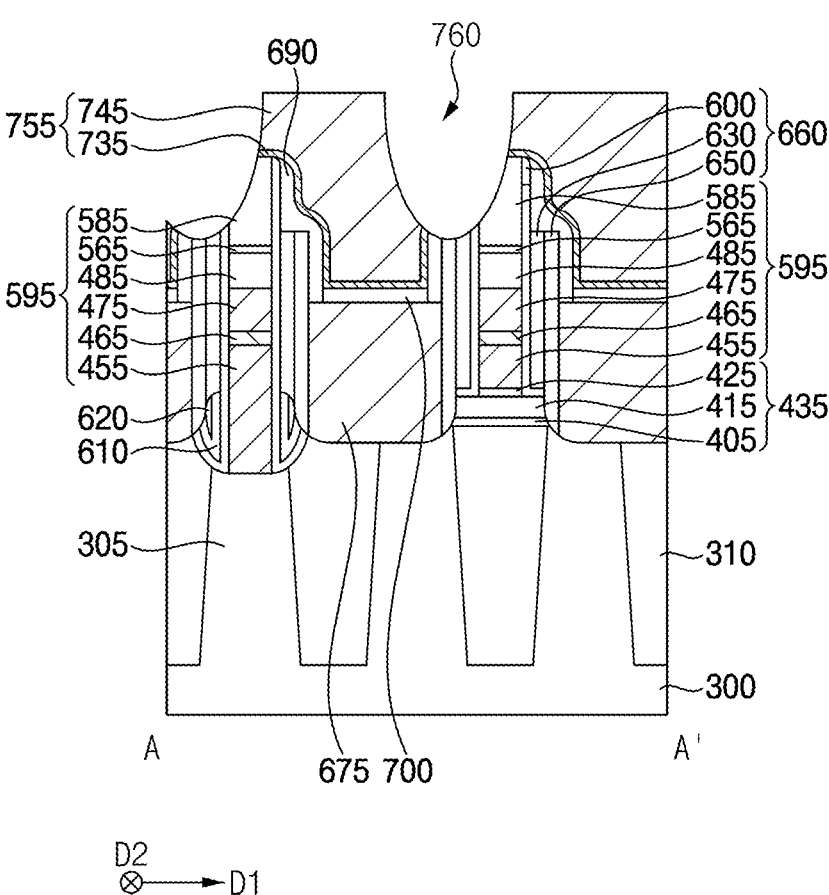

Referring to FIGS. 17 and 18 together with FIGS. 32 and 33, the second insulation pattern structure 790 may include a tenth insulation pattern 770 and an eleventh insulation pattern 780. The tenth insulation pattern 770 may be formed on an inner wall of a ninth opening 760 extending through the upper contact plug 755, a portion of the insulation structure included in the first bit line structure 595, and portions of the first, third and fourth spacers 600, 650 and 690 to surround the upper contact plug 755 in a plan view. The eleventh insulation pattern 780 may be formed on the tenth insulation pattern 770, and may fill a remaining portion of the ninth opening 760. The top of the air spacer 635 may be closed by the tenth insulation pattern 770. The tenth and eleventh insulation patterns 770 and 780 may include an insulating nitride, e.g., silicon nitride.

The first etch stop layer 30 may be formed on the tenth and eleventh insulation patterns 770 and 780, the upper contact plug 755 and the second capping pattern 685, and the lower electrode 80 included in the first capacitor 172 may extend through the first etch stop layer 30 to contact an upper surface of the upper contact plug 755.

The semiconductor device may include the first capacitor 172 having the first lower electrode structure 132, the first dielectric pattern 155, and the first upper electrode 165. As the first lower electrode structure 132 further includes the first electrode structure 120 on the lower electrode 80, the contact area between the first lower electrode structure 132 and the first dielectric pattern 155 may increase so as to enhance the electric capacitance of the first capacitor 172.

FIGS. 19 to 34 are plan views and cross-sectional views illustrating stages in a method of manufacturing a semiconductor device in accordance with example embodiments. Particularly, FIGS. 19, 21, 24, 28 and 32 are the plan views, FIG. 20 includes cross-sectional views taken along lines A-A' and B-B' of FIG. 19, and FIGS. 22-23, 25-27, 29-31 and 33-34 are cross-sectional views taken along lines A-A' of corresponding plan views, respectively. This method may be an application of the manufacturing method illustrated with reference to FIGS. 1 to 9 to a method of manufacturing a DRAM device, and repeated explanations are omitted herein.

Figure 19:
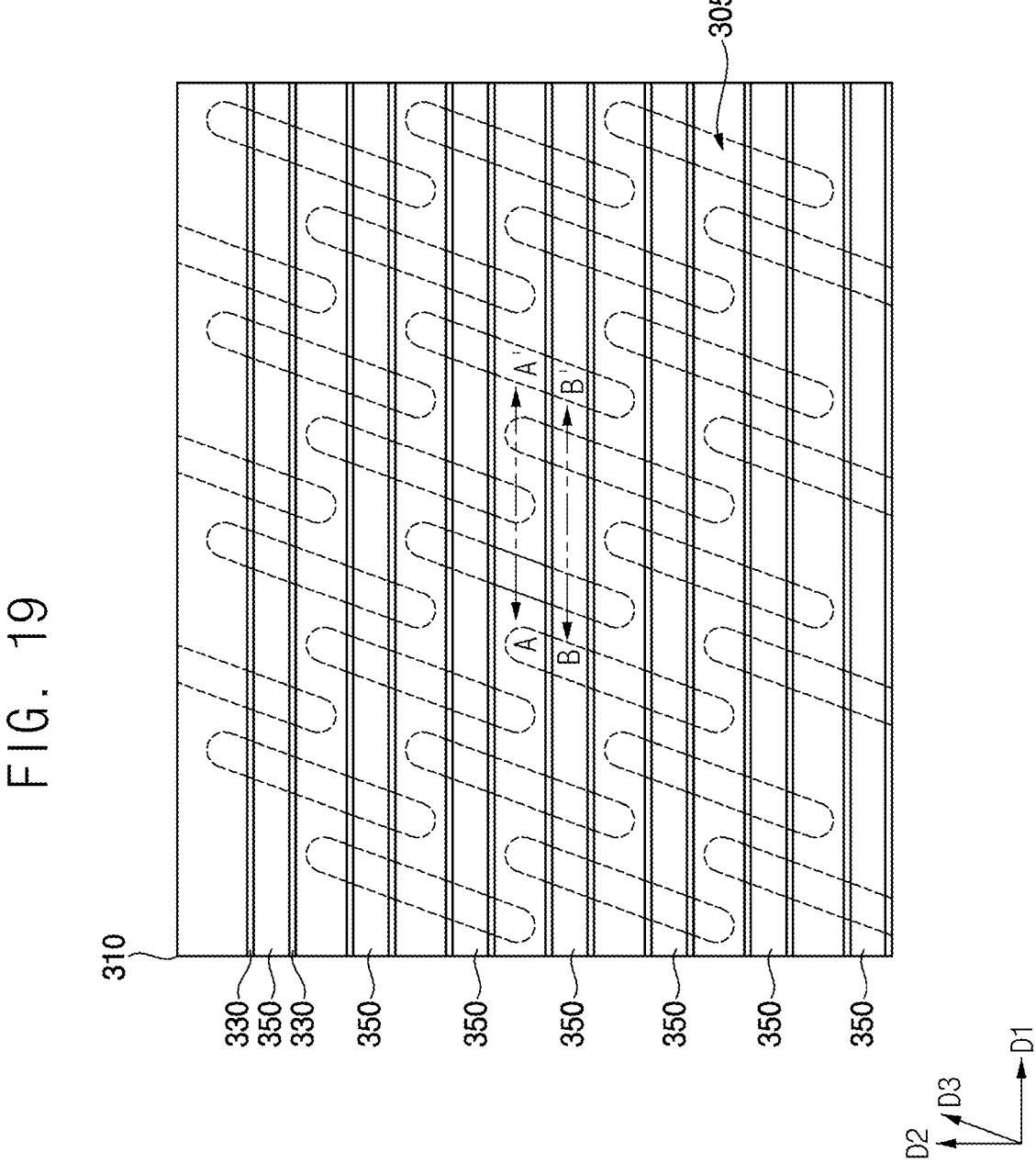

Referring to FIGS. 19 and 20, an upper portion of a substrate 300 may be removed to form a first recess, and an isolation pattern 310 may be formed in the first recess.

As the first recess is formed on the substrate 300, an active pattern 305 may be defined on the substrate 300, and a sidewall of the active pattern 305 may be covered by the isolation pattern 310. The active pattern 305 and the isolation pattern 310 may be partially etched to form a second recess extending in the first direction D1, and the gate structure 360 may be formed in the second recess. In example embodiments, the gate structure 360 may extend in the first direction D1, and a plurality of gate structures 360 may be spaced apart from each other in the second direction D2.

Referring to FIGS. 21 and 22, a second insulation layer structure 430 may be formed on the active pattern 305, the isolation pattern 310, and the gate structure 360. The second insulation layer structure 430 may include fifth, sixth and seventh insulation layers 400, 410 and 420 sequentially stacked.

The second insulation layer structure 430 may be patterned, and the active pattern 305, the isolation pattern 310, and the gate mask 350 of the gate structure 360 may be partially etched by an etching process using the patterned second insulation layer structure 430 as an etching mask to form the fourth opening 440. In example embodiments, the second insulation layer structure 430 remaining after the etching process may have a shape of, e.g., a circle or an ellipse in a plan view, and a plurality of second insulation layer structures 430 may be spaced apart from each other in the first and second directions D1 and D2. Each of the second insulation layer structures 430 may overlap edge portions in the third direction D3 of neighboring active patterns 305, respectively.

Figure 23:
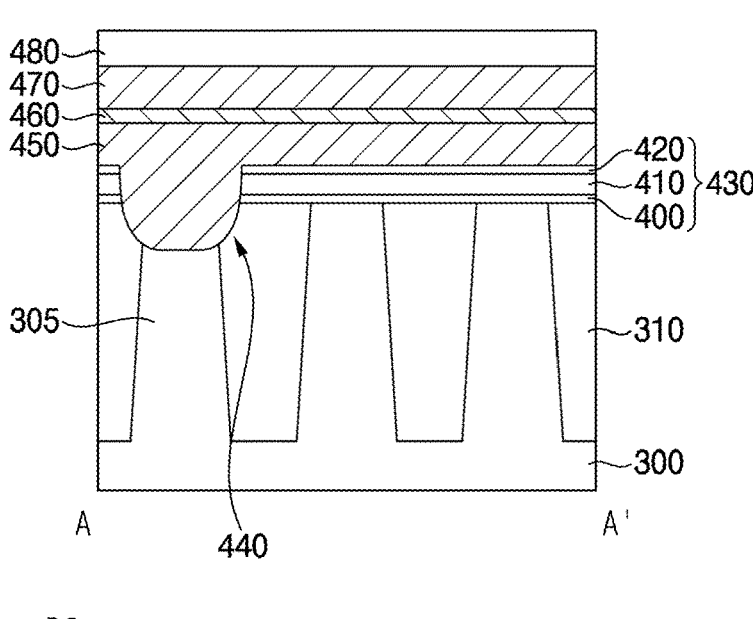

Referring to FIG. 23, a second conductive layer 450, a first barrier layer 460, a third conductive layer 470, and a second mask layer 480 may be sequentially stacked on the second insulation layer structure 430, and the active pattern 305, the isolation pattern 310, and the gate structure 360 exposed by the fourth opening 440, which may collectively form a conductive layer structure. The second conductive layer 450 may fill the fourth opening 440.

Figure 24:
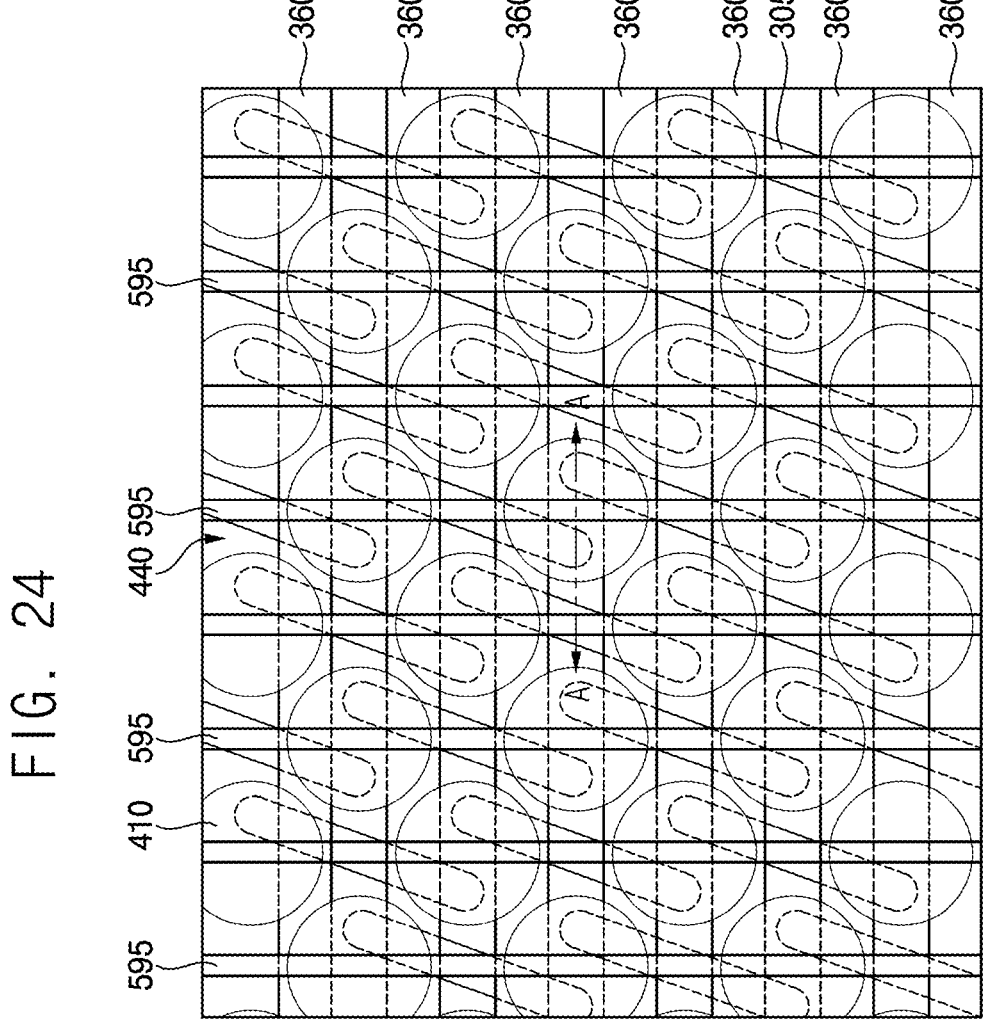
Figure 24:
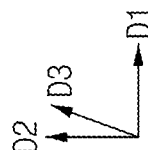
Figure 25:
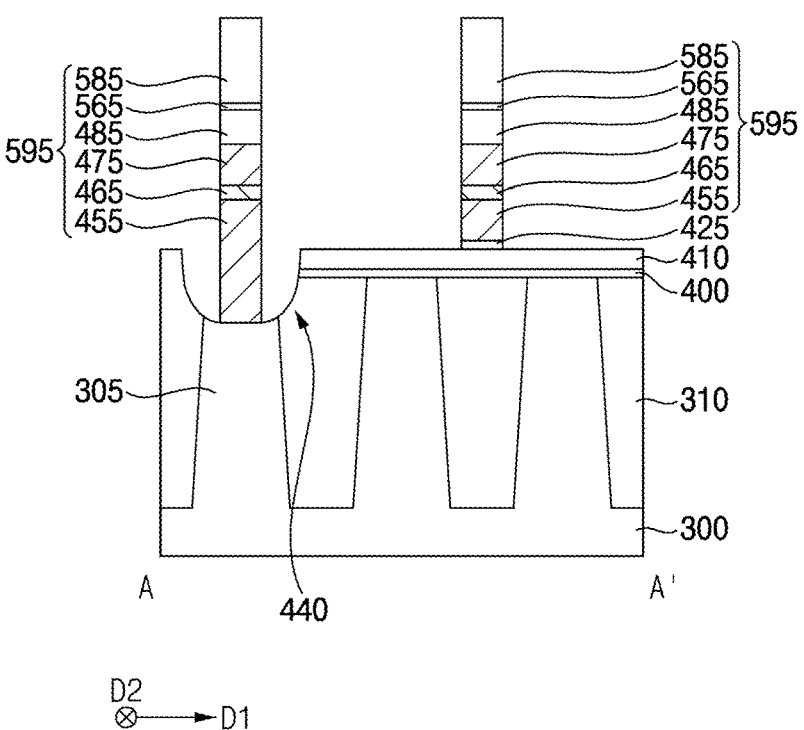

Referring to FIGS. 24 and 25, a second etch stop layer and a first capping layer may be sequentially stacked on the conductive layer structure, and the first capping layer may be etched to form a first capping pattern 585.

The second etch stop layer, the second mask layer 480, the third conductive layer 470, the first barrier layer 460, and the second conductive layer 450 may be sequentially etched by an etching process using the first capping pattern 585 as an etching mask. In example embodiments, the first capping pattern 585 may extend in the second direction D2, and a plurality of first capping patterns 585 may be spaced apart from each other in the first direction D1.

By the etching process, a second conductive pattern 455, a first barrier pattern 465, a third conductive pattern 475, a second mask 485, a second etch stop pattern 565, and the first capping pattern 585 may be sequentially stacked on the fourth opening 440, and a seventh insulation pattern 425, the second conductive pattern 455, the first barrier pattern 465, the third conductive pattern 475, the second mask 485, the second etch stop pattern 565, and the first capping pattern 585 may be sequentially stacked on the sixth insulation layer 410 of the second insulation layer structure 430 at an outside of the fourth opening 440.

Hereinafter, the second conductive pattern 455, the first barrier pattern 465, the third conductive pattern 475, the second mask 485, the second etch stop pattern 565, and the first capping pattern 585 sequentially stacked may be referred to as a first bit line structure 595. The second conductive pattern 455, the first barrier pattern 465 and the third conductive pattern 475 may collectively form a conductive structure, and the second mask 485, the second etch stop pattern 565, and the first capping pattern 585 may collectively form an insulation structure. In example embodiments, the first bit line structure 595 may extend in the second direction D2 on the substrate 300, and a plurality of first bit line structures 595 may be spaced apart from each other in the first direction D1.

Figure 26:
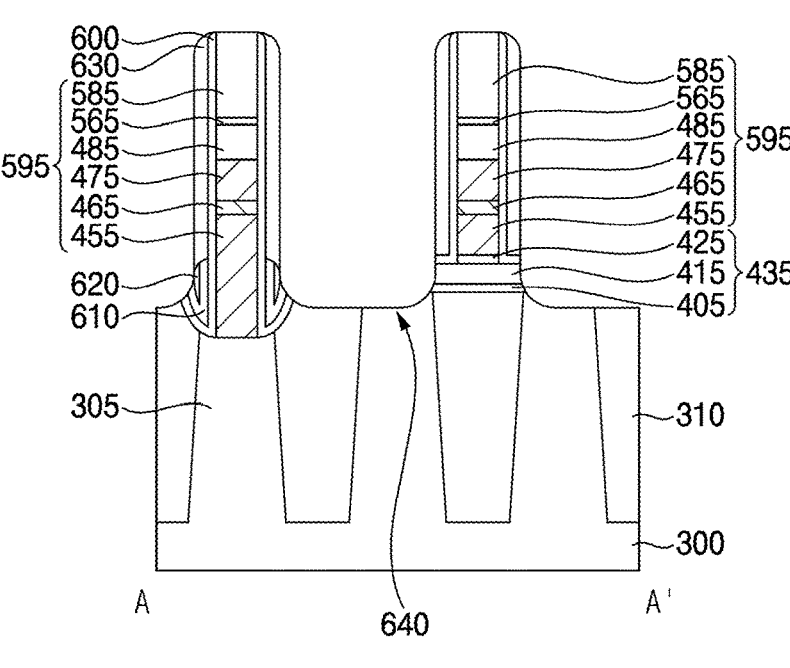
Figure 26:

Referring to FIG. 26, a first spacer layer may be formed on the substrate 300 having the first bit line structure 595, and eighth and ninth insulation layers may be sequentially formed on the first spacer layer. The first spacer layer may also cover a sidewall of the seventh insulation pattern 425 under a portion of the first bit line structure 595 on the sixth insulation layer 410, and the ninth insulation layer may fill a remaining portion of the fourth opening 440.

The eighth and ninth insulation layers may be etched by an etching process. In example embodiments, the etching process may be performed by a wet etching process using an etching solution, e.g., $H_2PO_3$, SC1, HF, etc., and portions of the eighth and ninth insulation layers at the outside of the fourth opening 440 may be removed. Thus, a portion of the first spacer layer at the outside of the fourth opening 440 may be exposed, and portions of the eighth and ninth insulation layers in the fourth opening 440 may form eighth and ninth insulation patterns 610 and 620, respectively.

A second spacer layer may be formed on the exposed portion of the first spacer layer and the eighth and ninth insulation patterns 610 and 620 in the fourth opening 440, and may be anisotropically etched to form a second spacer 630 on the exposed portion of the first spacer and the eighth and ninth insulation patterns 610 and 620 to cover a sidewall of the first bit line structure 595.

A dry etching process may be performed using the first capping pattern 585 and the second spacer 630 as an etching mask to form a fifth opening 640 exposing an upper surface of the active pattern 305, and upper surfaces of the isolation pattern 310 and the gate mask 350 may also be exposed by the fifth opening 640.

By the dry etching process, a portion of the first spacer layer on the first capping pattern 585 and the sixth insulation layer 410 may be removed, and thus a first spacer 600 covering a sidewall of the first bit line structure 595 may be formed. Additionally, by the dry etching process, the fifth and sixth insulation layers 400 and 410 may also be partially etched so that fifth and sixth insulation patterns 405 may remain under the first bit line structure 595. The fifth, sixth and seventh insulation patterns 405, 415 and 425 sequentially stacked under the first bit line structure 595 may collectively form a first insulation pattern structure 435.

Figure 27:
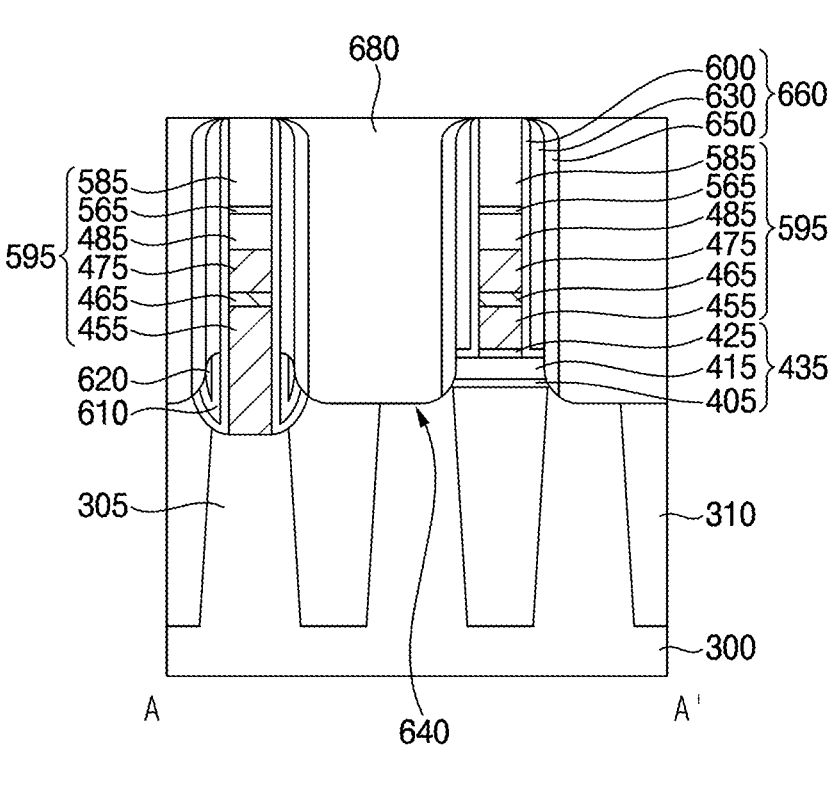

Referring to FIG. 27, a third spacer layer may be formed on an upper surface of the first capping pattern 585, an outer sidewall of the second spacer 630, upper surfaces of the eighth and ninth insulation patterns 610 and 620, and the upper surfaces of the active pattern 305, the isolation pattern 310 and the gate mask 350 exposed by the fifth opening 640, and may be anisotropically etched to form a third spacer 650 on the sidewall of the first bit line structure 595.

The first, second and third spacers 600, 630 and 650 sequentially stacked on the sidewall of the first bit line structure 595 may collectively form a preliminary spacer structure 660.

A sacrificial layer may be formed on the substrate 300 to fill the fifth opening 640, and may be planarized until the upper surface of the first capping pattern 585 is exposed to form a sacrificial pattern 680 in the fifth opening 640.

In example embodiments, the sacrificial pattern 680 may extend in the second direction D2, and a plurality of sacrificial patterns 680 may be spaced apart from each other in the first direction D1 by the first bit line structures 595. The sacrificial pattern 680 may include an oxide, e.g., silicon oxide.

Figure 28:
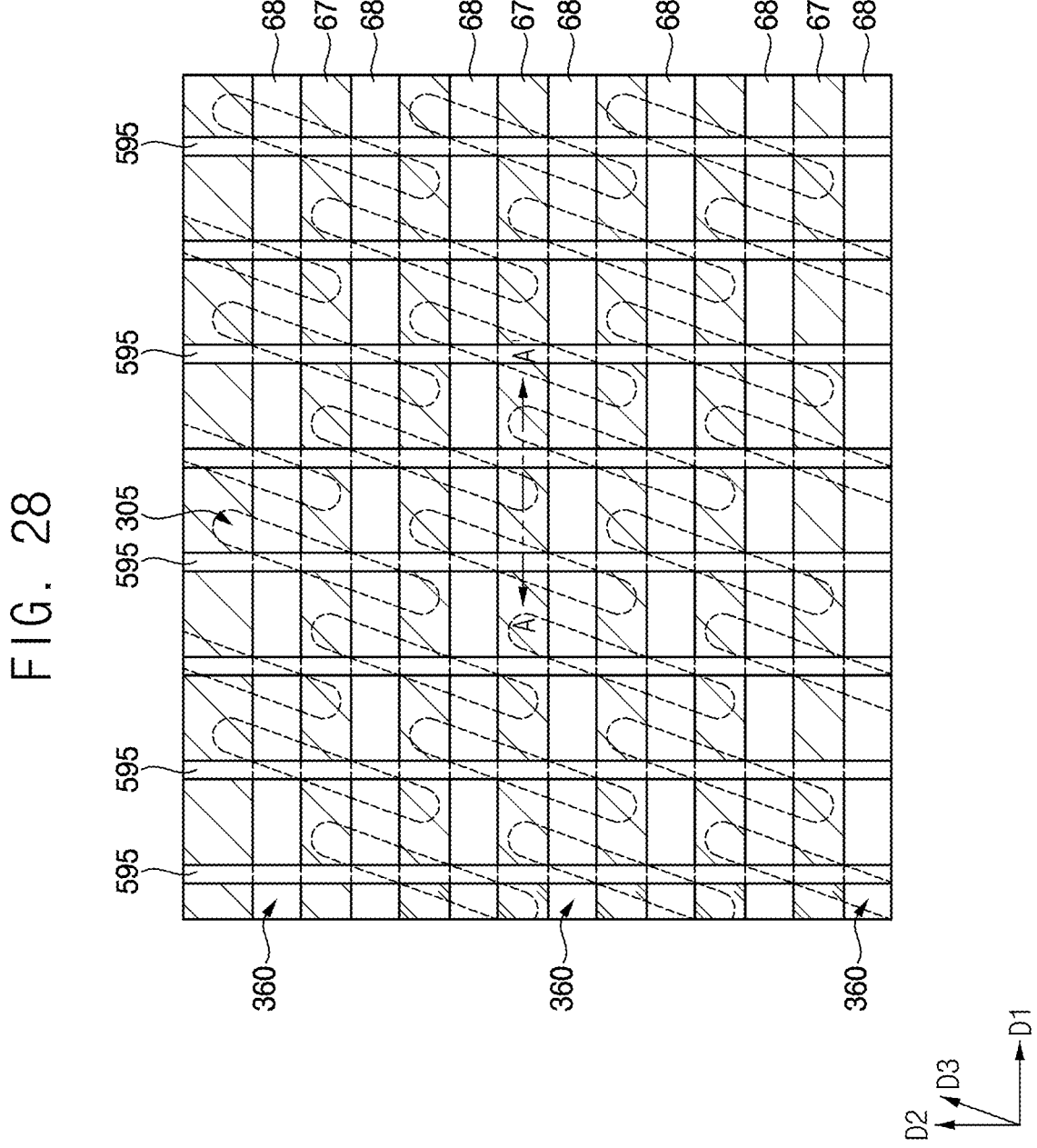
Figure 29:
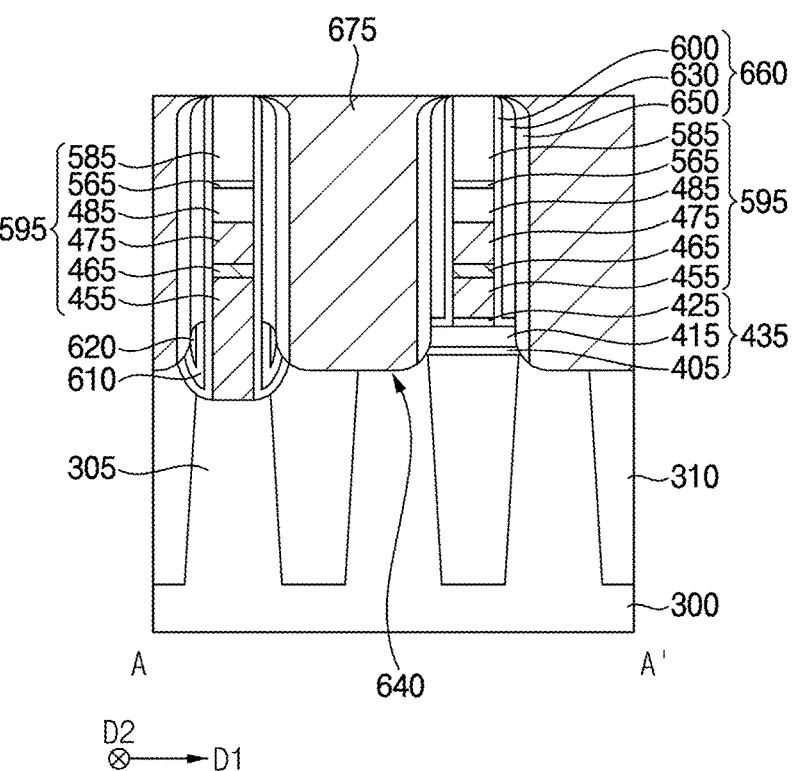

Referring to FIGS. 28 and 29, a third mask including a plurality of sixth openings, each of which may extend in the first direction D1, spaced apart from each other in the second direction D2 may be formed on the first capping pattern 585, the sacrificial pattern 680 and the preliminary spacer structure 660, and the sacrificial pattern 680 may be etched by an etching process using the third mask as an etching mask.

In example embodiments, each of the sixth openings may overlap in the vertical direction an area between the gate structures 360. By the etching process, a seventh opening exposing upper surfaces of the active pattern 305 and the isolation pattern 310 may be formed between the first bit line structures 595.

After removing the third mask, a lower contact plug layer may be formed to fill the seventh opening, and may be planarized until upper surfaces of the first capping pattern 585, the sacrificial pattern 680 and the preliminary spacer structure 660 are exposed. Thus, the lower contact plug layer may be divided into a plurality of lower contact plugs 675 spaced apart from each other in the second direction D2 between the first bit line structures 595. Additionally, the sacrificial pattern 680 extending in the second direction D2 between the first bit line structures 595 may be divided into a plurality of parts spaced apart from each other in the second direction D2 by the lower contact plugs 675.

The sacrificial pattern 680 may be removed to form an eighth opening, and a second capping pattern 685 may be formed in the eighth opening. In example embodiments, the second capping pattern 685 may overlap the gate structure 360 in the vertical direction.

Figure 30:
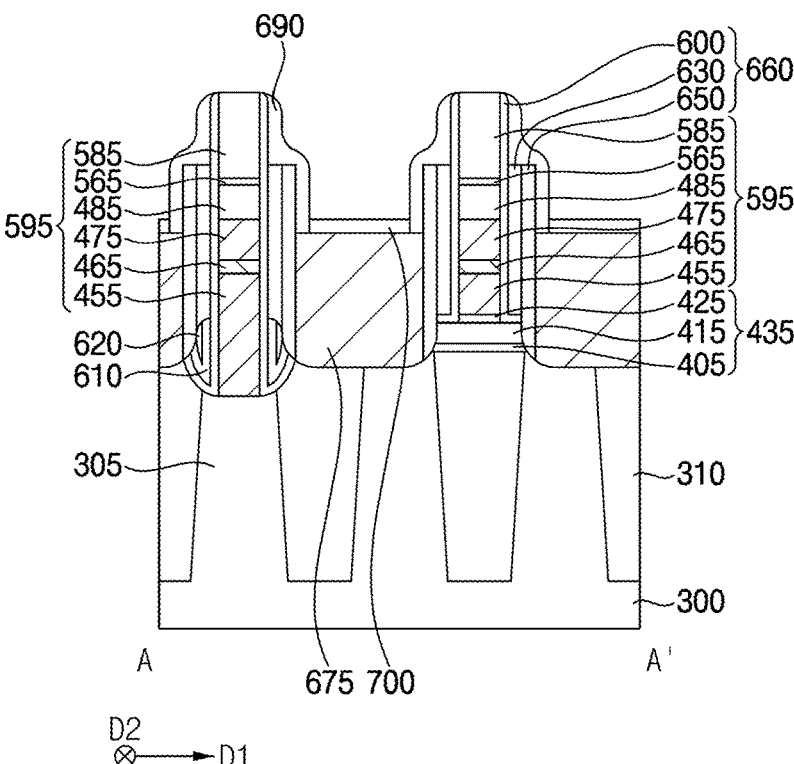

Referring to FIG. 30, an upper portion of the lower contact plug 675 may be removed to expose an upper portion of the preliminary spacer structure 660 on the sidewall of the first bit line structure 595, and upper portions of the second and third spacers 630 and 650 of the preliminary spacer structure 660 may be removed.

An upper portion of the lower contact plug 675 may be further removed. Thus, an upper surface of the lower contact plug 675 may be lower than upper surfaces of the second and third spacers 630 and 650.

A fourth spacer layer may be formed on the first bit line structure 595, the preliminary spacer structure 660, the second capping pattern 685 and the lower contact plug 675, and may be anisotropically etched to form a fourth spacer 690 covering an upper portion of the preliminary spacer structure 660 on each of opposite sidewalls in the first direction D1 of the first bit line structure 595, and thus an upper surface of the lower contact plug 675 may be exposed.

A metal silicide pattern 700 may be formed on the upper surface of the lower contact plug 675. In example embodiments, the metal silicide pattern 700 may be formed by forming a first metal layer on the first and second capping patterns 585 and 685, the fourth spacer 690 and the lower contact plug 675, performing a heat treatment process, and removing an unreacted portion of the first metal layer.

Figure 31:
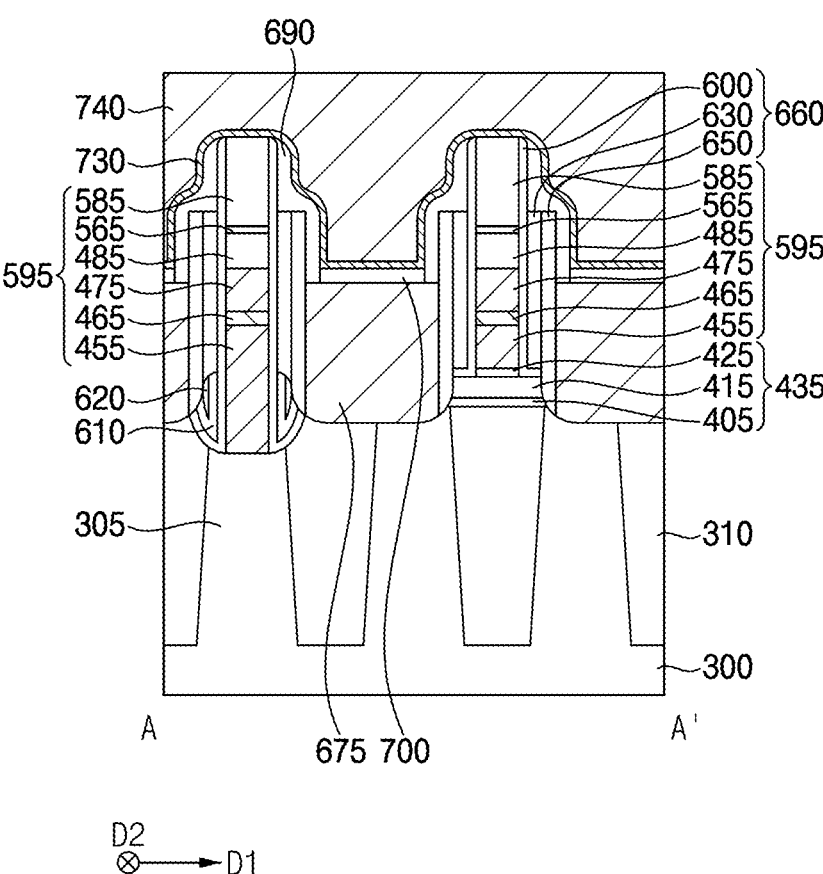

Referring to FIG. 31, a second barrier layer 730 may be formed on the first and second capping patterns 585 and 685, the fourth spacer 690, the metal silicide pattern 700 and the lower contact plug 675, and a second metal layer 740 may be formed on the second barrier layer 730 to fill a space between the first bit line structures 595.

A planarization process may be further performed on an upper portion of the second metal layer 740. The planarization process may include a CMP process and/or an etch back process.

Referring to FIGS. 32 and 33, the second metal layer 740 and the second barrier layer 730 may be patterned to form an upper contact plug 755, and a ninth opening 760 may be formed between the upper contact plugs 755.

The ninth opening 760 may be formed by partially removing the first and second capping patterns 585 and 685, the preliminary spacer structure 660 and the fourth spacer 690 as well as the second metal layer 740 and the second barrier layer 730.

The upper contact plug 755 may include a second metal pattern 745 and a second barrier pattern 735 covering a lower surface of the second metal pattern 745. In example embodiments, the upper contact plug 755 may have a shape of, e.g., a circle, an ellipse, a polygon, a polygon with rounded corners, etc., and may be arranged in a honeycomb pattern in the first and second directions D1 and D2.

The lower contact plug 675, the metal silicide pattern 700 and the upper contact plug 755 sequentially stacked may collectively form a contact plug structure.

Figure 34:
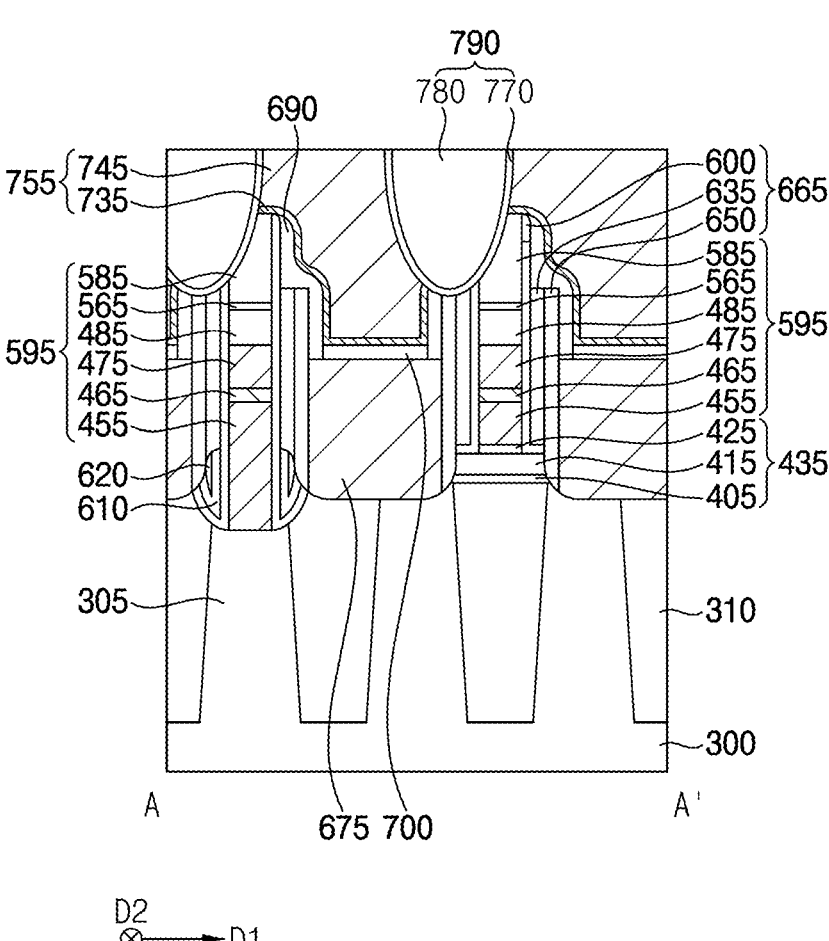

Referring to FIG. 34, the second spacer 630 included in the preliminary spacer structure 660 exposed by the ninth opening 760 may be removed to form an air gap, a tenth insulation pattern 770 may be formed on a bottom and a sidewall of the ninth opening 760, and an eleventh insulation pattern 780 may be formed to fill a remaining portion of the ninth opening 760.

The tenth and eleventh insulation patterns 770 and 780 may form a second insulation pattern structure 790.

A top of the air gap may be covered by the tenth insulation pattern 770, and thus an air spacer 635 may be formed. The first spacer 600, the air spacer 635 and the third spacer 650 may collectively form a spacer structure 665.

Referring to FIGS. 17 and 18 again, processes substantially the same as or similar to those illustrated with reference to FIGS. 1 to 9 may be performed to form the first capacitor 172, the first etch stop layer 30, the first and second support layers 50 and 98 and the upper electrode plate 180. The lower electrode 80 included in the first capacitor 172 may contact an upper surface of the upper contact plug 755.

Figure 35:
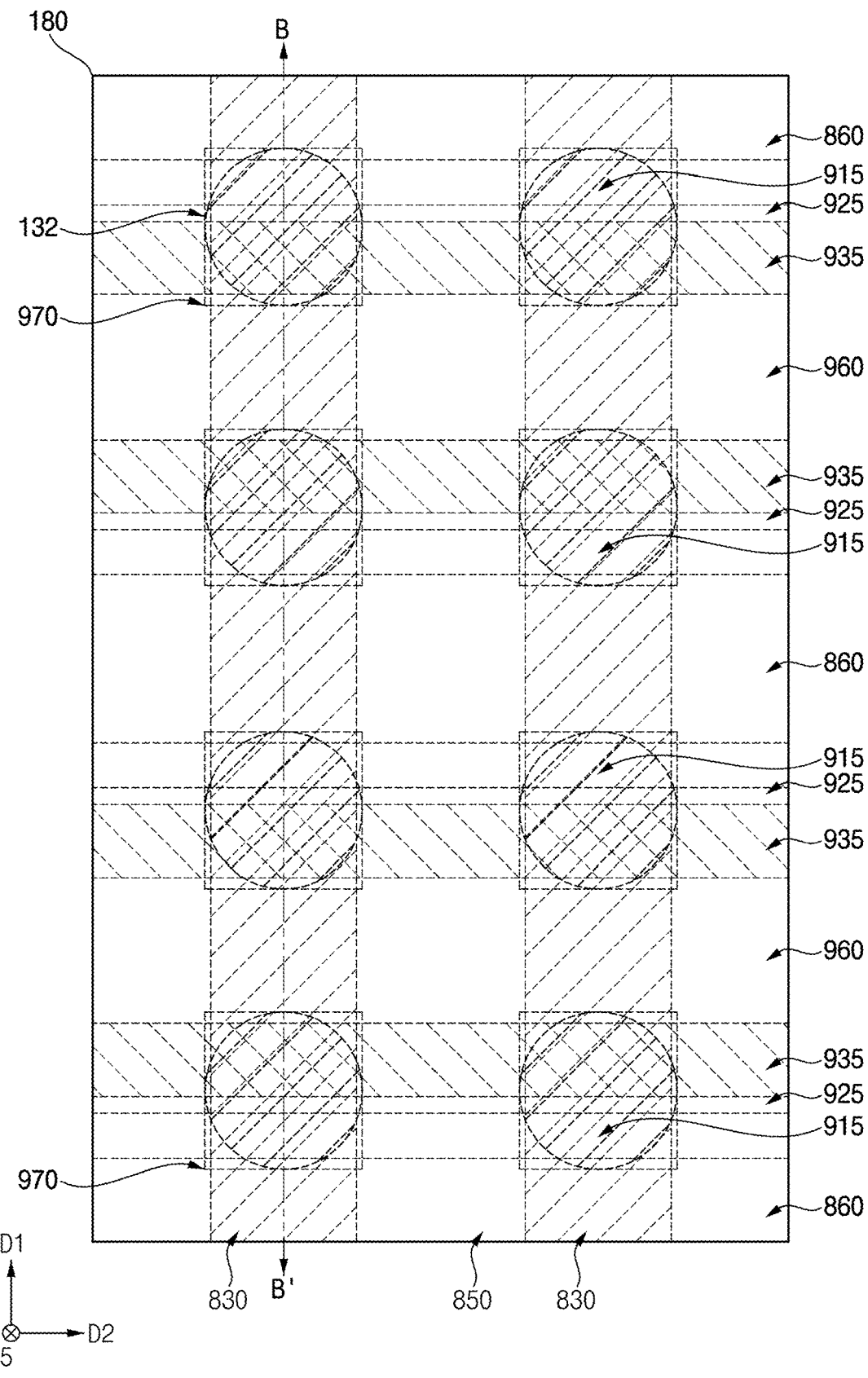
FIGS. 35 and 36 are a plan view and a cross-sectional view, respectively, illustrating a semiconductor device according to example embodiments.
Figure 36:
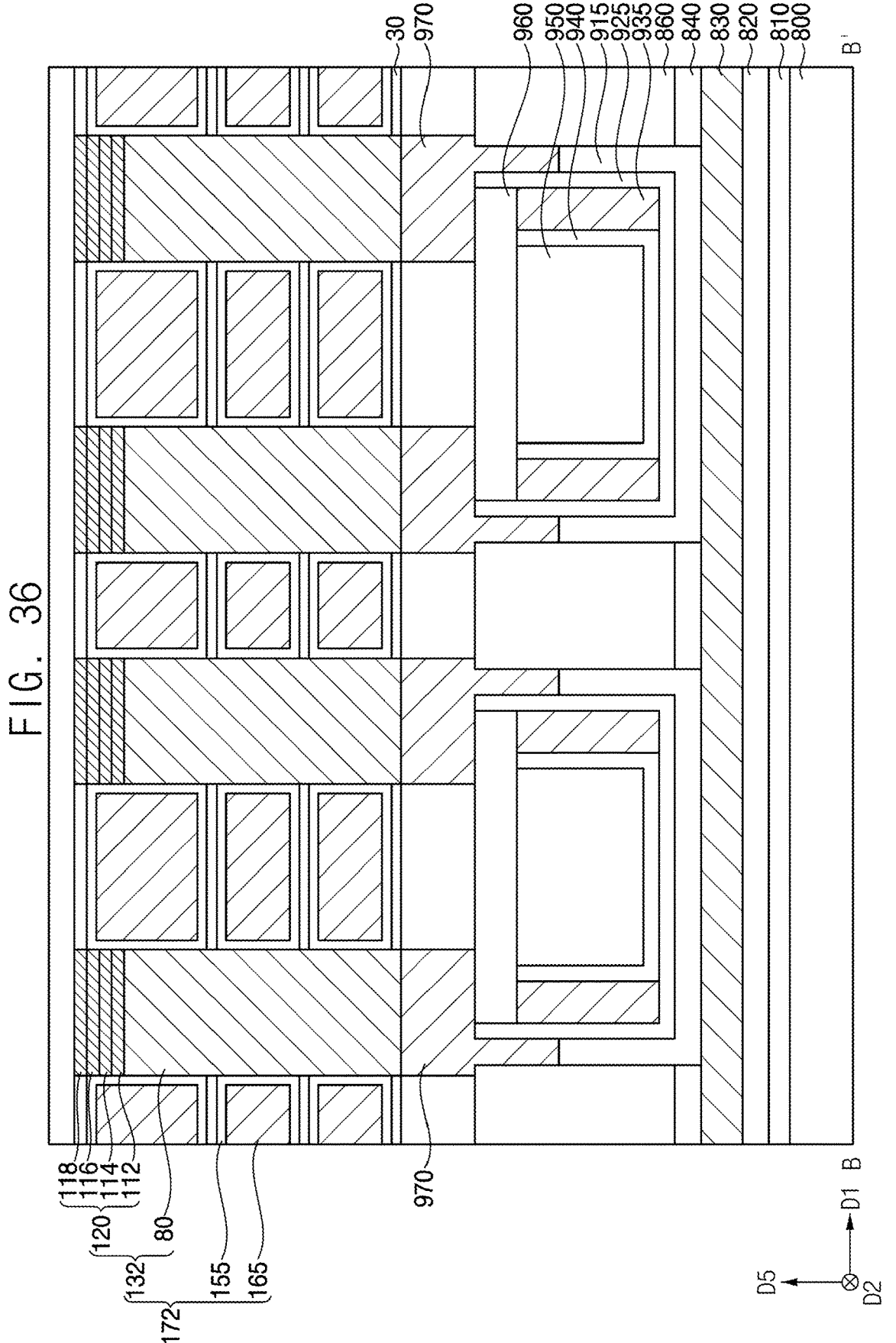

FIGS. 35 and 36 are a plan view and a cross-sectional view, respectively, illustrating a semiconductor device according to example embodiments. FIG. 36 is a cross-sectional view taken along line B-B' of FIG. 35.

This semiconductor device may be an application of the first capacitor structure illustrated with reference to FIG. 1 to a vertical channel transistor (VCT) DRAM device, and thus repeated explanations on the first capacitor structure are omitted herein. However, the semiconductor device may include one of the second, third and fourth capacitor structures illustrated with reference to FIGS. 12, 13 and 16, respectively, instead of the first capacitor structure.

Hereinafter, two directions among horizontal directions that are substantially parallel to an upper surface of a substrate 800, which may be substantially perpendicular to each other, may be referred to as first and second directions D1 and D2, and a direction substantially perpendicular to the upper surface of the substrate 800 may be referred to as a fifth direction D5.

Referring to FIGS. 35 and 36, the semiconductor device may include a second bit line structure, a second gate electrode 935, a second gate insulation pattern 925, a channel 915, a contact plug 970, and the first capacitor structure on a substrate 800. The semiconductor device may further include a twelfth insulation layer 810, fifteenth and sixteenth insulation patterns 940 and 960, and second to fifth insulating interlayer patterns 850, 860, 950 and 980. The substrate 800 may include, e.g., a semiconductor material, an insulation material or a conductive material.

Figure 37:
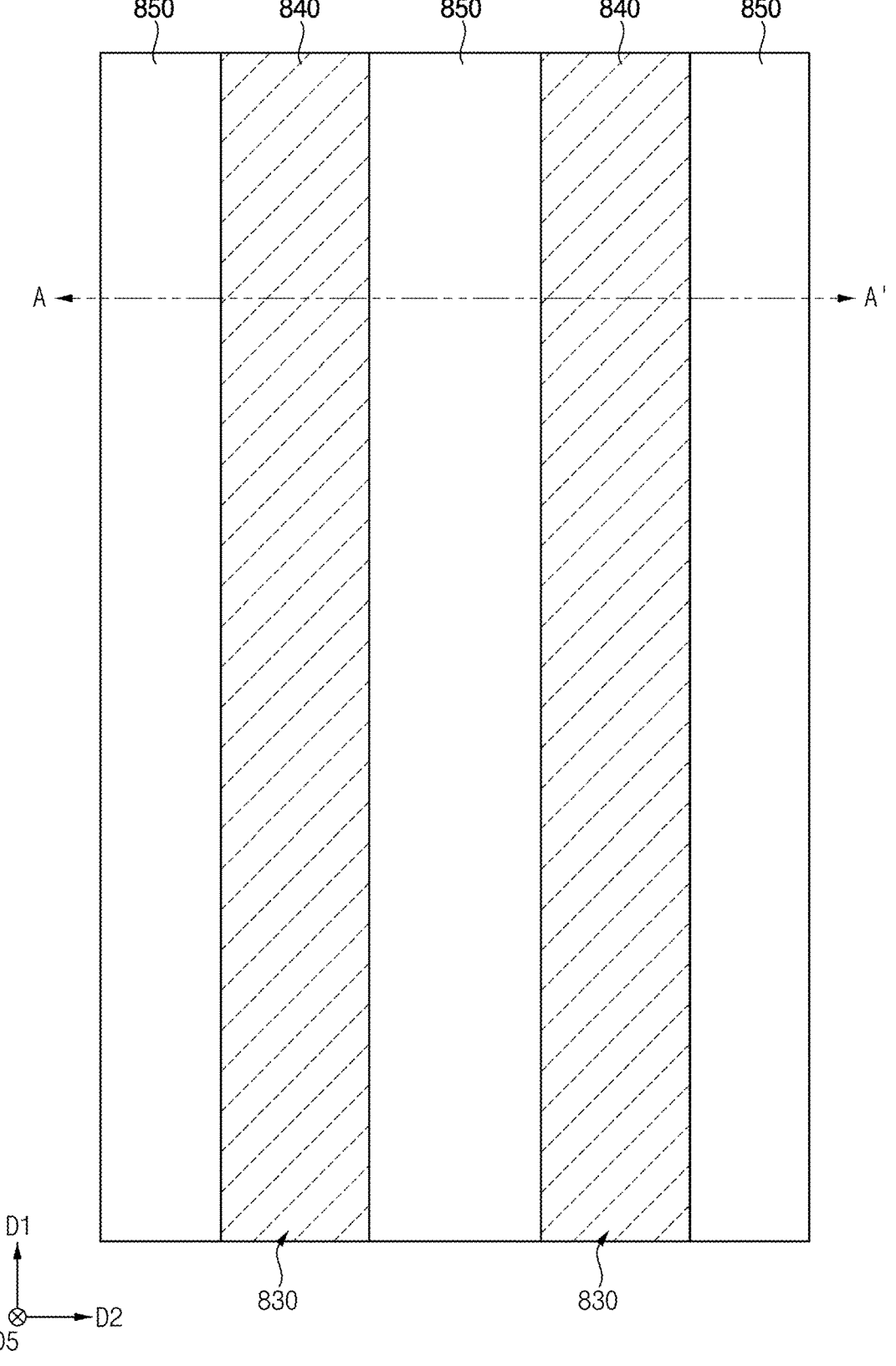
FIGS. 37 to 47 are plan views and cross-sectional views illustrating stages in a method of manufacturing a semiconductor device in accordance with example embodiments.
Figure 38:
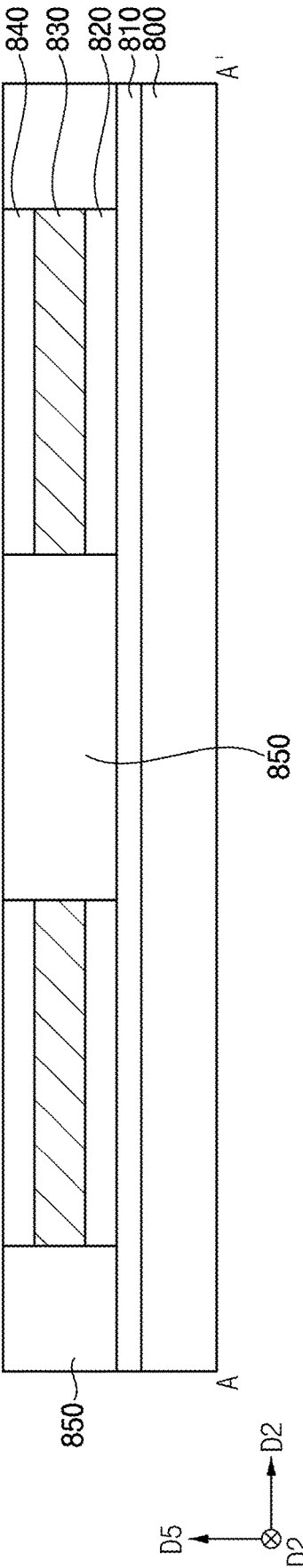

Referring to FIGS. 35 and 36 together with FIGS. 37 and 38, the twelfth insulation layer 810 may be formed on the substrate 800, and the second bit line structure may extend in the first direction D1 on the twelfth insulation layer 810.

In example embodiments, the second bit line structure may include a thirteenth insulation pattern 820, a second bit line 830 and a fourteenth insulation pattern 840 sequentially stacked on the twelfth insulation layer 810. Each of the thirteenth insulation pattern 820 and the second bit line 830 may extend in the first direction D1, and a plurality of fourteenth insulation patterns 840 may be spaced apart from each other in the first direction D1 on the second bit line 830.

In example embodiments, a plurality of second bit line structures may be spaced apart from each other in the second direction D2, and the second insulating interlayer pattern 850 may extend in the first direction D1 on the twelfth insulation layer 810 between neighboring ones of the second bit line structures in the second direction D2.

An upper surface of a portion of the second insulating interlayer pattern 850 adjacent to the fourteenth insulating interlayer pattern 840 in the second direction D2 may be substantially coplanar with an upper surface of the fourteenth insulating interlayer pattern 840, and an upper surface of a portion of the second insulating interlayer pattern 850 not adjacent to the fourteenth insulating interlayer pattern 840 in the second direction D2 may be substantially coplanar with an upper surface of the second bit line 830. That is, an upper surface of the second insulating interlayer pattern 850 may change periodically in the first direction D1.

Each of the twelfth insulation layer 810 and the second insulating interlayer pattern 850 may include an oxide, e.g., silicon oxide, the second bit line 830 may include a conductive material, e.g., a metal, a metal nitride, a metal silicide, and each of the thirteenth and fourteenth insulation patterns 820 and 840 may include an insulating nitride, e.g., silicon nitride.

The third insulating interlayer pattern 860 extending in the second direction D2 may be formed on the fourteenth insulation pattern 840 and the second insulating interlayer pattern 850. The third insulating interlayer pattern 860 may include an oxide, e.g., silicon oxide. Hereinafter, the third insulating interlayer pattern 860, the fourteenth insulation pattern 840, and an upper portion of the second insulating interlayer pattern 850 at the same height as the fourteenth insulation pattern 840 may be collectively referred to as a bar structure. In example embodiments, the bar structure may extend in the second direction D2, and a plurality of bar structures may be spaced apart from each other in the first direction D1.

The channel 915 may be formed between the bar structures, and a plurality of channels 915 may be spaced apart from each other in the second direction D2 on the second bit line 830 and the second insulating interlayer pattern 850. A seventeenth insulation pattern 500 may be formed between neighboring ones of the channels 915 in the second direction D2. The seventeenth insulation pattern 500 may include an oxide, e.g., silicon oxide, or an insulating nitride, e.g., silicon nitride.

Additionally, a plurality of channels 915 may be spaced apart from each other in the first direction D1 on the second bit line 830 extending in the first direction D1. For example, as illustrated in FIG. 35, a width in the second direction D2 of the channel 915 is substantially equal to a width in the second direction D2 of the second bit line 830.

In example embodiments, the channel 915 may be formed on an upper surface of the second bit line 830, an upper surface of the second insulating interlayer pattern 850 and a sidewall of the bar structure, and may have a constant thickness. Thus, a cross-section of the channel 915 in the first direction D1 may have a cup shape.

In example embodiments, the channel 915 may include a oxide semiconductor material. The oxide semiconductor material may include at least one of zinc tin oxide (ZTO), indium zinc oxide (IZO), zinc oxide ($ZnO_x$), indium gallium zinc oxide (IGZO), indium gallium silicon oxide (IGSO), Indium oxide ($InO_x$, $In_2O_3$), tin oxide ($SnO_2$), titanium oxide ($TiO_x$), zinc oxide nitride ($Zn_xO_yN_z$), magnesium zinc oxide ($Mg_xZn_yO_z$), indium zinc oxide ($In_xZn_yO_a$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), and indium gallium silicon oxide (InGaSiO).

In example embodiments, the channel 915 may include an oxide semiconductor material in an amorphous phase. In example embodiments, an upper surface of the channel 915 may be lower than an upper surface of the bar structure.

The fourth insulating interlayer pattern 950 may extend in the second direction D2 on a portion of the channel 915 on the second bit line 830 and the second insulating interlayer pattern 850 between the bar structures, and a lower surface and a sidewall of the fourth insulating interlayer pattern 950 may be covered by the fifteenth insulation pattern 940. A cross-section of the fifteenth insulation pattern 940 in the first direction D1 may have a cup shape, and may contact an upper surface of a portion of the channel 915 on the second bit line 830 and the second insulating interlayer pattern 850.

The fourth insulating interlayer pattern 950 may include an oxide, e.g., silicon oxide, and the fifteenth insulation pattern 940 may include an insulating nitride, e.g., silicon oxide.

The second gate insulation pattern 925 and the second gate electrode 935 may be formed between a portion of the channel 915 on a sidewall of the bar structure and the fifteenth insulation pattern 940. The second gate electrode 935 may extend in the second direction D2, and may contact an outer sidewall of the fifteenth insulation pattern 940. An upper surface of the second gate electrode 935 may be substantially coplanar with upper surfaces of the fourth insulating interlayer pattern 950 and the fifteenth insulation pattern 940. The second gate electrode 935 may include a conductive material, e.g., a metal, a metal nitride, a metal silicide, etc.

The second gate insulation pattern 925 may extend in the second direction D2, and may contact a lower surface and an outer sidewall of the second gate electrode 935. Additionally, the second gate insulation pattern 925 may contact a portion of the channel 915 on the sidewall of the bar structure, an inner sidewall of a lower portion of the contact plug 970 on the channel 915, and an upper surface of a portion of the channel 915 on the upper surfaces of the second bit line 830 and the second insulating interlayer pattern 850. Thus, a cross-section of the second gate insulation pattern 925 in the first direction D1 may have an "L" shape. The second gate insulation pattern 925 may include a metal oxide, e.g., aluminum oxide, hafnium oxide, zirconium oxide, etc., or silicon oxide.

The sixteenth insulation pattern 960 may be formed on the fourth insulating interlayer pattern 950, the fifteenth insulation pattern 940 and the second gate electrode 935, and may extend in the second direction D2. The sixteenth insulation pattern 960 may contact upper surfaces of the fourth insulating interlayer pattern 950, the fifteenth insulation pattern 940 and the second gate electrode 935 and an upper inner sidewall of the second gate insulation pattern 925.

In example embodiments, an upper surface of the sixteenth insulation pattern 960 may be substantially coplanar with an upper surface of the second gate insulation pattern 925. The sixteenth insulation pattern 960 may include an insulating nitride, e.g., silicon nitride.

The contact plug 970 may contact an upper surface of the channel 915 at each of areas where the second bit lines 830 and the second gate electrodes 935 cross each other in the fifth direction D5. The contact plug 970 may contact upper surfaces of the second gate insulation pattern 925, the third insulating interlayer pattern 860 and the sixteenth insulation pattern 960 adjacent to the channel 915, and may be spaced apart from an upper surface of the second gate electrode 935 by the sixteenth insulation pattern 960.

In example embodiments, the contact plug 970 may include a lower portion having a first width and an upper portion having a second width greater than the first width. The lower portion of the contact plug 970 may contact an upper surface of the channel 915 and upper sidewalls of the second gate insulation pattern 925 and the third insulating interlayer pattern 860, and a lower surface of the lower portion of the contact plug 970 may be lower than the upper surface of the second gate electrode 935.

In example embodiments, a plurality of contact plugs 970 may be spaced apart from each other in the first and second directions D1 and D2, and may be arranged in a lattice pattern or a honeycomb pattern in a plan view. The contact plug 970 may include a conductive material, e.g., a metal, a metal nitride, a metal silicide, etc.

The fifth insulating interlayer pattern 980 may be formed on the third insulating interlayer pattern 860, the channel 915, the second gate insulation pattern 925 and the sixteenth insulation pattern 960, and may cover a sidewall of the contact plug 970. The fifth insulating interlayer pattern 980 may include an oxide, e.g., silicon oxide.

The first lower electrode structure 132 included in the first capacitor 172 may contact an upper surface of the contact plug 970. As the contact plugs 970 are spaced apart from each other in the first and second directions D1 and D2, the first lower electrode structures 132 may be spaced apart from each other in the first and second directions D1 and D2.

In the semiconductor device, current may flow in the fifth direction D5, that is, in the vertical direction in the channel 915 between the second bit line 830 and the contact plug 970, and thus the semiconductor device may include a VCT having a vertical channel.

FIGS. 37 to 47 are plan views and cross-sectional views illustrating stages a method of manufacturing a semiconductor device in accordance with example embodiments. Particularly, FIGS. 37, 39, 42, 44 and 46 are the plan views, and FIG. 38 is a cross-sectional view taken along line A-A' of FIG. 37, and FIGS. 40-41, 43, 45 and 47 are cross-sectional views taken along lines B-B' of corresponding plan views, respectively. This method may be an application of the method of forming the first capacitor structure to a VCD DRAM device, and thus repeated explanations on the formation of the first capacitor structure are omitted herein.

Referring to FIGS. 37 and 38, a twelfth insulation layer 810, a thirteenth insulation layer, a second bit line layer and a fourteenth insulation layer may be sequentially stacked on a substrate 800, and the fourteenth insulation layer, the second bit line layer and the thirteenth insulation layer may be patterned to form a fourteenth insulation pattern 840, a second bit line 830 and a thirteenth insulation pattern 820, respectively.

The thirteenth insulation pattern 820, the second bit line 830 and the fourteenth insulation pattern 840 sequentially stacked on the substrate 800 may be referred to as a second bit line structure. In example embodiments, the second bit line structure may extend in the first direction D1 on the substrate 800, and a plurality of second bit line structures may be spaced apart from each other in the second direction D2. Thus, a tenth opening may be formed between neighboring ones of the second bit line structures in the second direction D2 to expose an upper surface of the twelfth insulation layer 810.

A second insulating interlayer may be formed on the second bit line structures and the twelfth insulation layer 810 to fill the tenth opening, and an upper portion of the second insulating interlayer may be planarized until upper surfaces of the second bit line structures are exposed. Thus, a second insulating interlayer pattern 850 extending in the first direction D1 may be formed between the second bit line structures. In example embodiments, the planarization process may include a chemical mechanical polishing (CMP) process and/or an etch back process.

Figure 39:
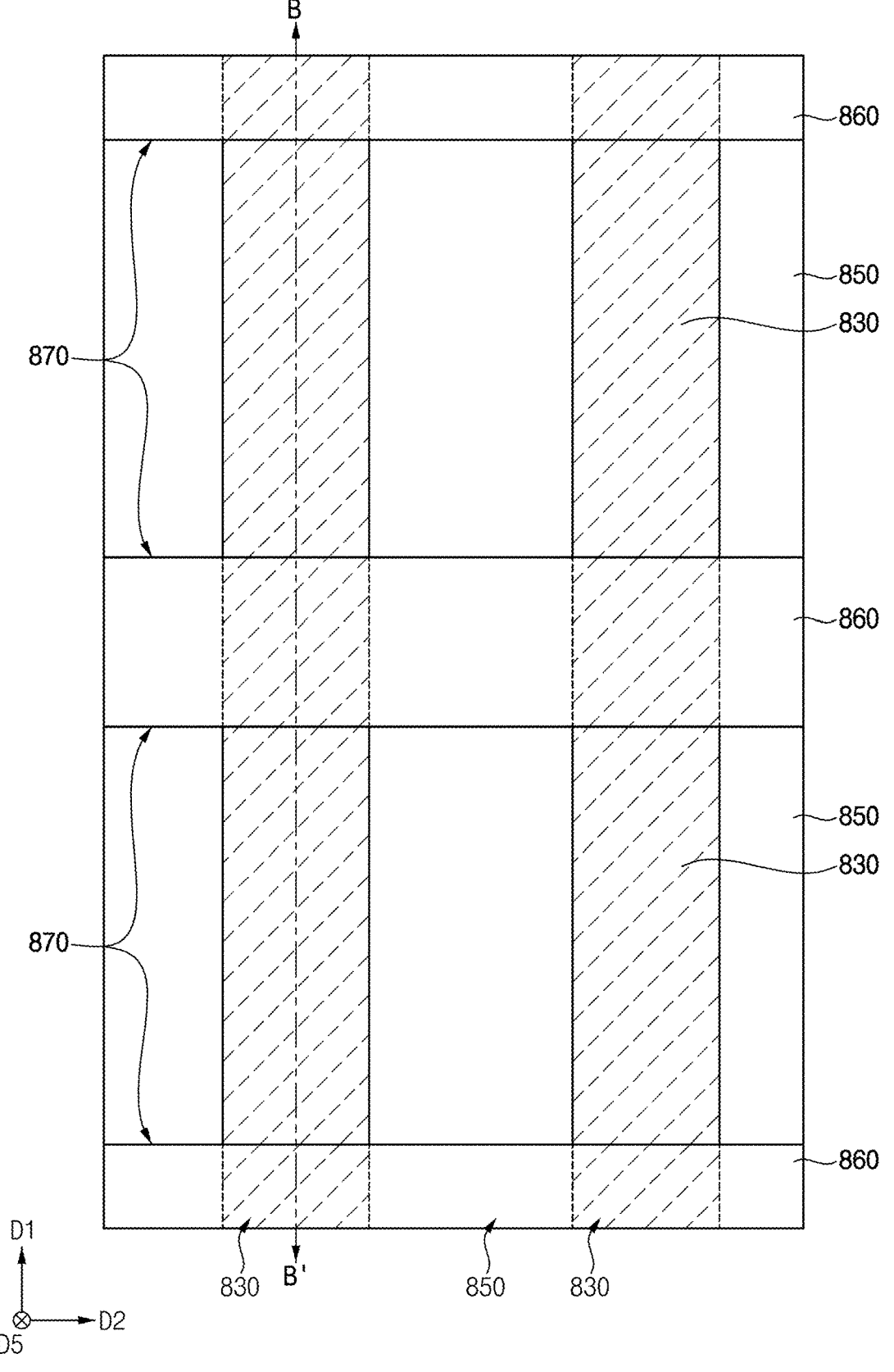
Figure 40:
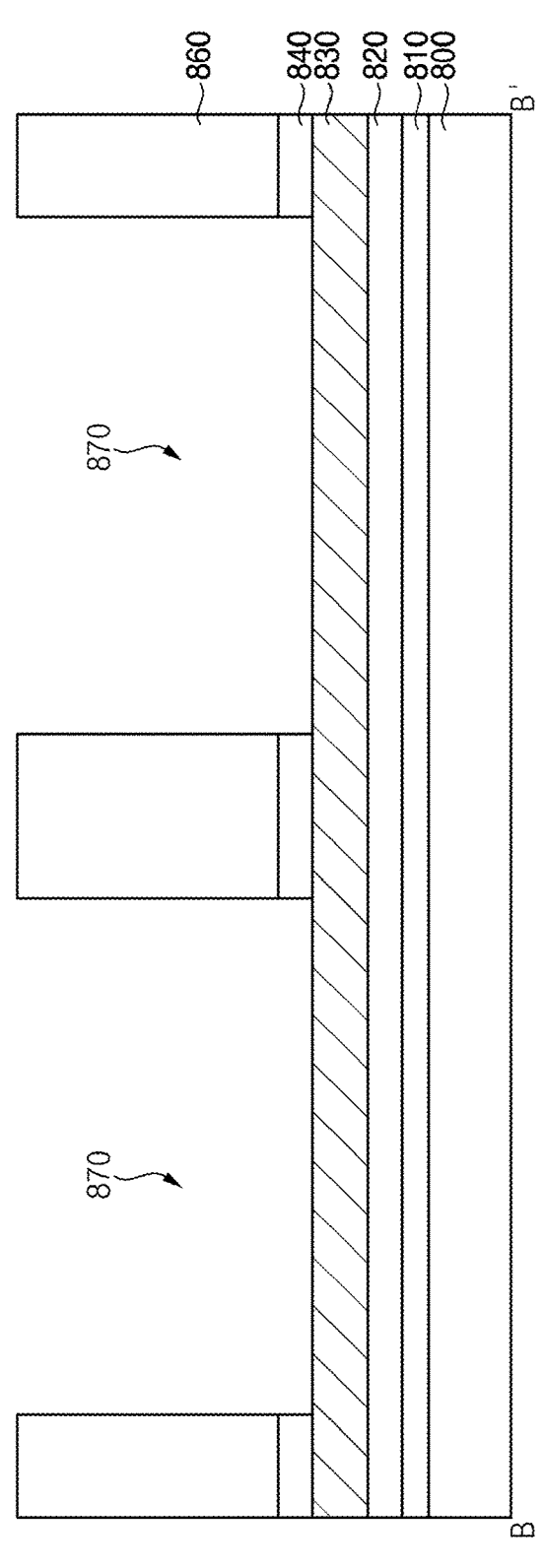
Figure 40:
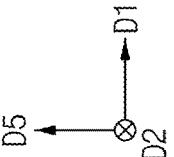

Referring to FIGS. 39 and 40, a third insulating interlayer may be formed on the second bit line structures and the second insulating interlayer patterns 850, and the third insulating interlayer and the fourteenth insulation pattern 840 may be partially removed by, e.g., a dry etching process to form an eleventh opening 870 extending in the second direction D2 and exposing upper surfaces of the second bit line 830 and the second insulating interlayer pattern 850.

Thus, the third insulating interlayer may be divided into a plurality of third insulating interlayer patterns 860, each of which may extend in the second direction D2, spaced apart from each other in the first direction D1.

Figure 41:
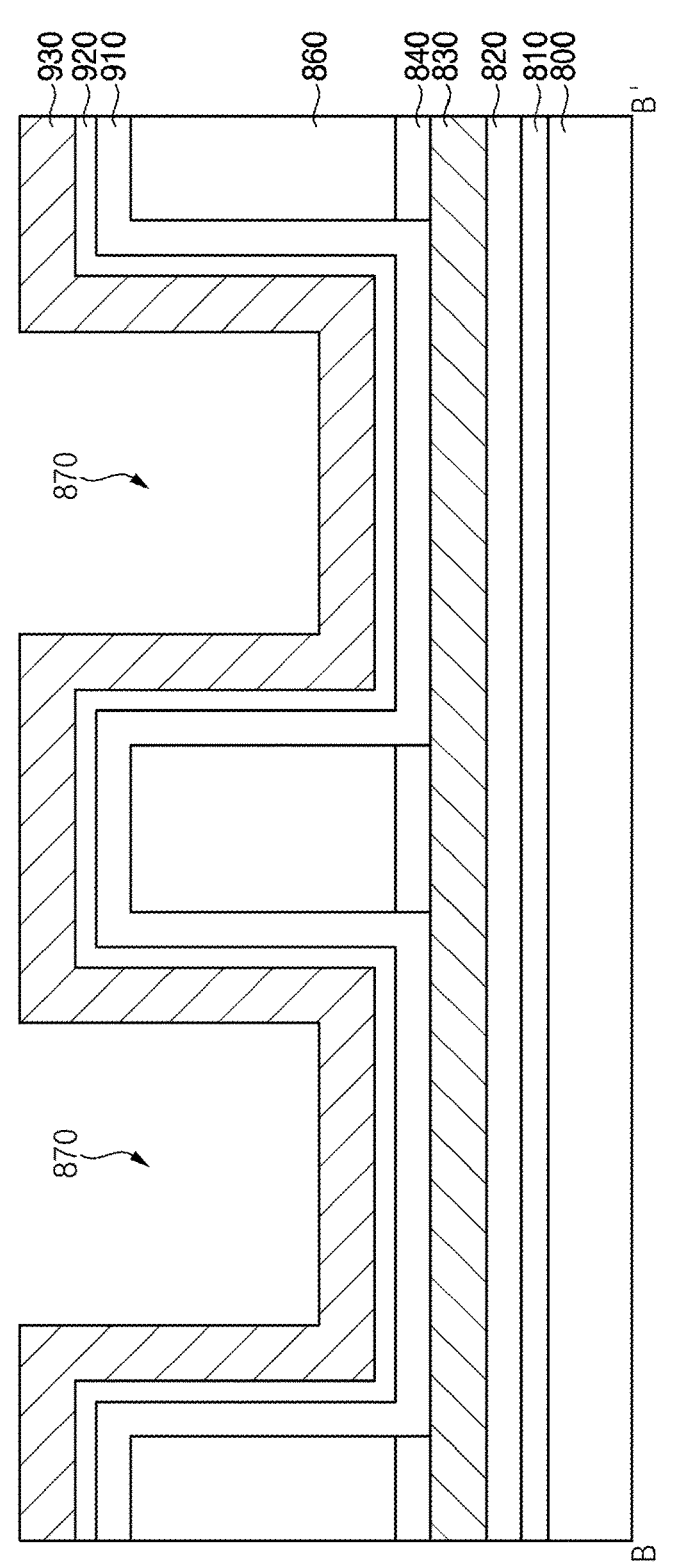
Figure 41:
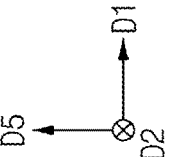

Referring to FIG. 41, a channel layer 910, a second gate insulation layer 920 and a second gate electrode layer 930 may be sequentially formed on the upper surfaces of the second bit line 830 and the second insulating interlayer pattern 850 exposed by the eleventh opening 870 and a sidewall and an upper surface of the third insulating interlayer pattern 860.

In example embodiments, the channel layer 910, the gate insulation layer 920 and the second gate electrode layer 930 may be formed by a deposition process, e.g., an ALD process, a CVD process, etc., at a relatively low temperature, and may include an amorphous oxide semiconductor.

In example embodiments, the channel layer 910 may include an oxide semiconductor material, e.g., IGZO, and may be formed at a relatively low temperature. The second gate insulation layer 920 and the second gate electrode layer 930 may be formed at a relatively high temperature.

Figure 42:
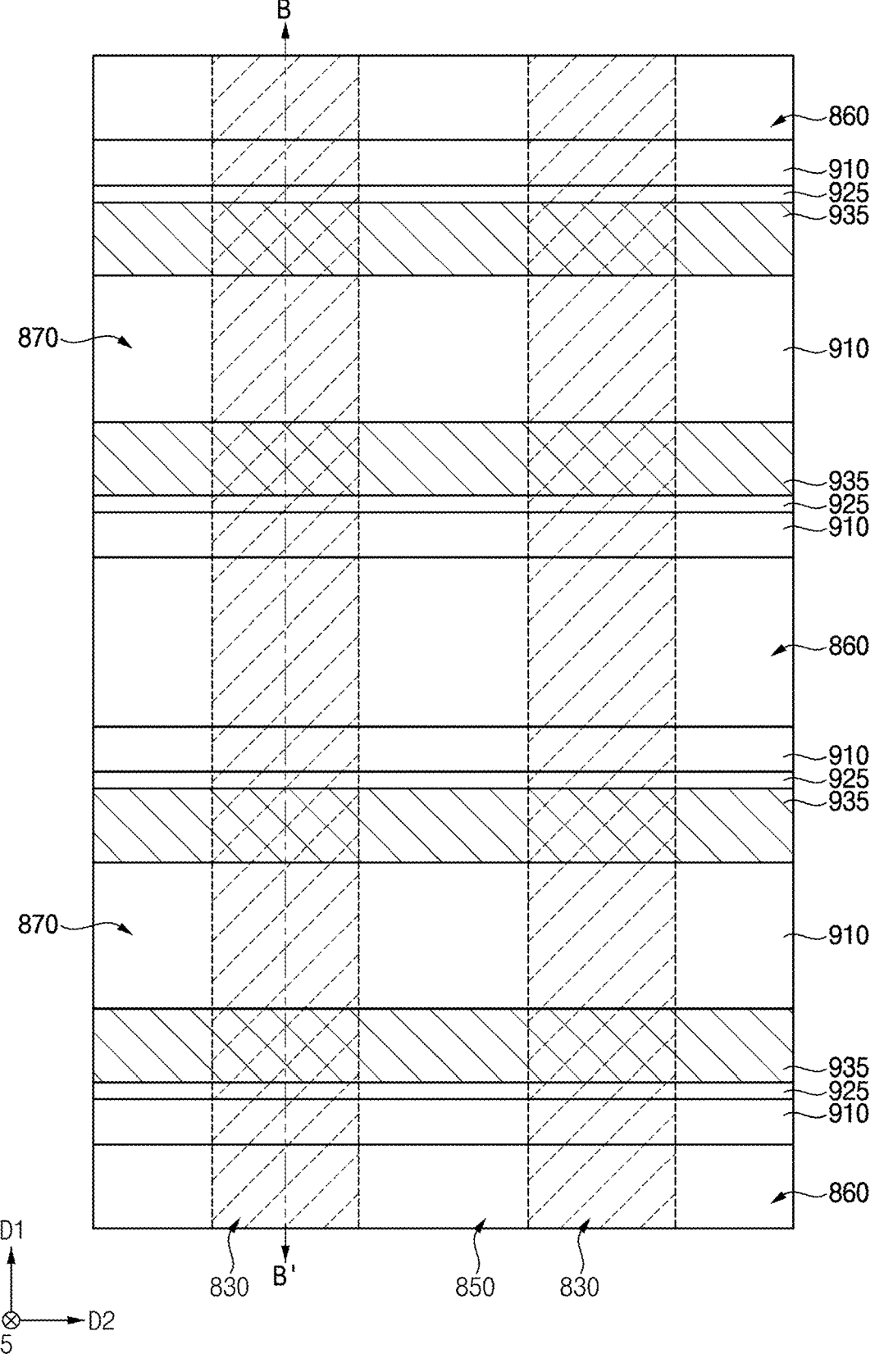
Figure 43:
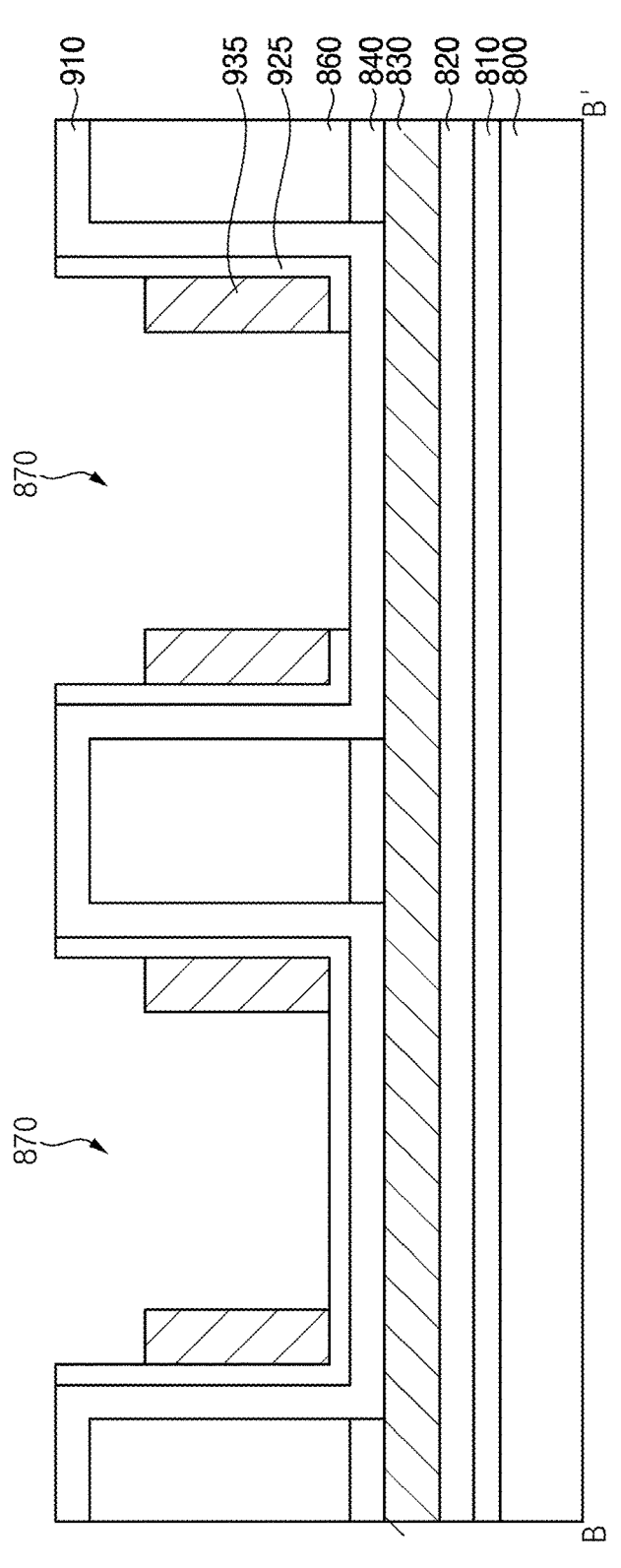
Figure 43:
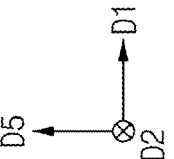

Referring to FIGS. 42 and 43, the second gate electrode layer 930 and the second gate insulation layer 920 may be anisotropically etched to form a second gate electrode 935 and a second gate insulation pattern 925, respectively, on a sidewall of the eleventh opening 870.

The second gate insulation pattern 925 may contact an inner sidewall of the channel layer 910 and an upper surface of an edge portion in the first direction D1 of the channel layer 910. In example embodiments, a cross-section in the first direction D1 of the second gate insulation pattern 925 may have an "L" shape.

The second gate electrode 935 may contact an inner sidewall of the second gate insulation pattern 925 and a portion of the second gate insulation pattern 925 on the edge portion of the channel layer 910.

An upper portion of the second gate electrode 935 may be removed by, e.g., an etch back process. Thus, the upper surface of the second gate electrode 935 may be lower than the upper surface of the second gate insulation pattern 925, and an upper inner sidewall of the second gate insulation pattern 925 may be exposed. In example embodiments, the upper surface of the second gate electrode 935 may be lower than the upper surface of the third insulating interlayer pattern 860.

Figure 44:
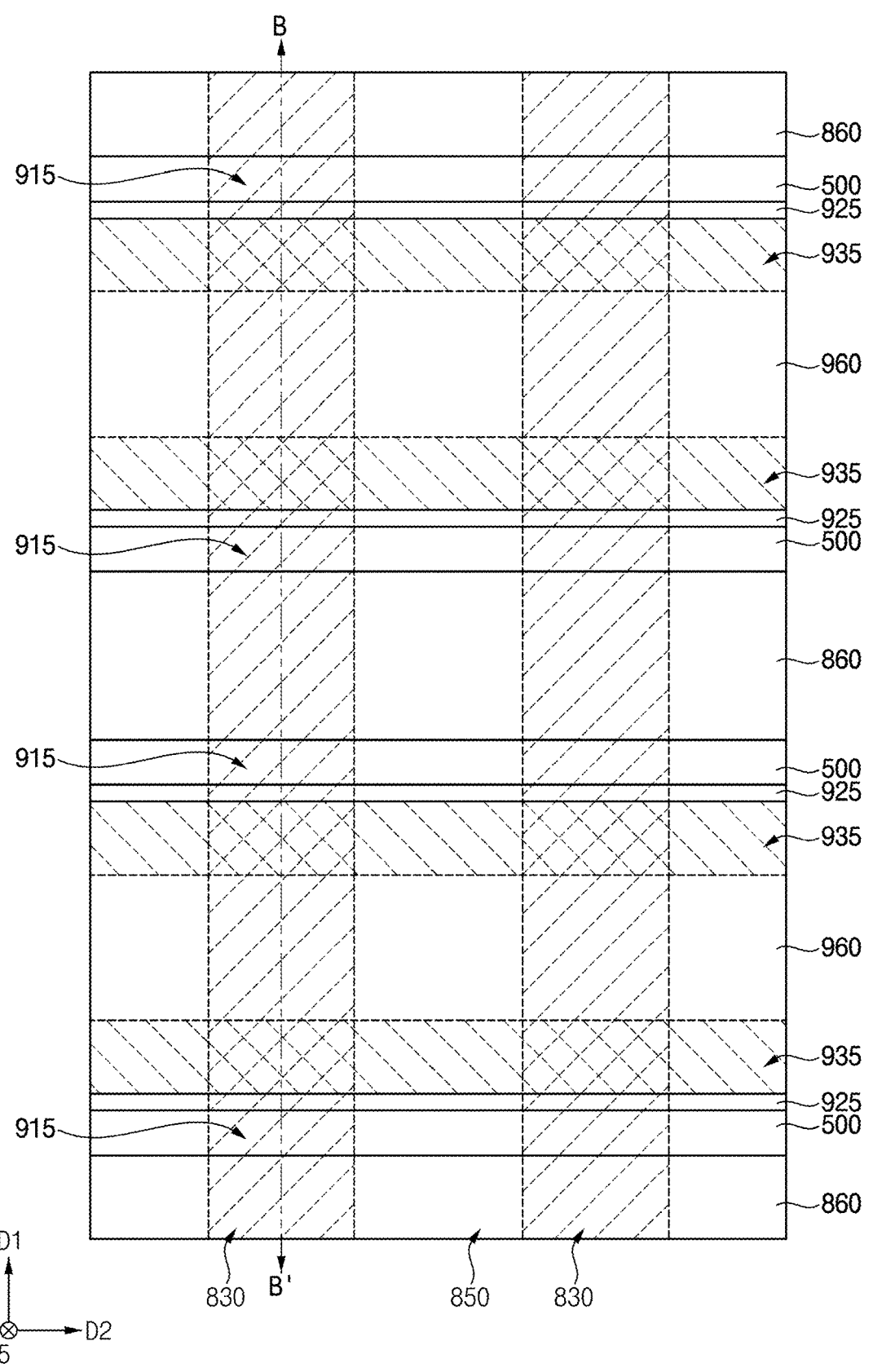
Figure 45:
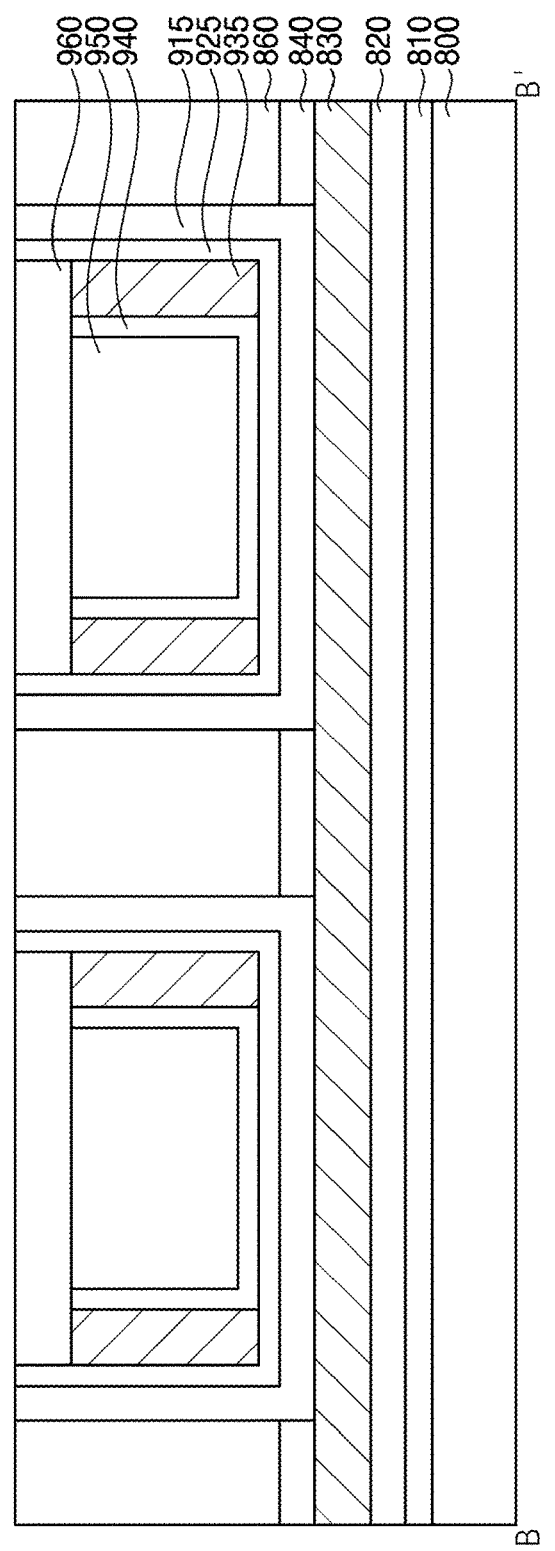
Figure 45:
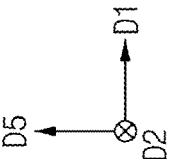

Referring to FIGS. 44 and 45, a fifteenth insulation layer may be formed on an inner sidewall and the upper surface of the second gate electrode 935, the upper inner sidewall and the upper surface of the second gate insulation pattern 925, and an upper surface of the channel layer 910, a fourth insulating interlayer may be formed on the fifteenth insulation layer to fill a remaining portion of the eleventh opening 870, and a planarization process may be performed on the fourth insulating interlayer, the fifteenth insulation layer, the second gate insulation pattern 925 and the channel layer 910 until the upper surface of the third insulating interlayer pattern 860 is exposed. The planarization process may include, e.g., a CMP process and/r an etch back process.

As the planarization process is performed, a fourth insulating interlayer pattern 950 and a fifteenth insulation pattern 940 covering a lower surface and a sidewall of the fourth insulating interlayer pattern 950 may be formed in the eleventh opening 870, and the channel layer 910 may be divided into a plurality of channels 915 spaced apart from each other in the first direction D1. In example embodiments, each of the channels 915 may extend in the second direction D2, and a cross-section in the first direction D1 of each of the channels 915 may have a cup shape.

Upper portions of the fourth insulating interlayer pattern 950 and the fifteenth insulation pattern 940 may be removed to form a third recess exposing the upper surface of the second gate electrode 935, and a sixteenth insulation pattern 960 may be formed in the third recess.

The sixteenth insulating interlayer pattern 960 may be formed by forming a sixteenth insulation layer on the second gate electrode 935, the fourth insulating interlayer pattern 950, the fifteenth insulation pattern 940, the second gate insulation pattern 925, the channel 915 and the third insulating interlayer pattern 860 to fill the third recess, and planarizing the sixteenth insulation layer until the upper surface of the third insulating interlayer pattern 860 is exposed.

The channel 915 may be partially removed to form a twelfth opening exposing an upper surface of the second bit line 830, and a seventeenth insulation pattern 500 may be formed in the twelfth opening. Thus, the channel 915 extending in the second direction D2 may be divided into a plurality of parts spaced apart from each other in the second direction D2.

Figure 46:
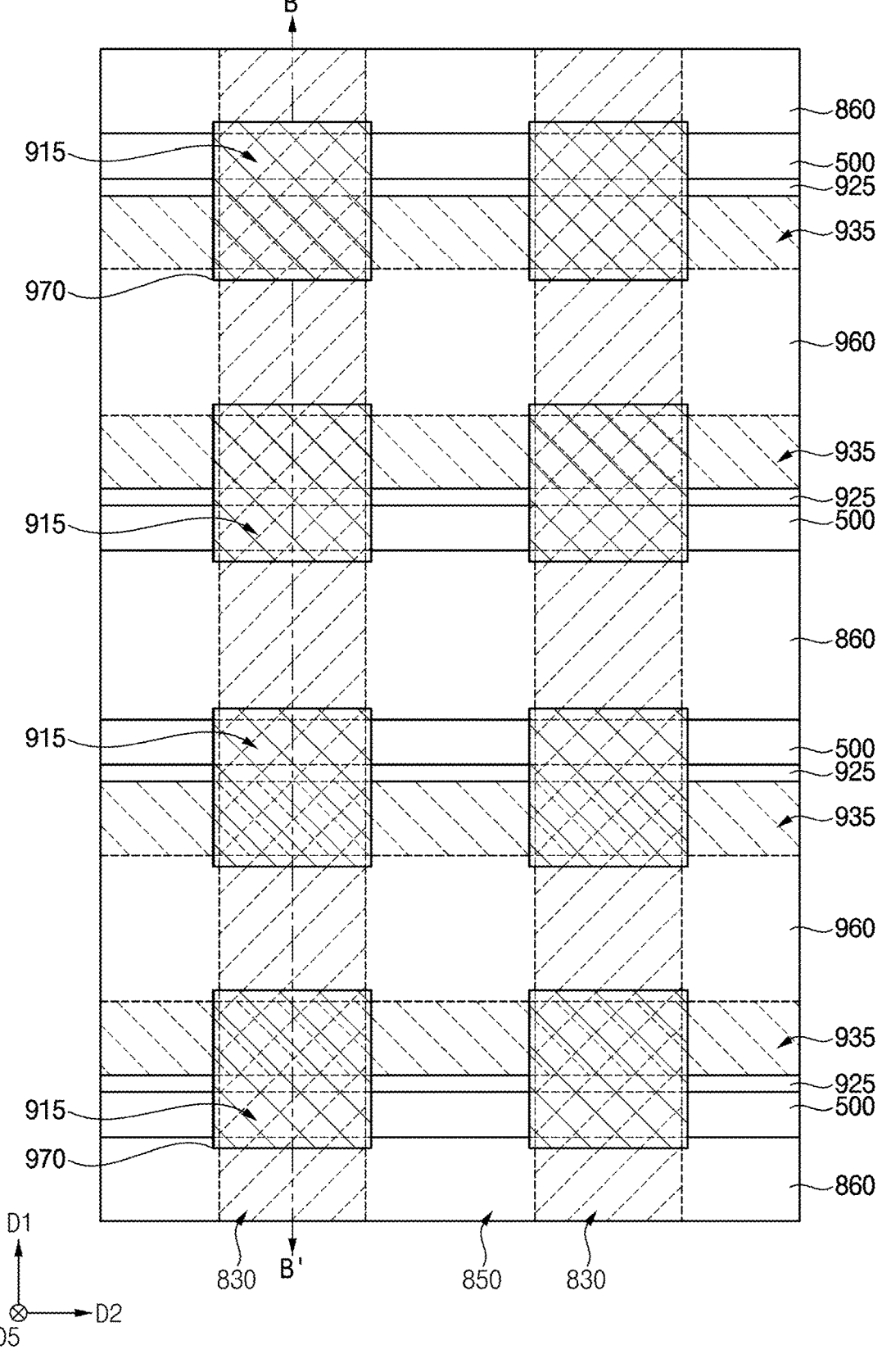
Figure 47:
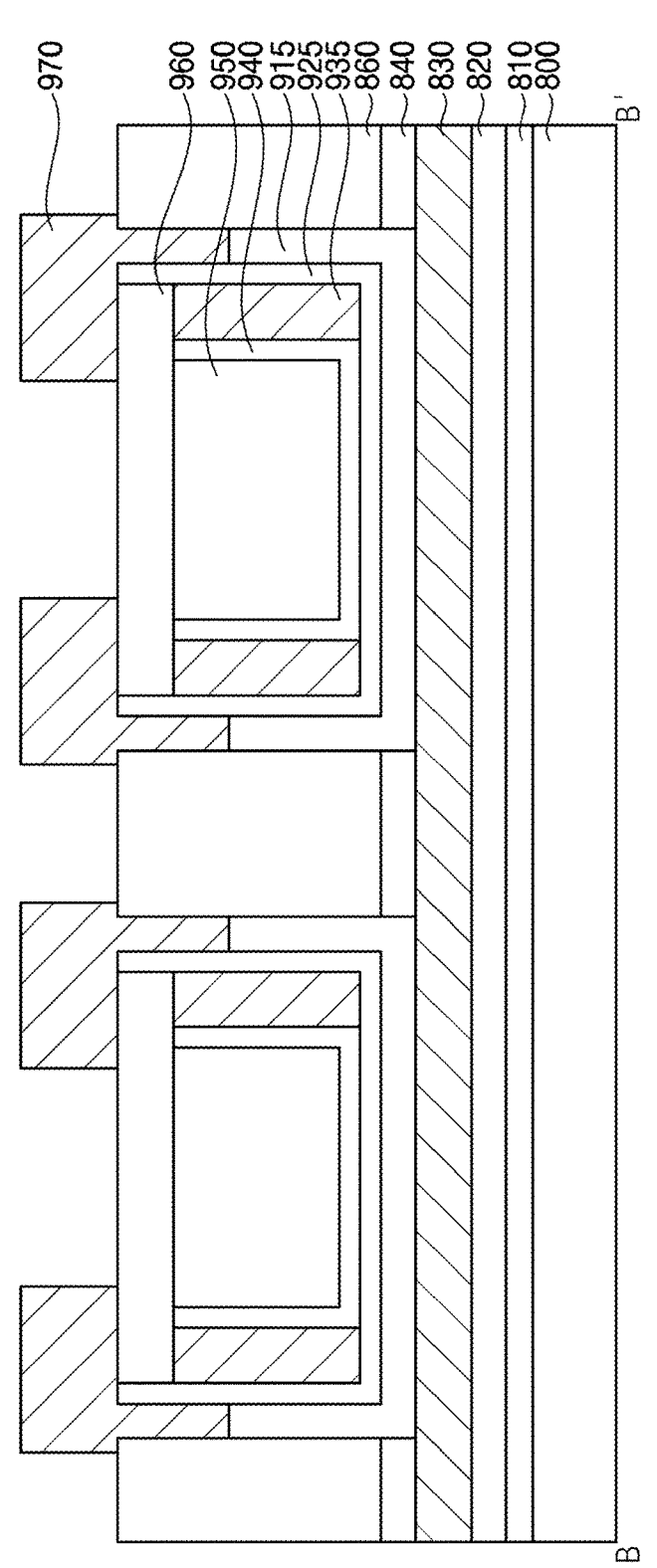
Figure 47:
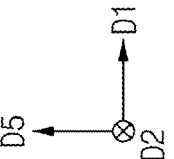

Referring to FIGS. 46 and 47, an upper portion of the channel 915 may be removed to form a fourth recess, a contact plug layer may be formed on the channel 915, the third insulating interlayer pattern 860, the second gate insulation pattern 925 and the sixteenth insulation pattern 960 to fill the fourth recess, and the contact plug layer may be patterned to form a contact plug 970 contacting the upper surface of the channel 915. In an example embodiment, a plurality of contact plugs 970 may be spaced apart from each other in the first and second direction D1 and D2.

In an example embodiment, the contact plugs 970 may be arranged in a lattice pattern in a plan view. Alternatively, the contact plugs 970 may be arranged in a honeycomb pattern in a plan view.

Referring to FIGS. 35 and 36 again, a fifth insulating interlayer may be formed on the third insulating interlayer pattern 860, the channel 915, the second gate insulation pattern 925 and the sixteenth insulation pattern 960, and an upper portion of the fifth insulating interlayer may be planarized until an upper surface of the contact plug 970 is exposed to form a fifth insulating interlayer pattern 980 covering a sidewall of the contact plug 970.

The first capacitor structure may be formed on the contact plug 970 and the fifth insulating interlayer pattern 980 to complete the fabrication of the semiconductor device. The first lower electrode structure 132 included in the first capacitor 172 may contact an upper surface of the contact plug 970.

By way of summation and review, example embodiments provide a capacitor structure having improved characteristics. Example embodiments also provide a semiconductor device including a capacitor structure having improved characteristics.

That is, in the method of manufacturing the semiconductor device in accordance with example embodiments, the mold layer may be etched to form an opening, the lower electrode may be formed in the opening, and a selective deposition process may be repeatedly performed to form the electrode structure on the lower electrode. Thus, the contact area between the lower electrode structure including the lower electrode and the electrode structure and the dielectric pattern on the sidewall of the lower electrode structure may increase, so that the electric capacitance of the capacitor including the lower electrode structure, the dielectric pattern, and the upper electrode may increase.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A capacitor structure, comprising:
a lower electrode structure including:
   a lower electrode on a substrate, and
   an electrode structure on the lower electrode, the electrode structure having electrode patterns stacked in a vertical direction substantially perpendicular to an upper surface of the substrate;
a dielectric pattern contacting the lower electrode structure; and
an upper electrode contacting the dielectric pattern.

2. The capacitor structure as claimed in claim 1, wherein the dielectric pattern contacts a sidewall of the lower electrode and a sidewall of a first portion of the electrode structure.

3. The capacitor structure as claimed in claim 2, further comprising a first support layer on a sidewall of a second portion of the lower electrode structure, the second portion not contacting the dielectric pattern, and the first support layer including an insulating material.

4. The capacitor structure as claimed in claim 3, wherein the first support layer includes at least one of silicon nitride, silicon carbonitride, and silicon boronitride.

5. The capacitor structure as claimed in claim 3, further comprising a second support layer on the sidewall of the lower electrode, the second support layer including an insulating material.

6. The capacitor structure as claimed in claim 3, wherein the dielectric pattern contacts a lower surface or an upper surface of the first support layer.

7. The capacitor structure as claimed in claim 2, wherein:
the dielectric pattern does not contact a sidewall of a first electrode pattern among the electrode patterns, the first electrode pattern being an uppermost one of the electrode patterns, and
the dielectric pattern contacts sidewalls of second electrode patterns among the electrode patterns, the second electrode patterns not being the first electrode pattern.

8. The capacitor structure as claimed in claim 2, wherein:
the dielectric pattern contacts neither a sidewall of a first electrode pattern nor a sidewall of a second electrode pattern among the electrode patterns, the first electrode pattern and the second electrode pattern being an uppermost one and a lowermost one, respectively, of the electrode patterns, and
the dielectric pattern contacts sidewalls of third electrode patterns among the electrode patterns, the third electrode patterns not being the first electrode pattern or the second electrode pattern.

9. The capacitor structure as claimed in claim 2, wherein:

the dielectric pattern does not contact a sidewall of a first electrode pattern among the electrode patterns, the first electrode pattern not being an uppermost one of the electrode patterns, and the dielectric pattern contacts sidewalls of second electrode patterns among the electrode patterns, the second electrode patterns not being the first electrode pattern.

10. The capacitor structure as claimed in claim 2, wherein;

the electrode patterns include a plurality of first electrode patterns spaced apart from each other in the vertical direction, the dielectric pattern does not contact sidewalls of the plurality of first electrode patterns among the electrode patterns, and the dielectric pattern contacts sidewalls of second electrode patterns among the electrode patterns, the second electrode patterns not being the plurality of first electrode patterns.

11. The capacitor structure as claimed in claim 1, wherein the dielectric pattern does not contact an upper surface of the electrode structure.

12. The capacitor structure as claimed in claim 1, wherein the electrode patterns include a substantially same material as a material of the lower electrode.

13. The capacitor structure as claimed in claim 1, wherein at least one of the electrode patterns includes a material different from a material of the lower electrode.

14. A capacitor structure, comprising:

a lower electrode structure including:

a lower electrode on a substrate, and an electrode structure on and contacting the lower electrode;

a first support layer contacting a sidewall of a first portion of the lower electrode;

a second support layer contacting a sidewall of a first portion of the electrode structure;

a dielectric pattern contacting a sidewall of a second portion of the lower electrode and a sidewall of a second portion of the electrode structure; and an upper electrode contacting the dielectric pattern.

15. The capacitor structure as claimed in claim 14, wherein each of the first support layer and the second support layer includes silicon nitride, silicon carbonitride, silicon boronitride, or silicon carbide.

16. The capacitor structure as claimed in claim 14, wherein the dielectric pattern contacts a lower surface or an upper surface of each of the first support layer and the second support layer.

17. The capacitor structure as claimed in claim 14, wherein:

the electrode structure includes a plurality of electrode patterns spaced apart from each other in a vertical direction substantially perpendicular to an upper surface of the substrate, and the plurality of electrode patterns include a substantially same material as a material of the lower electrode.

18. The capacitor structure as claimed in claim 14, wherein:

the electrode structure includes a plurality of electrode patterns spaced apart from each other in a vertical direction substantially perpendicular to an upper surface of the substrate, and the plurality of electrode patterns include a material different from a material of the lower electrode.

19. A semiconductor device, comprising:

an active pattern on a substrate;

a gate structure in an upper portion of the active pattern, the gate structure extending in a first direction substantially parallel to an upper surface of the substrate;

a bit line structure extending in a second direction substantially parallel to the upper surface of the substrate and substantially perpendicular to the first direction, the bit line structure being on a central portion of the active pattern;

a contact plug structure on each of opposite edge portions of the active pattern; and a capacitor structure on the contact plug structure, the capacitor structure including:

a lower electrode structure having:

a lower electrode, and an electrode structure including electrode patterns stacked on the lower electrode in a vertical direction substantially perpendicular to the upper surface of the substrate, a dielectric pattern contacting the lower electrode structure, and an upper electrode contacting the dielectric pattern.

20. The semiconductor device as claimed in claim 19, wherein:

the dielectric pattern contacts a sidewall of a first portion of the lower electrode and a sidewall of a first portion of the electrode structure, and the semiconductor device further includes:

a first support layer on a sidewall of a second portion of the lower electrode, the first support layer including an insulating material, and a second support layer on a sidewall of a second portion of the electrode structure, the second support layer including an insulating material.

* * * * *